US012666703B2

(12) United States Patent
Jo et al.

(10) Patent No.: US 12,666,703 B2
(45) Date of Patent: Jun. 23, 2026

(54) INTEGRATED CIRCUIT DEVICE

(71) Applicant: Samsung Electronics Co., Ltd.,
Suwon-si (KR)

(72) Inventors: Gunho Jo, Suwon-si (KR); Heesub Kim, Suwon-si (KR); Seung Hyun Lim, Suwon-si (KR); Bomi Kim, Suwon-si (KR); Eunho Cho, Suwon-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 391 days.

(21) Appl. No.: 18/347,919

(22) Filed: Jul. 6, 2023

(65) Prior Publication Data

US 2024/0170483 A1 May 23, 2024

(30) Foreign Application Priority Data

Nov. 17, 2022 (KR) ........................ 10-2022-0154700

(51) Int. Cl.
H10D 84/83 (2025.01)
H10D 84/01 (2025.01)
(Continued)

(52) U.S. Cl.
CPC ......... H10D 84/83 (2025.01); H10D 84/0149 (2025.01); H10D 84/038 (2025.01); H10W 20/427 (2026.01)

(58) Field of Classification Search
CPC ............. H10D 84/832; H10D 84/0188; H10D 84/0186; H01L 21/76897
See application file for complete search history.

(56) References Cited

U.S. PATENT DOCUMENTS 9,570,395 B1 2/2017 Sengupta et al.
11,239,208 B2 2/2022 Chuang et al.
(Continued)

FOREIGN PATENT DOCUMENTS

CN 113113357 A 7/2021
DE 10-2021-109275 A1 11/2021
(Continued)

OTHER PUBLICATIONS

Extended European Search Report dated Apr. 16, 2024 for corresponding European Application No. 23195834.9.

*Primary Examiner* — Fernando L Toledo
*Assistant Examiner* — Adam S Bowen
(74) *Attorney, Agent, or Firm* — Harness, Dickey & Pierce, P.L.C.

(57) ABSTRACT

An integrated circuit device includes a fin-type active region including a first fin portion and a second fin portion apart from each other in a first lateral direction with a contact space therebetween, a first source/drain region on the fin-type active region at a position overlapping the contact space in a vertical direction, a gate line on the first fin portion, a device isolation film covering both sidewalls of each of the first and second fin portions and defining a width of the contact space, a back side source/drain contact electrically connected to the first source/drain region, filling the contact space, and having a sidewall facing each of the first and second fin portions and the device isolation film, and an etch stop layer contacting a top surface of each of the first and second fin portions between the first fin portion and the gate line.

19 Claims, 51 Drawing Sheets

(51) Int. Cl.
    *H10D 84/03*     (2025.01)
    *H10W 20/41*     (2026.01)

(56)         References Cited

U.S. PATENT DOCUMENTS

| | | |
|---|---|---|
| 11,322,401 B2 | 5/2022 | Smith et al. |
| 11,342,326 B2 | 5/2022 | Chiu et al. |
| 2021/0336019 A1 | 10/2021 | Su et al. |
| 2021/0336063 A1* | 10/2021 | Liao ................... H01L 23/5286 |
| 2021/0359091 A1* | 11/2021 | Hsu ................... H10D 30/6757 |
| 2021/0399099 A1 | 12/2021 | Chu et al. |
| 2022/0093512 A1 | 3/2022 | Chang et al. |
| 2022/0130823 A1 | 4/2022 | Su et al. |
| 2022/0130991 A1 | 4/2022 | Yu et al. |
| 2023/0307515 A1 | 9/2023 | Hsu et al. |
| 2023/0386925 A1 | 11/2023 | Lee et al. |

FOREIGN PATENT DOCUMENTS

| | | |
|---|---|---|
| KR | 10-2409525 | 5/2017 |
| KR | 10-2021-0133850 A | 11/2021 |

* cited by examiner

Y2 – Y2'

X1 – X1'

Y1 – Y1'

144

142
130

119

ESL
R1

F1     F1

112

T1

102

102B
Y1 – Y1'

Z

X ⊙ → Y

X1 – X1'

Y1 – Y1'

Y1 – Y1'

X1 – X1'

Y1 – Y1'

X1 – X1'

Y1 – Y1'

INTEGRATED CIRCUIT DEVICE

CROSS-REFERENCE TO RELATED APPLICATION

This application is based on and claims priority under 35 U.S.C. § 119 to Korean Patent Application No. 10-2022-0154700, filed on Nov. 17, 2022, in the Korean Intellectual Property Office, the disclosure of which is incorporated by reference herein in its entirety.

BACKGROUND

The inventive concepts relate to integrated circuit (IC) devices, and more particularly, to IC devices including a back side contact structure.

Due to the development of electronics technology, the downscaling of IC devices has rapidly progressed. Because highly downscaled IC devices require not only a high operating speed but also high operating accuracy, it is necessary to provide wiring structures including conductive lines having a stable and optimized arrangement structure within a relatively small area.

SUMMARY

The inventive concepts provide integrated circuit (IC) devices including a plurality of wiring structures arranged in a reduced area with the downscaling trend. The IC devices may have a structure capable of inhibiting the occurrence of a parasitic capacitance by ensuring a sufficient insulation distance between the respective wiring structures, and have a structure capable of reducing resistances of wirings configured to supply power and/or signals to source/drain regions of the IC device.

According to some aspects of the inventive concepts, there is provided an IC device including a fin-type active region including a first fin portion and a second fin portion apart from each other in a first lateral direction with a contact space therebetween, the first fin portion and the second fin portion each extending long in a straight line in the first lateral direction, a first source/drain region on the fin-type active region at a position overlapping the contact space in a vertical direction, a gate line on the first fin portion, the gate line extending long in a second lateral direction, the second lateral direction being perpendicular to the first lateral direction, a device isolation film covering both sidewalls of each of the first fin portion and the second fin portion in the second lateral direction, the device isolation film defining a width of the contact space in the second lateral direction, a back side source/drain contact configured to be electrically connected to the first source/drain region and filling the contact space, the back side source/drain contact having a sidewall facing each of the first fin portion, the second fin portion, and the device isolation film, and an etch stop layer in contact with a top surface of each of the first fin portion and the second fin portion, the etch stop layer being between the first fin portion and the gate line.

According to some aspects of the inventive concepts, there is provided an IC device including a plurality of fin-type active regions extending long in a first lateral direction and being parallel to each other, a plurality of source/drain regions on the plurality of fin-type active regions, a plurality of gate lines extending long in a second lateral direction on the plurality of fin-type active regions, the second lateral direction intersecting with the first lateral direction, a device isolation film covering a sidewall of each of the plurality of fin-type active regions, a back side source/drain contact passing through a first fin-type active region selected from the plurality of fin-type active regions in a vertical direction, the back side source/drain contact being configured to be electrically connected to a first source/drain region selected from the plurality of source/drain regions, and the back side source/drain contact having a sidewall facing each of the first fin-type active region and the device isolation film, a front side source/drain contact configured to be electrically connected to a second source/drain region, which is selected from the plurality of source/drain regions and apart from the first source/drain region, the front side source/drain contact being apart from at least one fin-type active region selected from the plurality of fin-type active regions in the vertical direction with the second source/drain region therebetween, and an etch stop layer between the first fin-type active region and the plurality of gate lines, the etch stop layer being in contact with a top surface of the first fin-type active region, the etch stop layer including a portion facing a sidewall of the back side source/drain contact.

According to some aspects of the inventive concepts, there is provided an IC device including a fin-type active region including a first fin portion and a second fin portion, which are apart from each other in a first lateral direction with a contact space therebetween, the first fin portion and the second fin portion each extending long in a straight line in the first lateral direction, at least one nanosheet on the first fin portion, a first source/drain region on the fin-type active region at a position overlapping the contact space in a vertical direction, the first source/drain region being in contact with the at least one nanosheet, a gate line surrounding the at least one nanosheet on the first fin portion, the gate line extending long in a second lateral direction, the second lateral direction being perpendicular to the first lateral direction, a second source/drain region on the first fin portion to be apart from the first source/drain region in the first lateral direction with the gate line therebetween, the second source/drain region being in contact with the at least one nanosheet, a device isolation film covering both sidewalls of each of the first fin portion and the second fin portion in the second lateral direction, the device isolation film defining a width of the contact space in the second lateral direction, a back side source/drain contact configured to be electrically connected to the first source/drain region and filling the contact space, the back side source/drain contact having a sidewall facing each of the first fin portion, the second fin portion, and the device isolation film, a front side source/drain contact configured to be electrically connected to the second source/drain region, the front side source/drain contact being apart from the fin-type active region in the vertical direction with the second source/drain region therebetween, and an etch stop layer in contact with a top surface of each of the first fin portion and the second fin portion, the etch stop layer including a portion between the first fin portion and the gate line and a portion facing a sidewall of the back side source/drain contact.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
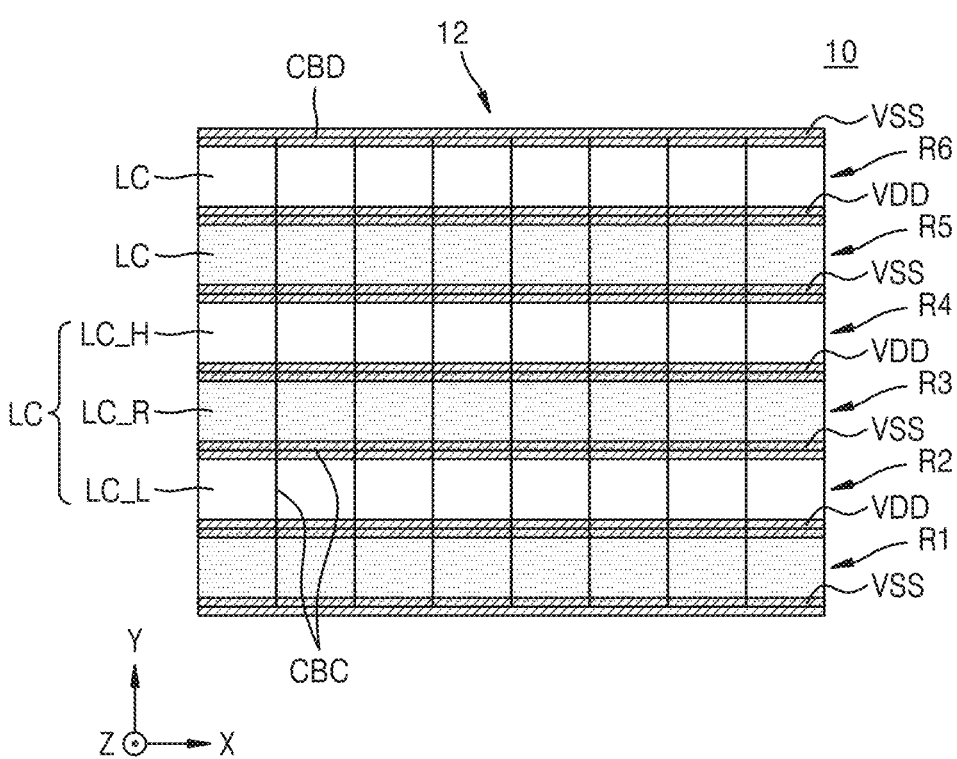
FIG. 1 is a plan layout diagram of a cell block of an integrated circuit (IC) device, according to embodiments.

Hereinafter, embodiments will be described in detail with reference to the accompanying drawings. The same reference numerals are used to denote the same elements in the drawings, and repeated descriptions thereof are omitted.

FIG. 1 is a plan layout diagram of a cell block 12 of an integrated circuit (IC) device 10, according to embodiments.

Referring to FIG. 1, the cell block 12 of the IC device 10 may include a plurality of logic cells LC, which include circuit patterns configured to constitute various circuits. The plurality of logic cells LC may be arranged in a matrix form in a widthwise direction (X direction) and a height direction (Y direction) in the cell block 12.

Each of the plurality of logic cells LC may include a circuit pattern having a layout designed according to a place and route (PnR) technique to perform at least one logic function. The plurality of logic cells LC may perform various logic functions. In some embodiments, the plurality of logic cells LC may include a plurality of standard cells. In some embodiments, at least some of the plurality of logic cells LC may perform the same logic function. In other embodiments, at least some of the plurality of logic cells LC may perform different logic functions.

The plurality of logic cells LC may include various kinds of logic cells including a plurality of circuit elements. For example, each of the plurality of logic cells LC may include an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-slave flip-flop, a latch, or a combination thereof, without being limited thereto.

In the cell block 12, at least some of the plurality of logic cells LC that form one row R1, R2, R3, R4, R5, or R6 in the widthwise direction (X direction) may have the same width as each other. Also, at least some of the plurality of logic cells LC that form one row R1, R2, R3, R4, R5, or R6 may have the same height as each other. However, the inventive concepts are not limited to those illustrated in FIG. 1, and at least some of the plurality of logic cells LC that form one row R1, R2, R3, R4, R5, or R6 may have different widths and heights from each other.

An area of each of the plurality of logic cells LC included in the cell block 12 of the IC device 10 may be defined by a cell boundary CBD. A cell boundary contact portion CBC where respective cell boundaries CBD of two logic cells LC that are adjacent to each other in the widthwise direction (X direction) or the height direction (Y direction), from among the plurality of logic cells LC, meet each other may be between the two adjacent logic cells LC.

In some embodiments, from among the plurality of logic cells LC that form one row R1, R2, R3, R4, R5, or R6, two logic cells LC that are adjacent to each other in the widthwise direction may contact each other at the cell boundary contact portion CBC without a distance therebetween. In other embodiments, from among the plurality of logic cells LC that form one row R1, R2, R3, R4, R5, or R6, two logic cells LC that are adjacent to each other in the widthwise direction may be a predetermined (or, alternatively, desired or selected) distance apart from each other.

In some embodiments, from among the plurality of logic cells LC that form one row R1, R2, R3, R4, R5, or R6, two adjacent logic cells may perform the same function as each other. In this case, the two adjacent logic cells LC may have the same structure as each other. In other embodiments, from among the plurality of logic cells LC that form one row R1, R2, R3, R4, R5, or R6, two adjacent logic cells may perform different functions from each other.

In some embodiments, one logic cell LC, which is selected from the plurality of logic cells LC included in the cell block 12 of the IC device 10, may have a symmetrical structure to another logic cell LC, which is adjacent to the selected logic cell LC in the height direction (Y direction in FIG. 1), about the cell boundary contact portion CBC therebetween. For example, a reference logic cell LC_R in a third row R3 may have a symmetrical structure to a lower logic cell LC_L in a second row R2 about the cell boundary contact portion CBC therebetween. Also, the reference logic cell LC_R in the third row R3 may have a symmetrical structure to an upper logic cell LC_H in a fourth row R4 about the cell boundary contact portion CBC therebetween.

Although the cell block 12 including six rows R1, R2, . . . , and R6 is illustrated in FIG. 1, embodiments are not limited thereto. The cell block 12 may include various numbers of rows selected as needed, and each row may include various numbers of logic cells selected as needed.

A selected one of a plurality of ground lines VSS and a plurality of power lines VDD may be between a plurality of rows (e.g., R1, R2, R3, R4, R5, and R6), each of which includes a plurality of logic cells LC arranged in a line in the widthwise direction (X direction). The plurality of ground lines VSS and the plurality of power lines VDD may each extend in the widthwise direction (X direction) and may be alternately arranged apart from each other in the height direction (Y direction). Accordingly, the plurality of ground lines VSS and the plurality of power lines VDD may each overlap the cell boundary CBD of the logic cell LC in the height direction (Y direction).

Figure 2:
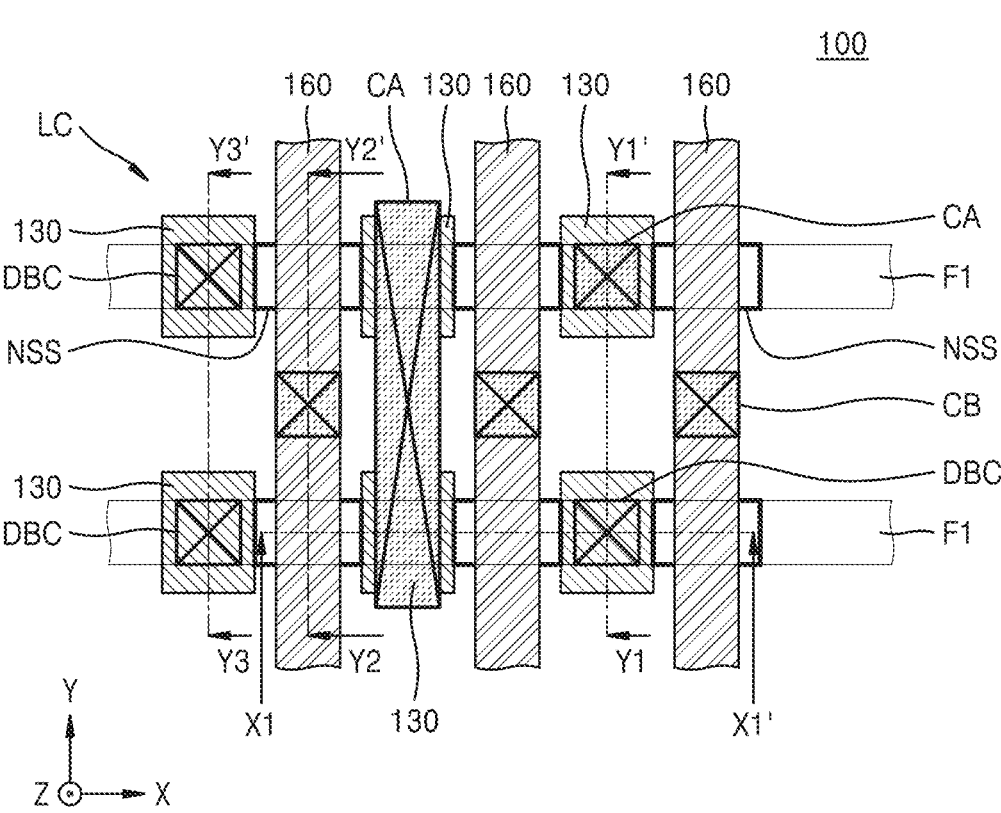
FIG. 2 is a plan layout diagram of an IC device according to embodiments.
Figure 3A:
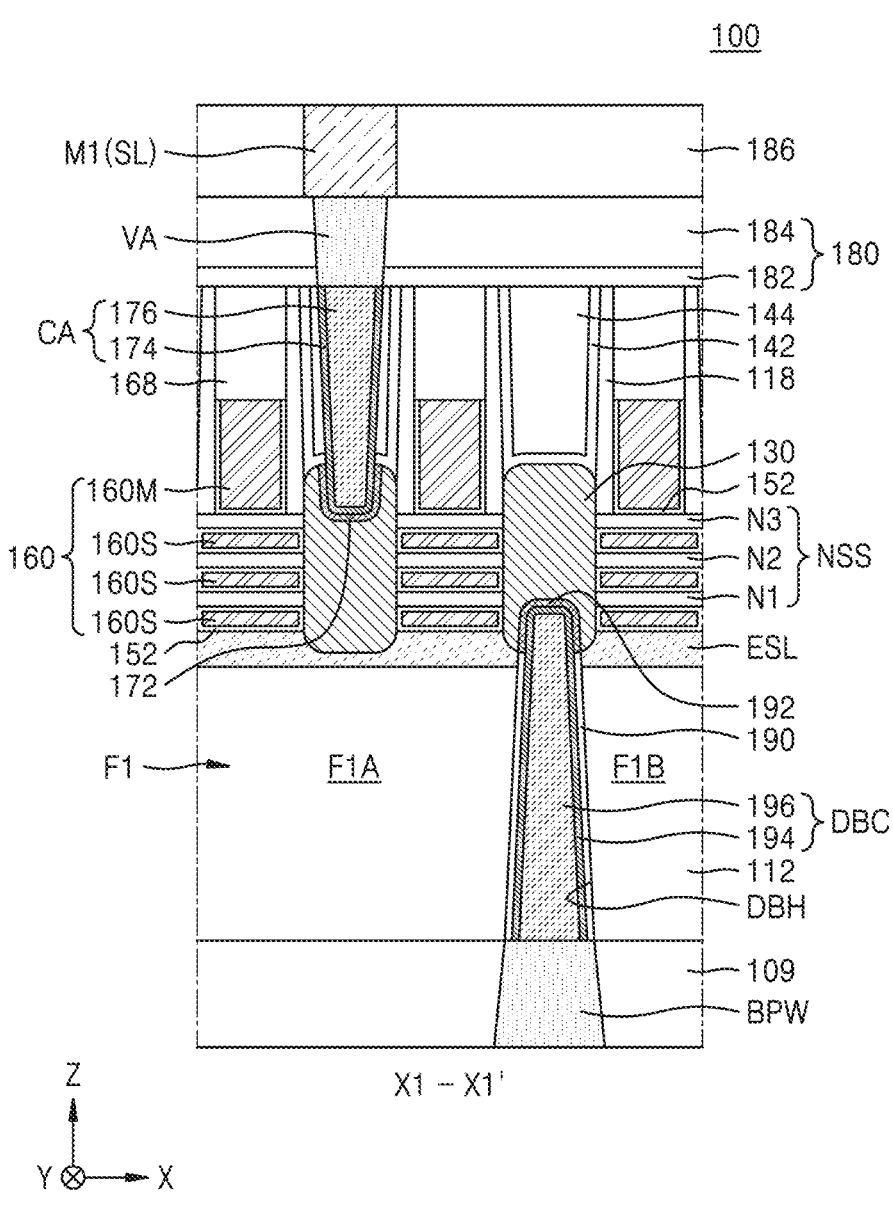
FIG. 3A is a cross-sectional view taken along line X1-X1' of FIG. 2.
Figure 3B:
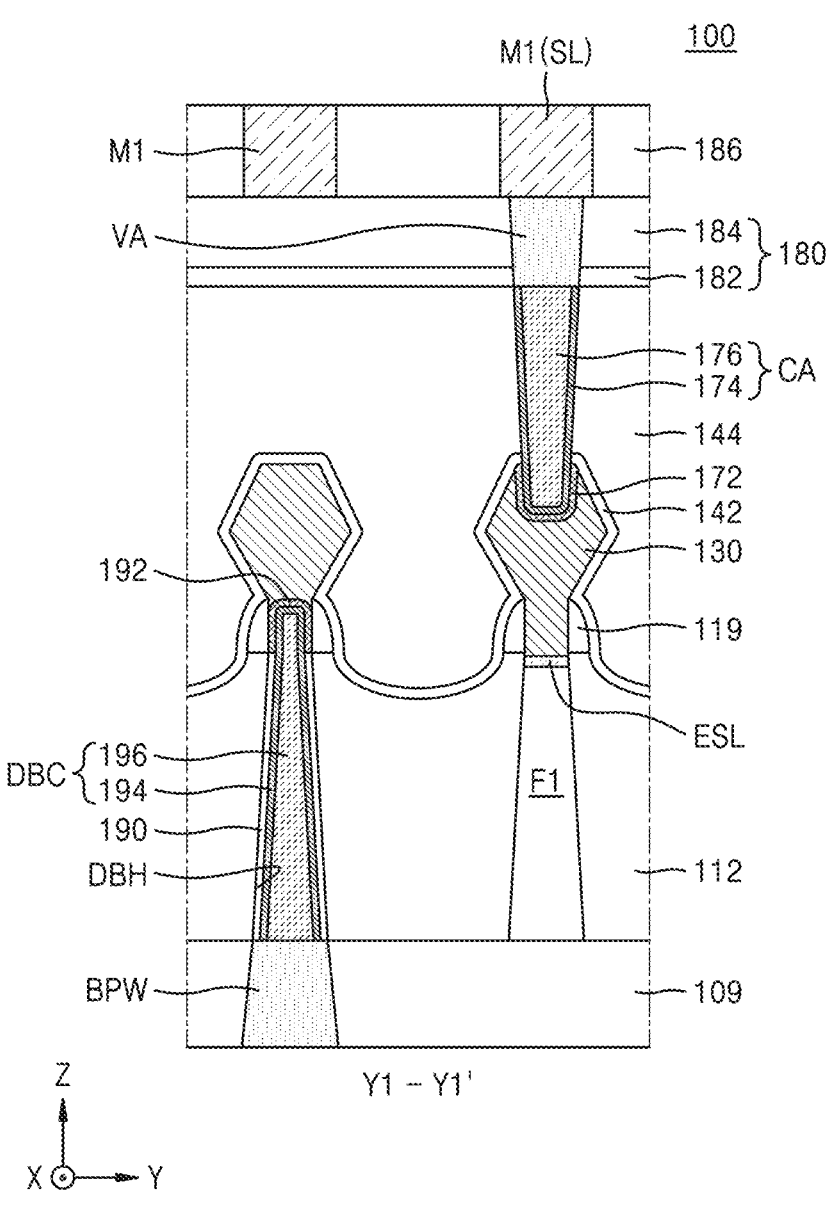
FIG. 3B is a cross-sectional view taken along line Y1-Y1' of FIG. 2.
Figure 3C:
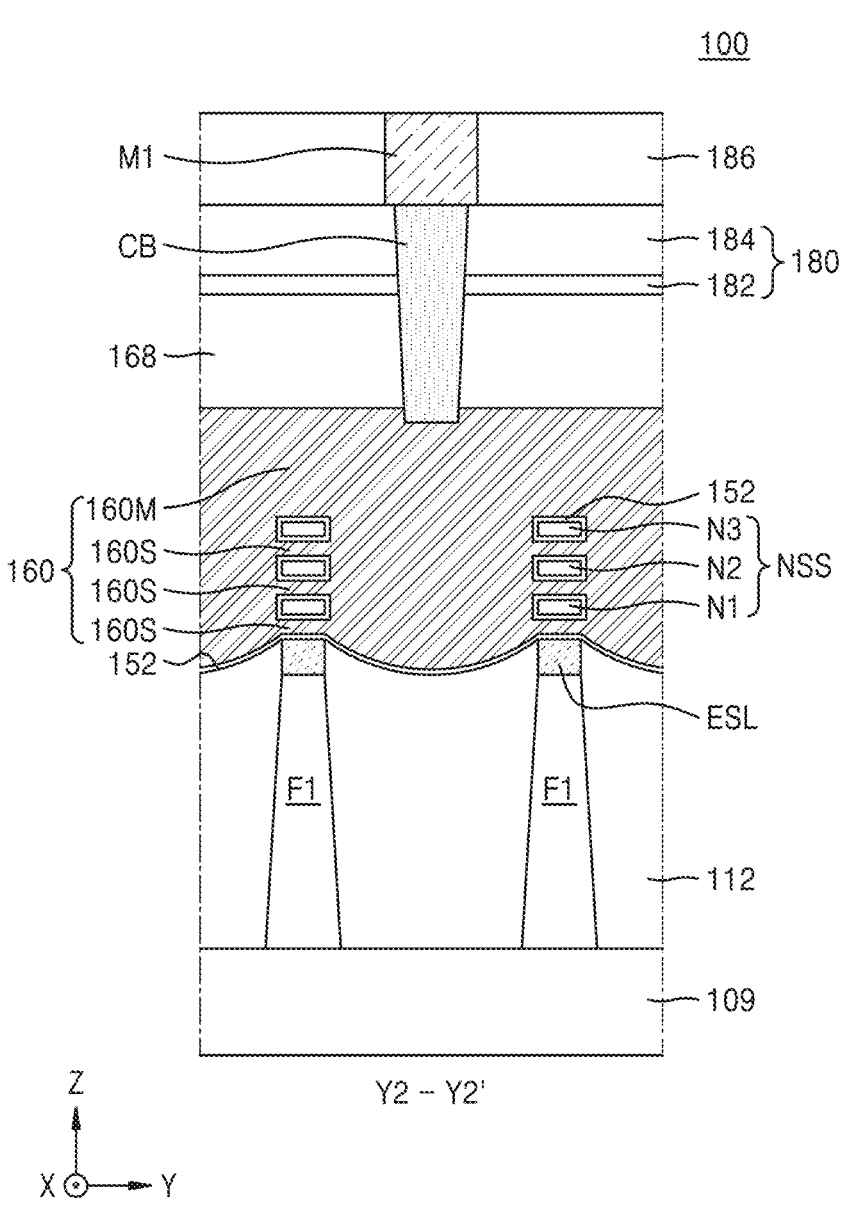
FIG. 3C is a cross-sectional view taken along line Y2-Y2' of FIG. 2.
Figure 3D:
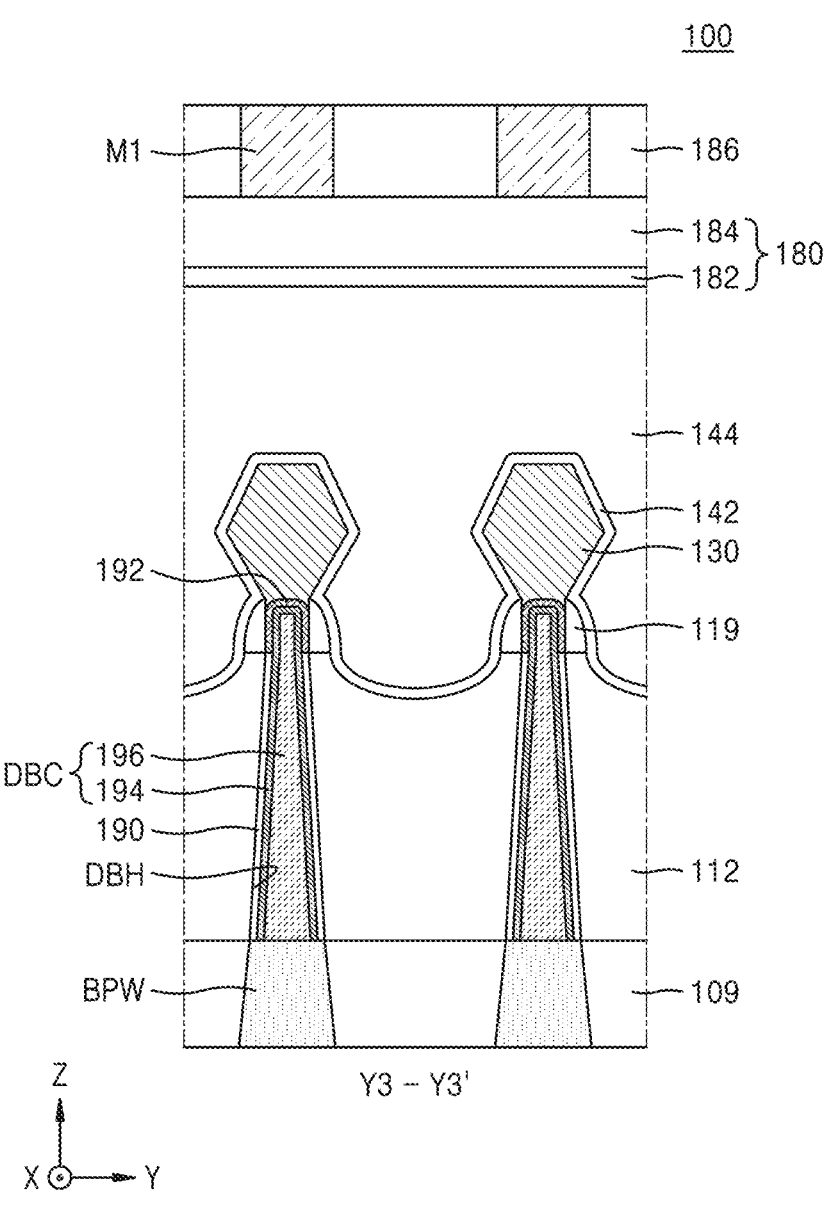
FIG. 3D is a cross-sectional view taken along line Y3-Y3' of FIG. 2.

FIG. 2 is a plan layout diagram of an IC device 100 according to embodiments. FIG. 3A is a cross-sectional view taken along line X1-X1' of FIG. 2. FIG. 3B is a cross-sectional view taken along line Y1-Y1' of FIG. 2. FIG. 3C is a cross-sectional view taken along line Y2-Y2' of FIG. 2. FIG. 3D is a cross-sectional view taken along line Y3-Y3' of FIG. 2. The IC device 100 including a field-effect transistor (FET) having a gate-all-around structure including an active region of a nanowire or nanosheet type and a gate surrounding the active region is described with reference to FIGS. 2 and 3A to 3D. The IC device 100 may constitute some of the plurality of logic cells LC shown in FIG. 1.

As shown in FIGS. 2 and 3A to 3D, the IC device 100 may include a plurality of fin-type active regions F1. The plurality of fin-type active regions F1 may extend long in a first lateral direction (X direction) and extend parallel to each other. The plurality of fin-type active regions F1 may include an element semiconductor, such as silicon (Si) or germanium (Ge), or a compound semiconductor, such as silicon germanium (SiGe), silicon carbide (SiC), gallium arsenide (GaAs), indium arsenide (InAs), indium gallium arsenide (InGaAs), or indium phosphide (InP). As used herein, each of the terms "SiGe," "SiC," "GaAs," "InAs," "InGaAs," and "InP" refers to a material including elements included therein, without referring to a chemical formula representing a stoichiometric relationship.

A plurality of gate lines 160 may be on the plurality of fin-type active regions F1. Each of the plurality of gate lines 160 may extend long in a second lateral direction (Y direction), which intersects with the first lateral direction (X direction).

A plurality of nanosheet stacks NSS may be respectively on the plurality of fin-type active regions F1 at intersections between the plurality of fin-type active regions F1 and the plurality of gate lines 160. Each of the plurality of nanosheet stacks NSS may include at least one nanosheet, which is apart from a top surface of the fin-type active region F1 in a vertical direction (Z direction) and faces the top surface of the fin-type active region F1. As used herein, the term "nanosheet" refers to a conductive structure having a cross-section that is substantially perpendicular to a direction in which current flows. The nanosheet may be interpreted as including a nanowire.

As shown in FIGS. 3A and 3C, each of the plurality of nanosheet stacks NSS may include a first nanosheet N1, a second nanosheet N2, and a third nanosheet N3, which overlap each other in the vertical direction (Z direction) on the fin-type active region F1. The first nanosheet N1, the second nanosheet N2, and the third nanosheet N3 may be at different vertical distances (Z-directional distances) from the top surface of the fin-type active region F1. Each of the plurality of gate lines 160 may surround the first nanosheet N1, the second nanosheet N2, and the third nanosheet N3 of the nanosheet NSS, which overlap each other in the vertical direction (Z direction).

Although FIG. 2 illustrates a case in which the nanosheet stack NSS has a substantially rectangular planar shape, the inventive concepts are not limited thereto. The nanosheet stack NSS may have other planar shapes according to a planar shape of each of the fin-type active region F1 and the gate line 160. Some embodiments pertain to a configuration in which the plurality of nanosheet stacks NSS and the plurality of gate lines 160 are formed on one fin-type active region F1, and the plurality of nanosheet stacks NSS are arranged in a line in the first lateral direction (X direction) on one fin-type active region F1. However, the number of nanosheet stacks NSS and the number of gate lines 160 on one fin-type active region F1 are not specifically limited.

Each of the first to third nanosheets N1, N2, and N3 included in the nanosheet stack NSS may function as a channel region. In some embodiments, the first to third nanosheets N1, N2, and N3 may have substantially the same thickness in the vertical direction (Z direction). In other embodiments, at least some of the first to third nanosheets N1, N2, and N3 may have different thicknesses in the vertical direction (Z direction). In some embodiments, each of the first nanosheet N1, the second nanosheet N2, and the third nanosheet N3 included in the nanosheet stack NSS may include a Si layer, a SiGe layer, or a combination thereof.

As shown in FIG. 3A, the first to third nanosheets N1, N2, and N3 included in one nanosheet stack NSS may have the same size or similar sizes in the first lateral direction (X direction). In other embodiments, differently from that shown in FIG. 3A, at least some of the first to third nanosheets N1, N2, and N3 included in one nanosheet stack NSS may have different sizes in the first lateral direction (X direction). Some embodiments pertain to examples in which each of the plurality of nanosheet stacks NSS includes three nanosheets, but the inventive concepts are not limited thereto. For example, the nanosheet stack NSS may include at least one nanosheet, and the number of nanosheets in the nanosheet stack NSS is not specifically limited.

As shown in FIGS. 3A and 3C, each of the plurality of gate lines 160 may include a main gate portion 160M and a plurality of sub-gate portions 160S. The main gate portion 160M may cover a top surface of the nanosheet stack NSS and extend in the second lateral direction (Y direction). The plurality of sub-gate portions 160S may be integrally connected to the main gate portion 160M and respectively one-by-one arranged between the first to third nanosheets N1, N2, and N3 and between the first nanosheet N1 and the fin-type active region F1. In the vertical direction (Z direction), a thickness of each of the plurality of sub-gate portions 160S may be less than a thickness of the main gate portion 160M.

Each of the gate lines 160 may include a metal, a metal nitride, a metal carbide, or a combination thereof. The metal may be selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from titanium nitride (TiN) and tantalum nitride (TaN). The metal carbide may include titanium aluminum carbide (TiAlC). However, a material included in the plurality of gate lines 160 is not limited to the examples described above.

A gate dielectric film 152 may be between the nanosheet stack NSS and the gate line 160. In some embodiments, the gate dielectric film 152 may have a stack structure of an interface dielectric film and a high-k dielectric film. The interface dielectric film may include a low-k dielectric material film (e.g., a silicon oxide film, a silicon oxynitride film, or a combination thereof), which has a dielectric constant of about 9 or less. In some embodiments, the interface dielectric film may be omitted. The high-k dielectric film may include a material having a higher dielectric constant than a silicon oxide film. For example, the high-k dielectric film may have a dielectric constant of about or exactly 10 to about or exactly 25. The high-k dielectric film may include hafnium oxide, without being limited thereto.

As shown in FIGS. 3A and 3C, an IC device may include an etch stop layer ESL covering the top surface of each of the plurality of fin-type active regions F1. The etch stop layer ESL may be between the top surface of each of the plurality of fin-type active regions F1 and the plurality of gate lines 160 and be in contact with the top surface of each of the plurality of fin-type active regions F1.

In some embodiments, the etch stop layer ESL may include an insulating film. For example, the etch stop layer ESL may include at least one selected from silicon nitride (SiN), silicon oxynitride (SiON), silicon carbonitride (SiCN), silicon oxycarbide (SiOC), silicon oxycarbonitride (SiOCN), and a combination thereof, without being limited thereto.

On the plurality of fin-type active regions F1, a plurality of source/drain regions 130 may be on the etch stop layer ESL. At least one of the plurality of source/drain regions 130 may have a bottom surface in contact with the etch stop layer ESL. Each of the plurality of source/drain regions 130 may be adjacent to at least one gate line 160 selected from the plurality of gate lines 160. Each of the plurality of source/drain regions 130 may have surfaces facing the first to third nanosheets N1, N2, and N3 included in the nanosheet stack NSS adjacent thereto. Each of the plurality of source/drain regions 130 may be in contact with the first to third nanosheets N1, N2, and N3 included in the nanosheet stack NSS adjacent thereto.

Each of the plurality of source/drain regions 130 may include an epitaxially grown semiconductor layer. In some embodiments, each of the plurality of source/drain regions 130 may include an epitaxially grown Si layer, an epitaxially grown SiC layer, or an embedded SiGe structure including a plurality of epitaxially grown SiGe layers. For example, when the plurality of source/drain regions 130 constitute an NMOS transistor, the plurality of source/drain regions 130 may include a Si layer doped with an n-type dopant or a SiC layer doped with an n-type dopant. For example, when the plurality of source/drain regions 130 constitute a PMOS transistor, the plurality of source/drain regions 130 may include a SiGe layer doped with a p-type dopant. The n-type dopant may be selected from phosphorus (P), arsenic (As), and antimony (Sb). The p-type dopant may be selected from boron (B) and gallium (Ga).

As shown in FIGS. 3B, 3C, and 3D, a device isolation film 112 may be in respective spaces between the plurality of fin-type active regions F1 to cover a sidewall of each of the plurality of fin-type active regions F1. In some embodiments, the device isolation film 112 may include a silicon oxide film, without being limited thereto.

As shown in FIGS. 3A and 3C, a top surface of each of the gate dielectric film 152 and the gate line 160 may be covered by the capping insulating pattern 168. The capping insulating pattern 168 may include a silicon nitride film.

Both sidewalls of each of the gate line 160 and the capping insulating pattern 168 may be covered by outer insulating spacers 118. The outer insulating spacers 118 may cover both sidewalls of the main gate portion 160M on top surfaces of the plurality of nanosheet stacks NSS. The outer insulating spacers 118 may be apart from the gate line 160 with the gate dielectric film 152 therebetween.

As shown in FIGS. 3B and 3D, a plurality of recess-side insulating spacers 119 may be on a top surface of the isolation film 112. At least some of the plurality of recess-side insulating spacers 119 may cover sidewalls of the source/drain region 130. In some embodiments, the recess-side insulating spacers 119 may be respectively and integrally connected to the outer insulating spacer 118 adjacent thereto.

The plurality of outer insulating spacers 118 and the plurality of recess-side insulating spacers 119 may each include silicon nitride, silicon oxide, silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. As used herein, each of the terms "SiCN," "SiBN," "SiON," "SiOCN," "SiBCN," and "SiOC" refers to a material including elements included therein, without referring to a chemical formula representing a stoichiometric relationship.

A metal silicide film 172 may be formed on a top surface of each of the plurality of source/drain regions 130. The metal silicide film 172 may include a metal, which includes titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), palladium (Pd), or a combination thereof. For example, the metal silicide film 172 may include titanium silicide, without being limited thereto.

The plurality of source/drain regions 130 and the isolation film 112 may be covered by an insulating liner 142. The plurality of outer insulating spacers 118 and the plurality of recess-side insulating spacers 119 may be covered by an insulating liner 142. In some embodiments, the insulating liner 142 may be omitted. An inter-gate dielectric film 144 may be on the insulating liner 142. When the insulating liner 142 is omitted, the inter-gate dielectric film 144 may be in contact with the plurality of source/drain regions 130. In some embodiments, the insulating liner 142 may include silicon nitride, SiCN, SiBN, SiON, SiOCN, SiBCN, or a combination thereof, without being limited thereto. The inter-gate dielectric film 144 may include a silicon oxide film, without being limited thereto.

Both sidewalls of each of the plurality of sub-gate portions 160S in the plurality of gate lines 160 may be apart from the source/drain region 130 with the gate dielectric film 152 therebetween. The gate dielectric film 152 may be between the sub-gate portion 160S included in the gate line 160 and each of the first to third nanosheets N1, N2, and N3 and between the sub-gate portion 160S included in the gate line 160 and the source/drain region 130.

The plurality of nanosheet stacks NSS may be respectively on the plurality of fin-type active regions F1 at intersections between the plurality of fin-type active regions F1 and the plurality of gate lines 160. Each of the nanosheet stacks NSS may face the top surface of the fin-type active region F1 at a position apart from the fin-type active region F1. A plurality of nanosheet transistors may be formed at intersections between the plurality of fin-type active regions F1 and the plurality of gate lines 160.

As shown in FIGS. 2, 3A, and 3B, a plurality of front side source/drain contacts CA may be on the fin-type active regions F1. Each of the plurality of front side source/drain contacts CA may be electrically connected to some source/ drain regions 130 selected from the plurality of source/drain regions 130. Each of the plurality of front side source/drain contacts CA may be apart from the fin-type active region F1 in the vertical direction (Z direction) with the source/drain region 130 therebetween.

Each of the plurality of front side source/drain contacts CA may pass through the inter-gate dielectric film 144 and the insulating liner 142 in the vertical direction (Z direction) and be in contact with the metal silicide film 172. Each of the plurality of front side source/drain contacts CA may be electrically connectable to selected some of the plurality of source/drain regions 130 through the metal silicide film 172. As shown in FIG. 3A, each of the plurality of front side source/drain contacts CA may be apart from the main gate portion 160M of the gate line 160 with the outer insulating spacer 118 therebetween in the first lateral direction (X direction).

As shown in FIGS. 3A and 3B, each of the plurality of front side source/drain contacts CA may include a conductive barrier pattern 174 and a contact plug 176. The conductive barrier pattern 174 may surround and contact a bottom surface and a sidewall of the contact plug 176. Each of the plurality of front side source/drain contacts CA may pass through the inter-gate dielectric film 144 and the insulating liner 142 and extend long in the vertical direction (Z direction). The conductive barrier pattern 174 may be between the metal silicide film 172 and the contact plug 176. The conductive barrier pattern 174 may have a surface in contact with the metal silicide film 172 and a surface in contact with the contact plug 176. In some embodiments, the conductive barrier pattern 174 may include a metal or a metal nitride. For example, the conductive barrier pattern 174 may include titanium (Ti), tantalum (Ta), tungsten (W), titanium nitride (TiN), tantalum (TaN), tungsten nitride (WN), tungsten carbon nitride (WCN), titanium silicon nitride (TiSiN), tantalum silicon nitride (TaSiN), tungsten silicon nitride (WSiN), or a combination thereof, without being limited thereto. The contact plug 176 may include molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, without being limited thereto.

While the plurality of source/drain regions 130 are between a plurality of back side source/drain contacts DBC and the front side source/drain contact CA, the plurality of back side source/drain contacts DBC may be on a back side, which is opposite to a front side where the front side source/drain contact CA is located. Each of the plurality of back side source/drain contacts DBC may be electrically connected to some other source/drain regions 130, which are selected from the plurality of source/drain regions 130 and are not connected to the front side source/drain contact CA.

Each of the plurality of back side source/drain contacts DBC may pass through a selected one of the plurality of fin-type active regions F1 in the vertical direction (Z direction). In the plurality of source/drain regions 130, the source/drain region 130 to which the front side source/drain contact CA is connected and the source/drain region 130 to which the back side source/drain contact DBC is connected may be apart from each other in a lateral direction, for example, the first lateral direction (X direction) or the second lateral direction (Y direction).

Each of the plurality of back side source/drain contacts DBC may have a sidewall facing each of the fin-type active region F1, which is penetrated by the back side source/drain contact DBC in the vertical direction (Z direction), and the device isolation film 112 adjacent to the fin-type active region F1.

As shown in FIG. 3A, the fin-type active region F1, which is penetrated by the back side source/drain contact DBC in the vertical direction (Z direction), may include a first fin portion F1A and a second fin portion F1B, which are apart from each other in the first lateral direction (X direction) with the back side source/drain contact DBC therebetween. The first fin portion F1A and the second fin portion F1B may extend long in a straight line in the first lateral direction (X direction). The back side source/drain contact DBC may fill a contact space DBH between the first fin portion F1A and the second fin portion F1B. The source/drain region 130 to which the back side source/drain contact DBC is connected may overlap the contact space DBH in the vertical direction (Z direction) on the fin-type active region F1.

As shown in FIG. 3A, the plurality of gate lines 160 may include a gate line 150 on the first fin portion F1A and a gate line 160 on the second fin portion F1B. Each of the plurality of front side source/drain contacts CA may be connected to the source/drain region 130 located on the first fin portion F1A or the second fin portion F1B.

The etch stop layer ESL may be in contact with a top surface of each of the first fin portion F1A and the second fin portion F1B. The etch stop layer ESL may include a portion between the first fin portion F1A and the gate line 160 and a portion between the second fin portion F1B and the gate line 160. Each of the plurality of gate lines 160 may be apart from the fin-type active region F1 in the vertical direction (Z direction) with the etch stop layer ESL therebetween. As shown in FIG. 3A, each of the plurality of gate lines 160 may be apart from the first fin portion F1A or the second fin portion F1B in the vertical direction (Z direction) with the etch stop layer ESL therebetween. The plurality of nanosheet stacks NSS may include a nanosheet stack NSS on the first fin portion F1A with the etch stop layer ESL therebetween and a nanosheet stack NSS on the second fin portion F1B with the etch stop layer ESL therebetween.

As shown in FIGS. 3B and 3D, the device isolation film 112 may cover both sidewalls of each of the first fin portion F1A and the second fin portion F1B in the second lateral direction (Y direction) and define a width of the contact space DBH in the second lateral direction (Y direction). Widths of the back side source/drain contact DBC in the first lateral direction (X direction) and the second lateral direction (Y direction) may gradually increase in a direction away from the source/drain region 130 and the front side source/drain contact CA in the vertical direction (Z direction). As shown in FIGS. 3A and 3B, widths of the front side source/drain contact CA in the first lateral direction (X direction) and the second lateral direction (Y direction) may gradually increase in a direction away from the source/drain region 130 and the back side source/drain contact DBC in the vertical direction (Z direction).

As shown in FIGS. 3A and 3B, from among the plurality of source/drain regions 130, a bottom surface of the source/drain region 130 to which the front side source/drain contact CA is connected may be in contact with the etch stop layer ESL. The source/drain region 130 to which the front side source/drain contact CA is connected may be apart from the fin-type active region F1 in the vertical direction (Z direction) with the etch stop layer ESL therebetween. In other embodiments, differently from that shown in FIGS. 3A and 3B, the source/drain region 130 to which the front side source/drain contact CA is connected may pass through the etch stop layer ESL in the vertical direction (Z direction) and contact the fin-type active region F1.

As shown in FIG. 3A, the source/drain region 130 to which the back side source/drain contact DBC is connected may have a surface in contact with the etch stop layer ESL. In other embodiments, differently from that shown in FIG. 3A, the source/drain region 130 to which the back side source/drain contact DBC is connected may not be in contact with the etch stop layer ESL.

A metal silicide film 192 may be between the back side source/drain contact DBC and the source/drain region 130. A detailed configuration of the metal silicide film 192 may be substantially the same as that of the metal silicide film 172 described above.

The back side source/drain contact DBC may include a conductive barrier pattern 194 and a contact plug 196, which are sequentially stacked on the source/drain region 130. The conductive barrier pattern 194 may be between the metal silicide film 192 and the contact plug 196. The conductive barrier pattern 194 may have a surface in contact with the metal silicide film 192 and a surface in contact with the contact plug 196. Detailed configurations of the conductive barrier pattern 194 and the contact plug 196 may be substantially the same as those of the conductive barrier pattern 174 and the contact plug 176 described above. The back side source/drain contact DBC may overlap the source/drain region 130 in the vertical direction (Z direction) in the contact space DBH, and extend long in the vertical direction (Z direction) in the contact space DBH.

As shown in FIGS. 3B and 3D, an end surface of each of the plurality of back side source/drain contacts DBC, which is farthest from the source/drain region 130, an end surface of the device isolation film 112, which is farthest from the source/drain region 130, and an end surface of each of the plurality of fin-type active regions F1, which is farthest from the source/drain region 130, may extend on the same plane. That is, the end surfaces of the device isolation film 112, which is farthest from the source/drain region 130, and an end surface of each of the plurality of fin-type active regions F1, which is farthest from the source/drain region 130, may be coplanar.

As shown in FIGS. 3A, 3B, and 3D, the sidewall of each of the plurality of back side source/drain contacts DBC may be surrounded by an insulating spacer 190. The insulating spacer 190 may extend long in the vertical direction (Z direction) in the contact space DBH. The back side source/drain contact DBC may be apart from each of the first fin portion F1A and the second fin portion F1B in the first lateral direction (X direction) with the insulating spacer 190 therebetween. As shown in FIGS. 3B and 3D, the insulating spacer 190 may be in contact with the device isolation film 112. The insulating spacer 190 may include a silicon oxide film, a silicon oxynitride film, a silicon nitride film, or a combination thereof, without being limited thereto. In other embodiments, a portion of the insulating spacer 190, which is between the back side source/drain contact DBC and the device isolation film 112, may be omitted. In this case, the back side source/drain contact DBC may be in direct contact with the device isolation film 112.

As shown in FIG. 3A, the etch stop layer ESL may include a portion facing the sidewall of the back side source/drain contact DBC in the first lateral direction (X direction) with the insulating spacer 190 therebetween. In other embodiments, the insulating spacer 190 may not be between the etch stop layer ESL and the sidewall of the back side source/drain contact DBC. In this case, the etch stop layer ESL may be in contact with the sidewall of the back side source/drain contact DBC.

A back side insulating film 109 may be on the end surface of each of the plurality of back side source/drain contacts DBC, which is farthest from the source/drain region 130, the end surface of the device isolation film 112, which is farthest from the source/drain region 130, and the end surface of each of the plurality of fin-type active regions F1, which is farthest from the source/drain region 130. As used herein, the end surface of each of the plurality of back side source/drain contacts DBC, which is farthest from the source/drain region 130, may be referred to as a bottom surface of each of the back side source/drain contacts DBC, the end surface of the device isolation film 112, which is farthest from the source/drain region 130, may be referred to as a bottom surface of the device isolation film 112, and the end surface of each of the plurality of fin-type active regions F1, which is farthest from the source/drain region 130, may be referred to as a bottom surface of each of the plurality of fin-type active regions F1. The bottom surface of each of the plurality of back side source/drain contacts DBC, the bottom surface of the device isolation film 112, and the bottom surface of each of the plurality of fin-type active regions F1 may be in contact with the back side insulating film 109. The back side insulating film 109 may be apart from the etch stop layer ESL in the vertical direction (Z direction) with the first fin portion F1A and the second fin portion F1B of the fin-type active region F1 therebetween.

In some embodiments, the back side insulating film 109 may include a silicon oxide film, a silicon nitride film, silicon carbide film, a low-k dielectric film, or a combination thereof. The low-k dielectric film may include fluorine-doped silicon oxide, organosilicate glass, carbon-doped oxide, porous silicon oxide, porous organosilicate glass, a spin-on organic polymeric dielectric, a spin-on silicon-based polymeric dielectric, or a combination thereof, without being limited thereto.

As shown in FIGS. 3A, 3B, and 3D, a back side power rail BPW may be connected to an end of the back side source/drain contact DBC, which is farthest from the source/drain region 130. The back side power rail BPW may pass through the back side insulating film 109 in the vertical direction (Z direction) and be in contact with the end of the back side source/drain contact DBC. In some embodiments, the back side power rail BPW may include a metal wiring layer and a conductive barrier layer surrounding the metal wiring layer. The metal wiring layer included in the back side power rail BPW may include ruthenium (Ru), cobalt (Co), tungsten (W), or a combination thereof. The conductive barrier layer included in the back side power rail BPW may include titanium (Ti), titanium nitride (TiN), tantalum (Ta), tantalum nitride (TaN), or a combination thereof.

As shown in FIGS. 3A to 3D, a top surface of each of the plurality of front side source/drain contacts CA, the plurality of capping insulating patterns 168, and the inter-gate dielectric film 144 may be covered with an upper insulating structure 180. The upper insulating structure 180 may include an etch stop film 182 and an upper insulating film 184, which are sequentially stacked on each of the plurality of front side source/drain contacts CA, the plurality of capping insulating patterns 168, and the inter-gate dielectric film 144. The etch stop film 182 may include silicon carbide (SiC), silicon nitride (SiN), nitrogen-doped silicon carbide (SiC:N), silicon oxycarbide (SiOC), aluminum nitride (AlN), aluminum oxynitride (AlON), aluminum oxide (AlO), aluminum oxycarbide (AlOC), or a combination thereof. The upper insulating film 184 may include an oxide film, a nitride film, an ultralow-k (ULK) film having an ultralow dielectric constant K of about or exactly 2.2 to about or exactly 2.4, or a combination thereof. For example, the upper insulating film 184 may include a tetraethylortho-silicate (TEOS) film, a high-density plasma (HDP) film, a boro-phospho-silicate glass (BPSG) film, a flowable chemical vapor deposition (FCVD) oxide film, a silicon oxynitride (SiON) film, a silicon nitride (SiN) film, a silicon oxycarbide (SiOC) film, a SiCOH film, or a combination thereof, without being limited thereto.

As shown in FIGS. 3A and 3B, a plurality of source/drain via contacts VA may be on the plurality of front side source/drain contacts CA. Each of the plurality of source/drain via contacts VA may pass through the upper insulating structure 180 and be in contact with the front side source/drain contact CA. From among the plurality of source/drain regions 130, the source/drain region 130 connected to the front side source/drain contact CA may be electrically connected to the source/drain via contact VA through the metal silicide film 172 and the front side source/drain contact CA. A bottom surface of each of the plurality of source/drain via contacts VA may be in contact with the top surface of the front side source/drain contact CA. Each of the plurality of source/drain via contacts VA may include molybdenum (Mo) and/or tungsten (W), without being limited thereto.

As shown in FIGS. 2 and 3C, a gate contact CB may be on the gate line 160. The gate contact CB may be connected to the gate line 160 by passing through the upper insulating structure 180 and the capping insulating pattern 168 in the vertical direction (Z direction). A bottom surface of the gate contact CB may be in contact with a top surface of the gate line 160. The gate contact CB may include a contact plug, which includes molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, but a constituent material of the contact plug is not limited thereto. In some embodiments, the gate contact CB may further include a conductive barrier pattern surrounding a portion of the contact plug. The conductive barrier pattern included in the gate contact CB may include a metal or a metal nitride. For example, the conductive barrier pattern may include Ti, Ta, W, TiN, TaN, WN, WCN, TiSiN, TaSiN, WSiN, or a combination thereof, without being limited thereto.

A top surface of an upper insulating structure 180 may be covered by an interlayer insulating film 186. A constituent material of the interlayer insulating film 186 may be the same or substantially the same as that of the upper insulating film 184, which has been described above.

A plurality of upper wiring layers M1 may pass through the interlayer insulating film 186. Each of the plurality of upper wiring layers M1 may be connected to a selected one of the plurality of source/drain via contacts VA located thereunder or a selected one of a plurality of gate contacts (refer to CB in FIG. 2). In some embodiments, from among the plurality of upper wiring layers M1, an upper wiring layer M1 connected to the front side source/drain contact CA through the source/drain via contact VA may be used as a signal line SL. The plurality of upper wiring layers M1 may include molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, without being limited thereto.

As described above with reference to FIGS. 2 and 3A to 3D, in the IC device 100, some of the plurality of source/drain regions 130 located on the plurality of fin-type active regions F1 may be connected to the back side source/drain contact DBC, while some other source/drain regions 130 may be connected to the front side source/drain contact CA. Accordingly, in the IC device 100, a sufficient insulation distance between each of the plurality of back side source/drain contacts DBC and each of the plurality of front side source/drain contacts CA may be ensured, and thus, parasitic capacitance therebetween may be inhibited, and resistances of wirings configured to supply power and/or signals to the source/drain region 130 of the IC device 100 may be reduced.

In addition, when an etching process of forming the contact space DBH in which the plurality of back side source/drain contacts DBC are located is performed during the process of manufacturing the IC device 100 according to the inventive concepts, the contact space DBH may be easily (e.g., successfully) formed by performing a self-aligned etching process using the device isolation film 112. Accordingly, the IC device 100 may have a structure capable of easily (e.g., successfully) aligning the plurality of back side source/drain contacts DBC and the plurality of front side source/drain contacts CA at desired positions without applying strict design rules during the formation of the plurality of back side source/drain contacts DBC and the plurality of front side source/drain contacts CA. As described above, the IC device 100 according to the inventive concepts may provide a stable and optimized wiring structure even within a reduced area with the downscaling trend, and the integration density and reliability of the IC device 100 may be improved.

Figure 4A:
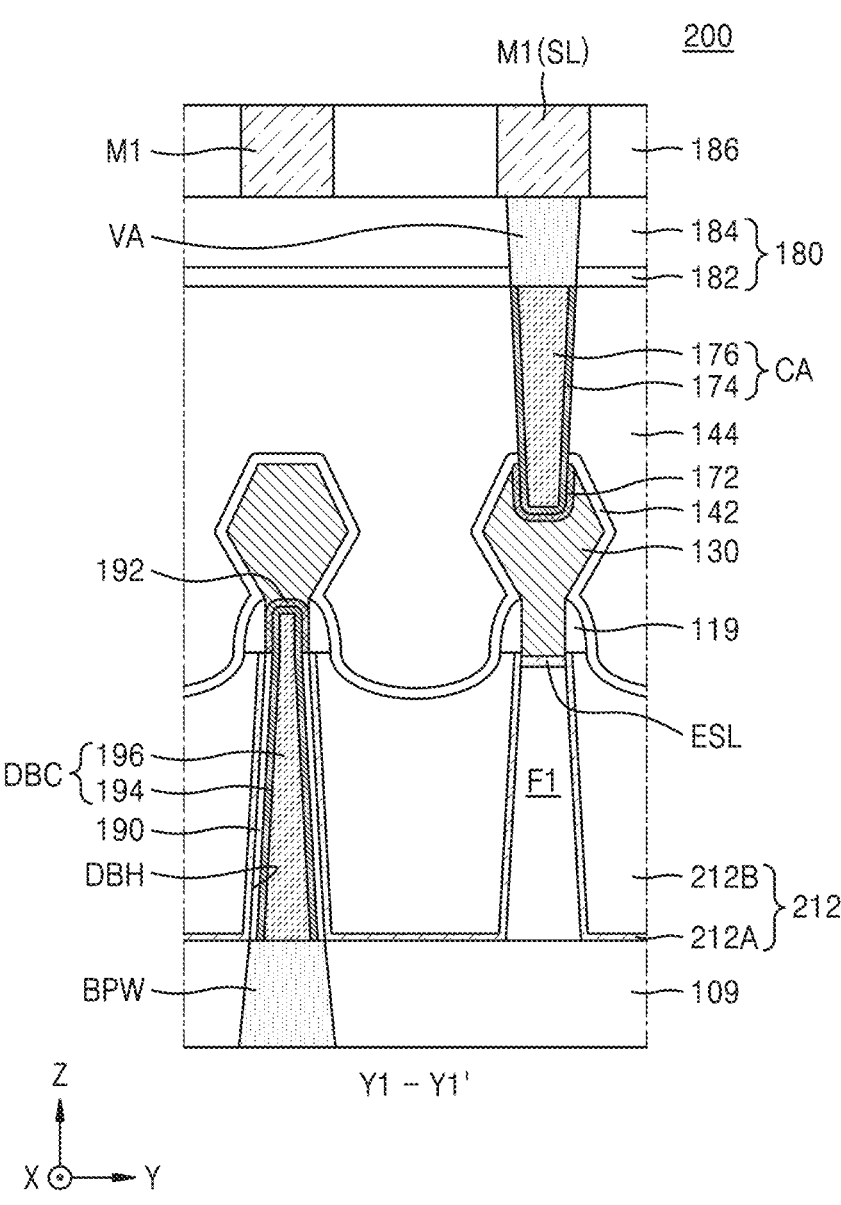
FIGS. 4A, 4B, and 4C are cross-sectional views of an IC device according to embodiments.
Figure 4B:
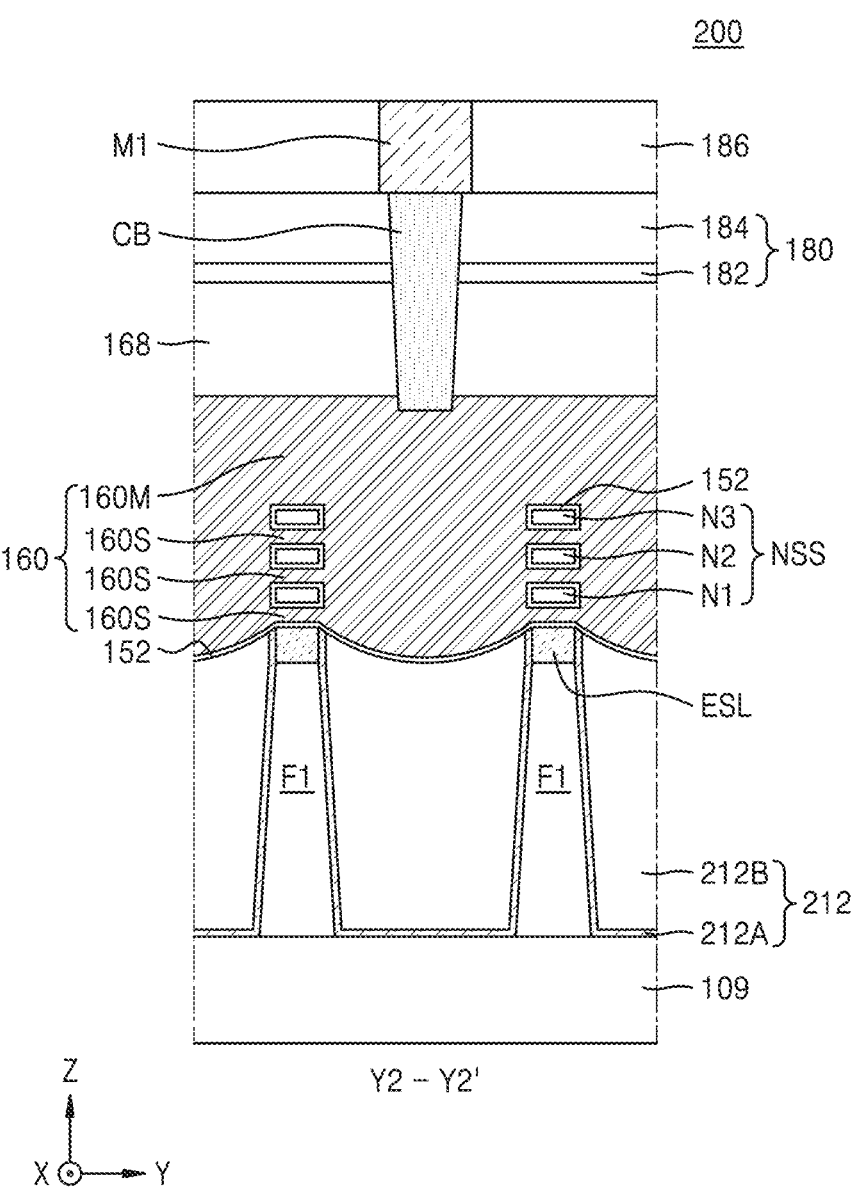
Figure 4C:
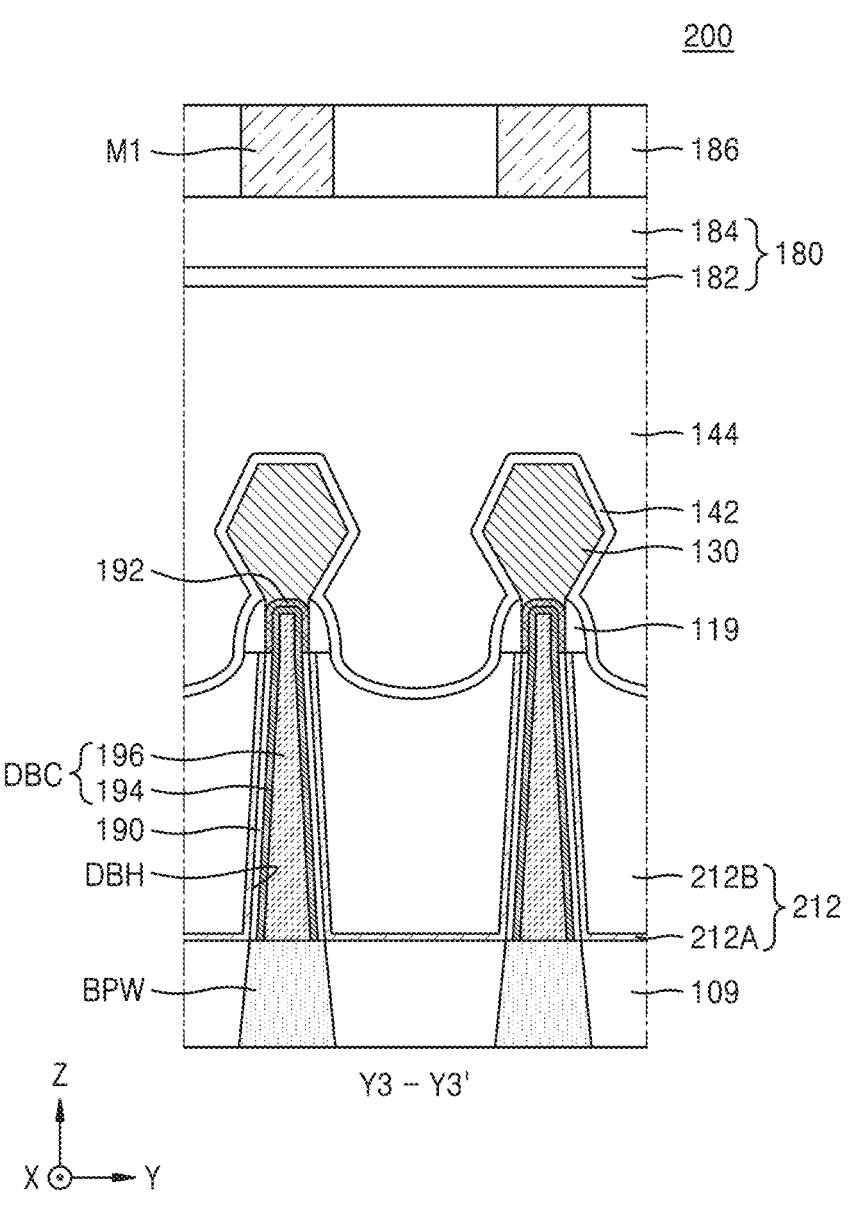

FIGS. 4A, 4B, and 4C are cross-sectional views of an IC device 200 according to embodiments. More specifically, FIG. 4A is a cross-sectional view of a portion corresponding to a cross-section taken along line Y1-Y1' of FIG. 2, FIG. 4B is a cross-sectional view of a portion corresponding to a cross-section taken along line Y2-Y2' of FIG. 2, and FIG. 4C is a cross-sectional view of a portion corresponding to a cross-section taken along line Y3-Y3' of FIG. 2. In FIGS. 4A, 4B, and 4C, the same reference numerals are used to denote the same elements as in FIGS. 2 and 3A to 3D, and repeated descriptions thereof are omitted.

Referring to FIGS. 4A, 4B, and 4C, the IC device 200 may substantially have the same configuration as the IC device 100 described with reference to FIGS. 2 and 3A to 3D. However, the IC device 200 may include a device isolation film 212 instead of the device isolation film 112.

The device isolation film 212 may include an insulating liner 212A and a buried insulating film 212B including different materials from each other. The buried insulating film 212B may have a bottom surface and a side surface surrounded by the insulating liner 212A.

In some embodiments, the insulating liner 212A and the buried insulating film 212B may include materials having different etch selectivities from each other in a predetermined (or, alternatively, selected or desired) etching atmosphere. For example, the insulating liner 212A may include a silicon nitride film, and the buried insulating film 212B may include a silicon oxide film.

In other embodiments, the insulating liner 212A and the buried insulating film 212B may include materials having different densities from each other. The insulating liner 212A may have a higher density than the buried insulating film 212B. For example, the insulating liner 212A may include a silicon oxide film formed by using an atomic layer deposition (ALD) process, and the buried insulating film 212B may include an oxide film formed by using a flowable chemical vapor deposition (FCVD) process. However, the inventive concepts are not limited thereto, and a constituent material of each of the insulating liner 212A and the buried insulating film 212B may be variously modified and changed.

Each of a plurality of back side source/drain contacts DBC may have a sidewall facing the insulating liner 212A and be apart from the buried insulating film 212B with the insulating liner 212A therebetween. A sidewall of each of the plurality of fin-type active regions F1 may be in contact with the insulating liner 212A.

Because the IC device 200 includes the device isolation film 212 including the insulating liner 212A and the buried insulating film 212B, when an etching process of forming a contact space DBH in which the plurality of back side source/drain contacts DBC are located is performed, a self-aligned etching process using the device isolation film 212 may be further facilitated. Accordingly, the IC device 200 may have a structure capable of relatively easily (e.g., successfully) aligning the plurality of back side source/drain contacts DBC and a plurality of front side source/drain contacts CA at desired positions without applying strict design rules during the formation of the plurality of back side source/drain contacts DBC and the plurality of front side source/drain contacts CA.

Figure 5A:
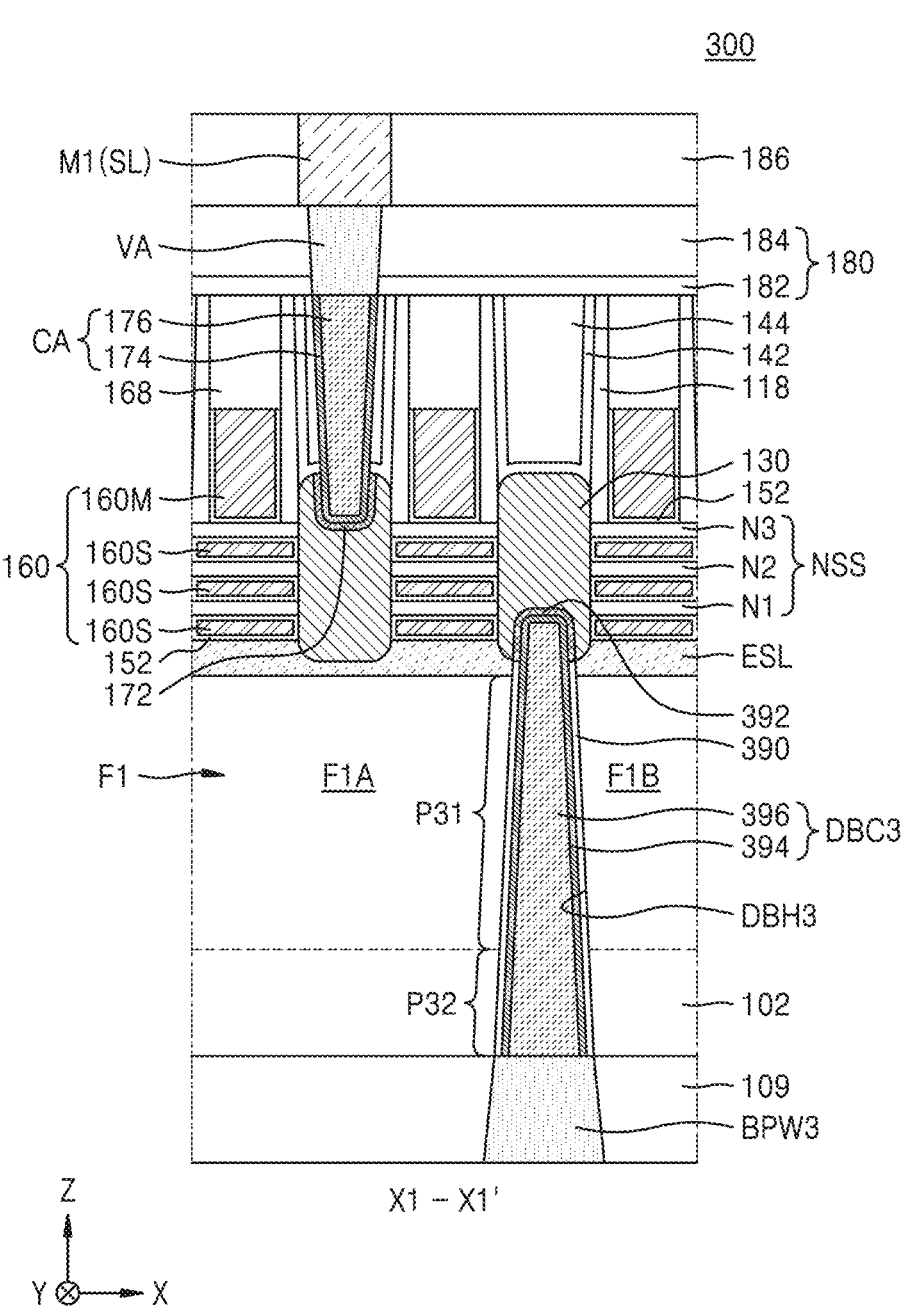
FIGS. 5A and 5B are cross-sectional views of an IC device according to embodiments.
Figure 5B:
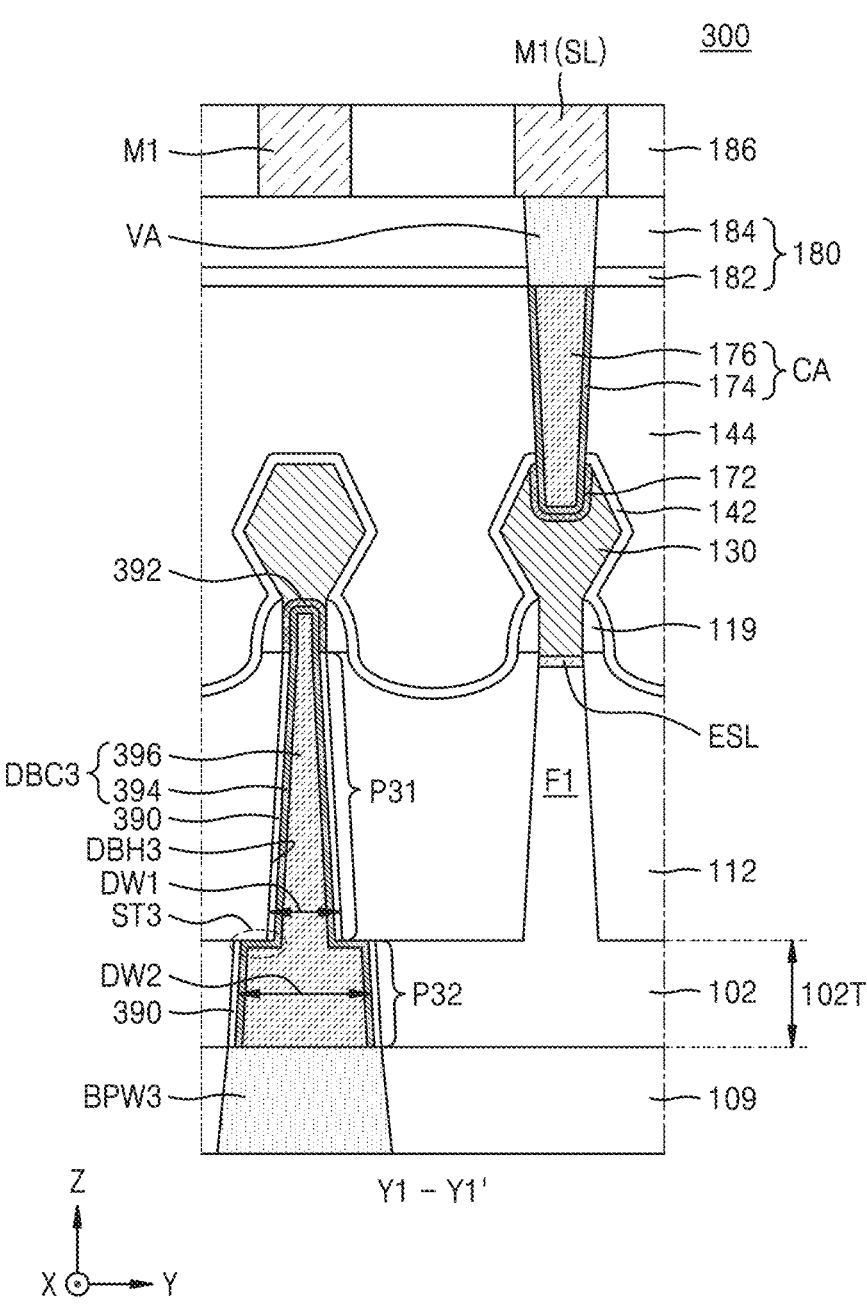

FIGS. 5A and 5B are cross-sectional views of an IC device 300 according to embodiments. More specifically, FIG. 5A is a cross-sectional view of a portion corresponding to a cross-section taken along line X1-X1' of FIG. 2, and FIG. 5B is a cross-sectional view of a portion corresponding to a cross-section taken along line Y1-Y1' of FIG. 2. In FIGS. 5A and 5B, the same reference numerals are used to denote the same elements as in FIGS. 2 and 3A to 3D, and repeated descriptions thereof are omitted.

Referring to FIGS. 5A and 5B, the IC device 300 may substantially have the same configuration as the IC device 100 described with reference to FIGS. 2 and 3A to 3D. However, the IC device 300 may further include a substrate 102, which is integrally connected to each of the plurality of fin-type active regions F1 and in contact with a bottom surface of a device isolation film 112. The substrate 102 may be integrally connected to each of the first fin portion F1A and the second fin portion F1B of the fin-type active region F1. In the IC device 300, the back side insulating film 109 may be apart from the device isolation film 112 in a vertical direction (Z direction) with the substrate 102 therebetween. In the vertical direction (Z direction), a thickness 102T of the substrate 102 may be less than a thickness of the device isolation film 112.

The substrate 102 may include an element semiconductor (e.g., Si or Ge) or a compound semiconductor (e.g., SiGe, SiC, GaAs, InAs, InGaAs, or InP). The substrate 102 may include a conductive region, for example, a doped well or a doped structure.

A back side source/drain contact DBC3 may pass through the substrate 102 and the fin-type active region F1 in the vertical direction (Z direction) and be electrically connected to a source/drain region 130 that is not connected to the front side source/drain contact CA, from among the plurality of source/drain regions 130. A back side power rail BPW3 may pass through the back side insulating film 109 in the vertical direction (Z direction) and be connected to the back side source/drain contact DBC3. A detailed configuration of the back side power rail BPW3 may be substantially the same as that of the back side power rail BPW described with reference to FIGS. 3A, 3B, and 3C.

The back side source/drain contact DBC3 may fill a contact space DBH3 between the first fin portion F1A and the second fin portion F1B. The source/drain region 130 to which the back side source/drain contact DBC3 is connected may overlap the contact space DBH3 in the vertical direction (Z direction) on the fin-type active region F1.

A metal silicide film 392 may be between the back side source/drain contact DBC3 and the source/drain region 130. A detailed configuration of the metal silicide film 392 may be substantially the same as that of the metal silicide film 172 described with reference to FIGS. 3A and 3B.

The back side source/drain contact DBC3 may include a conductive barrier pattern 394 and a contact plug 396. The conductive barrier pattern 394 may be between the metal silicide film 392 and the contact plug 396. The conductive barrier pattern 394 may have a surface in contact with the metal silicide film 392 and a surface in contact with the contact plug 396. Detailed configurations of the conductive barrier pattern 394 and the contact plug 396 may be substantially the same as those of the conductive barrier pattern 174 and the contact plug 176 described with reference to FIGS. 3A and 3B.

The back side source/drain contact DBC3 may include a first portion P31 and a second portion P32. The first portion P31 may face each of the device isolation film 112 and the fin-type active region F1 in the contact space DBH3 and extend long in the vertical direction (Z direction). The second portion P32 may be integrally connected to the first portion P31 and pass through the substrate 102 in the vertical direction (Z direction). The first portion P31 of the back side source/drain contact DBC3 may have a sidewall facing each of the fin-type active region F1 and the device isolation film 112. The second portion P32 of the back side source/drain contact DBC3 may have a sidewall facing the substrate 102.

In the vertical direction (Z direction), a length of the first portion P31 of the back side source/drain contact DBC3 may be greater than a length of the second portion P32 of the back side source/drain contact DBC3. This may be due to the fact that the thickness 102T of the substrate 102 is less than the thickness of the device isolation film 112 in the vertical direction (Z direction). As described above, because the substrate 102 has a relatively small thickness in the vertical direction (Z direction), when an etching process of forming the contact space DBH3 in which a plurality of back side source/drain contacts DBC3 are located is performed during the process of manufacturing the IC device 300, an etched amount of the substrate 102 may be reduced. Thus, the process of forming the contact space DBH3 may be performed relatively easily (e.g., successfully). Also, the alignment accuracy between the source/drain region 130 to which the back side source/drain contact DBC3 is connected and the contact space DBH3 in a first lateral direction (X direction) may be improved.

In a second lateral direction (Y direction), a width DW2 of the second portion P32 of the back side source/drain contact DBC3 may be greater than a width DW1 of the first portion P31 of the back side source/drain contact DBC3. The back side source/drain contact DBC3 may include a stepped portion ST3 between the first portion P31 and the second portion P32 in a portion adjacent to an interface between the substrate 102 and the device isolation film 112. As described above, even when the width DW2 of the second portion P32 of the back side source/drain contact DBC3 in the second lateral direction (Y direction) is relatively great, when an etching process of forming the contact space DBH3 in which the plurality of back side source/drain contacts DBC3 are located is performed during the process of manufacturing the IC device 300, the local region to be removed, of the fin-type active region F1, may be selectively etched in a self-aligned manner by using the device isolation film 112 from a point in time at which the device isolation film 112 is exposed after the substrate 102 is etched. Accordingly, when the etching process of forming the contact space DBH3 is performed, alignment accuracy between the source/drain region 130 to which the back side source/drain contact DBC3 is connected and the contact space DBH3 may be improved.

A sidewall of the back side source/drain contact DBC3 may be surrounded by an insulating spacer 390. The insulating spacer 390 may include a portion, which faces the fin-type active region F1 and the device isolation film 112 in the contact space DBH3 and extends long in the vertical direction (Z direction), and a portion, which passes through the substrate 102 in the vertical direction (Z direction). As shown in FIG. 5A, the first portion P31 of the back side source/drain contact DBC3 may be apart from each of the first fin portion F1A and the second fin portion F1B in the first lateral direction (X direction) with the insulating spacer 390 therebetween. As shown in FIGS. 5A and 5B, the second portion P32 of the back side source/drain contact DBC3 may be apart from the substrate 102 with the insulating spacer 390 therebetween in a lateral direction (e.g., the first lateral direction (X direction) and the second lateral direction (Y direction)).

As shown in FIG. 5B, in a cross-sectional view taken in the second lateral direction (Y direction), the insulating spacer 390 may include a disconnected portion not to cover a portion of the stepped portion ST3 of the back side source/drain contact DBC3. Accordingly, a portion of the insulating spacer 390, which covers the substrate 102, may be apart from a portion of the insulating spacer 390, which covers the device isolation film 112 in the stepped portion ST3. The resultant structure described above may be obtained by removing a portion of the insulating spacer 390, which covers the stepped portion ST3, together while a partial region of the insulating spacer 390 is being etched back to expose the source/drain region 130 after the insulating spacer 390 is formed to conformally cover an inner surface of the contact space DBH3 during the formation of the insulating spacer 390. However, the inventive concepts are not limited thereto. For example, differently from that shown in FIG. 5B, the portion of the insulating spacer 390, which covers the substrate 102, may be continuously connected without being cut off to the portion of the insulating spacer 390, which covers the device isolation film 112. A detailed configuration of the insulating spacer 390 may be substantially the same as that of the insulating spacer 190 described with reference to FIGS. 3A, 3B, and 3D.

In other embodiments, a portion of the insulating spacer 390, which is between the back side source/drain contact DBC3 and the device isolation film 112, may be omitted. In this case, the back side source/drain contact DBC3 may be in direct contact with the device isolation film 112.

Figure 6:
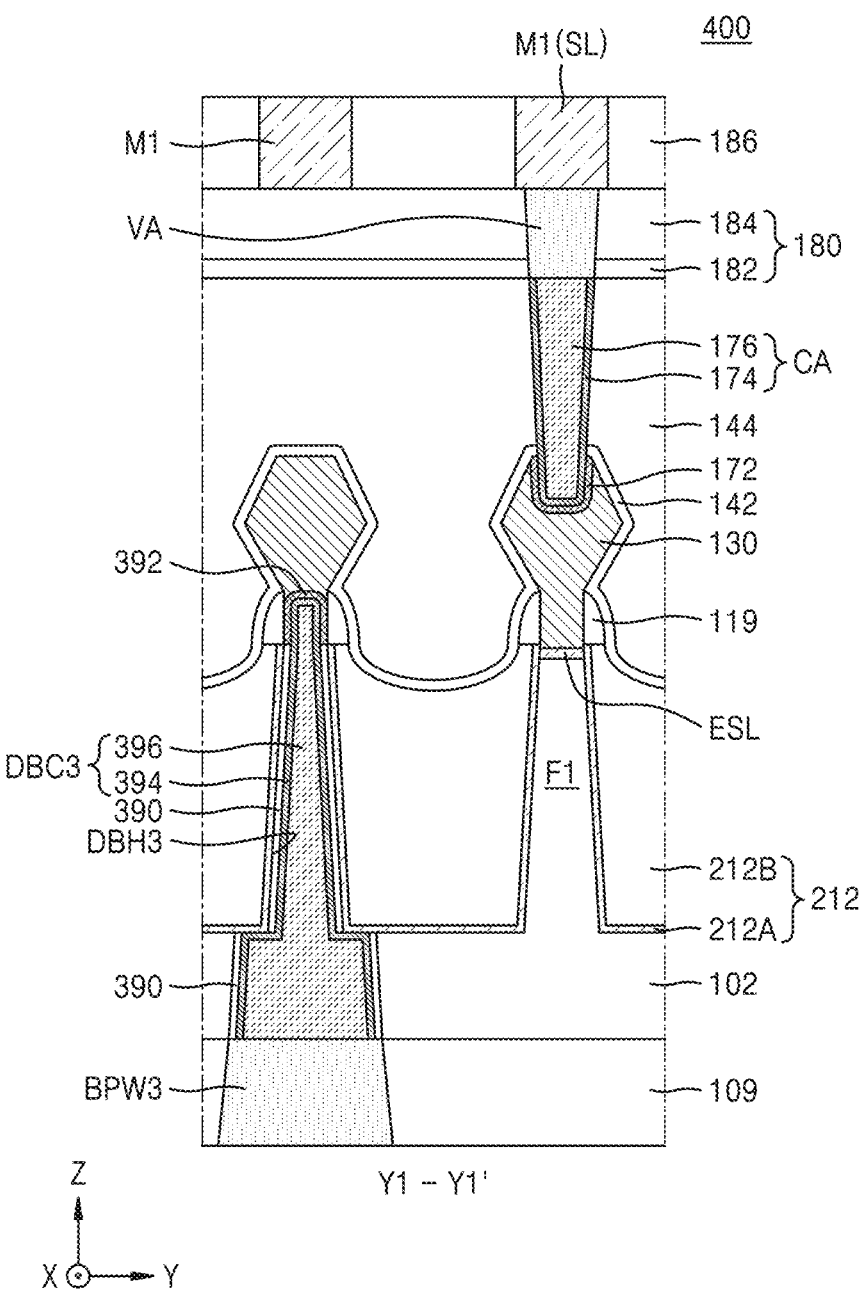
FIG. 6 is a cross-sectional view of an IC device according to embodiments.

FIG. 6 is a cross-sectional view of an IC device 400 according to embodiments. FIG. 6 illustrates a cross-sectional configuration of a portion corresponding to the cross-section taken along line Y1-Y1' of FIG. 2. In FIG. 6, the same reference numerals are used to denote the same elements as in FIGS. 2 to 5B, and repeated descriptions thereof are omitted.

Referring to FIG. 6, the IC device 400 may substantially have the same configuration as the IC device 300 described with reference to FIGS. 5A and 5B. However, the IC device 400 may include a device isolation film 212 instead of the device isolation film 112. A detailed configuration of the device isolation film 212 may be substantially the same as that described with reference to FIGS. 4A, 4B, and 4C.

Figure 7:
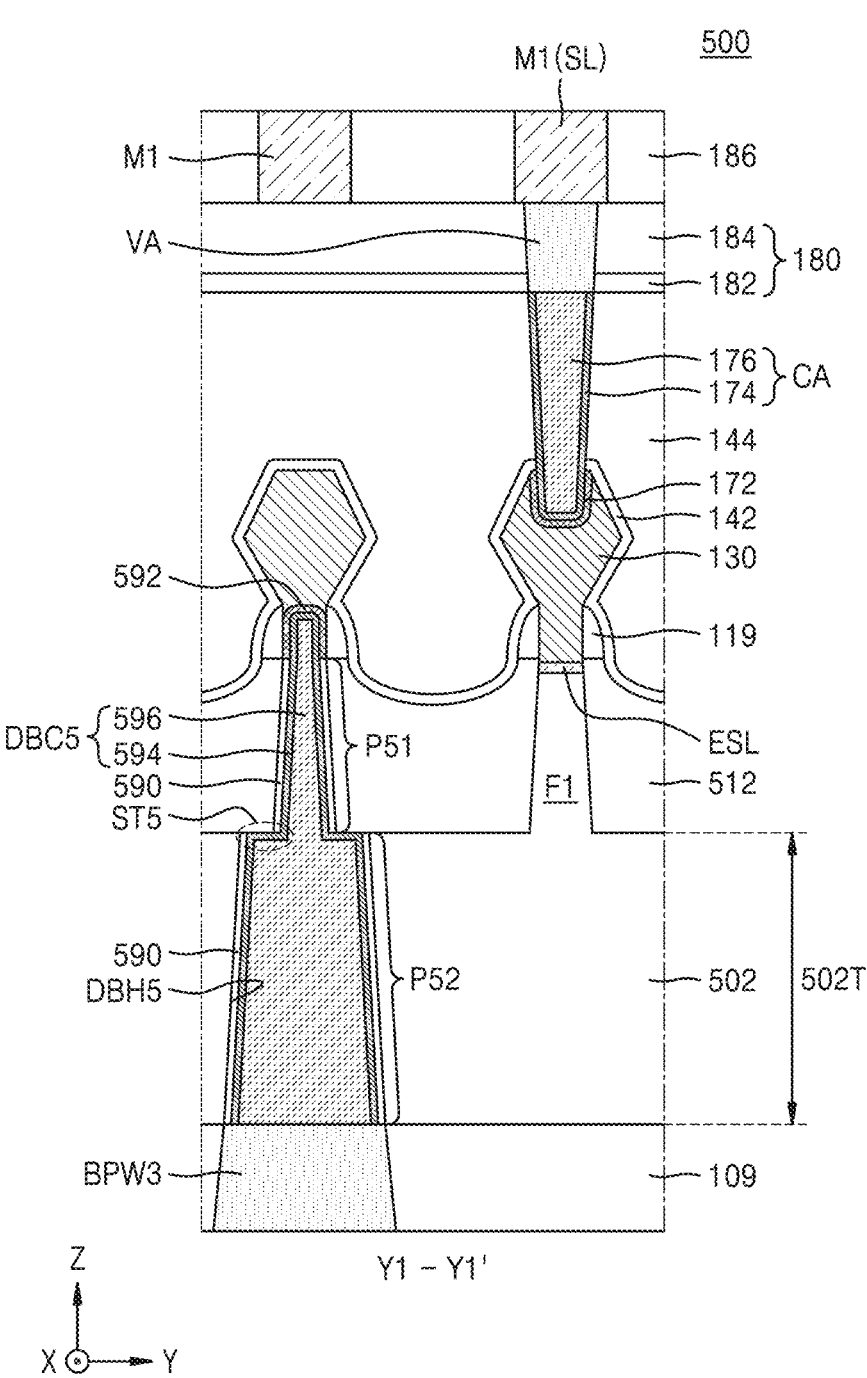
FIG. 7 is a cross-sectional view of an IC device according to embodiments.

FIG. 7 is a cross-sectional view of an IC device 500 according to embodiments. FIG. 7 illustrates a cross-sectional configuration of a portion corresponding to the cross-section taken along line Y1-Y1' of FIG. 2. In FIG. 7, the same reference numerals are used to denote the same elements as in FIGS. 2 to 5B, and repeated descriptions thereof are omitted.

Referring to FIG. 7, the IC device 500 may substantially have the same configuration as the IC device 300 described with reference to FIGS. 5A and 5B. However, the IC device 500 may include a substrate 502 and a device isolation film 512. The substrate 502 may be integrally connected to each of the plurality of fin-type active regions F1. The device isolation film 512 may cover a sidewall of each of the plurality of fin-type active regions F1. The substrate 502 and the device isolation film 512 may have substantially the same configurations as the substrate 102 and the device isolation film 112 described with reference to FIGS. 5A and 5B. However, a thickness 502T of the substrate 502 may be greater than a thickness of the device isolation film 512 in a vertical direction (Z direction).

A back side source/drain contact DBC5 may pass through the substrate 502 and the fin-type active region F1 in the vertical direction (Z direction) and be electrically connected to a source/drain region 130, which is not connected to the front side source/drain contact CA, from among the plurality of source/drain regions 130. A back side power rail BPW3 may pass through the back side insulating film 109 in the vertical direction (Z direction) and be connected to the back side source/drain contact DBC5. A metal silicide film 592 may be between the back side source/drain contact DBC5 and the source/drain region 130. A detailed configuration of the metal silicide film 592 may be substantially the same as that of the metal silicide film 172 described with reference to FIGS. 3A and 3B.

The back side source/drain contact DBC5 may include a conductive barrier pattern 594 and a contact plug 596. Detailed configurations of the conductive barrier pattern 594 and the contact plug 596 may be substantially the same as those of the conductive barrier pattern 174 and the contact plug 176 described with reference to FIGS. 3A and 3B.

A sidewall of the back side source/drain contact DBC5 may be surrounded by an insulating spacer 590. The insulating spacer 590 may include a portion, which is in contact with the device isolation film 512 in a contact space DBH5 and extends long in the vertical direction (Z direction), and a portion, which passes through the substrate 502 in the vertical direction (Z direction) and is in contact with the substrate 502. The back side source/drain contact DBC5 may be apart from the substrate 502 with the insulating spacer 590 therebetween. A detailed configuration of the insulating spacer 590 may be substantially the same as that of the insulating spacer 190 described with reference to FIGS. 3A, 3B, and 3D.

The back side source/drain contact DBC5 may include a first portion P51 and a second portion P52. The first portion P51 may face each of the device isolation film 512 and the fin-type active region F1 in the contact space DBH5 and extend long in the vertical direction (Z direction). The second portion P52 may be integrally connected to the first portion P51 and pass through the substrate 502 in the vertical direction (Z direction). The first portion P51 of the back side source/drain contact DBC5 may have a sidewall facing each of the fin-type active region F1 and the device isolation film 112. The second portion P52 of the back side source/drain contact DBC5 may have a sidewall facing the substrate 102.

In the vertical direction (Z direction), a length of the first portion P51 of the back side source/drain contact DBC5 may be less than a length of the second portion P52 of the back side source/drain contact DBC5. However, the inventive concepts are not limited thereto. In the vertical direction (Z direction), a length of the first portion P51 of the back side source/drain contact DBC5 may be equal or substantially equal to a length of the second portion P52 of the back side source/drain contact DBC5.

In the second lateral direction (Y direction), a width of the second portion P52 of the back side source/drain contact DBC5 may be greater than a width of the first portion P51 of the back side source/drain contact DBC5. The back side source/drain contact DBC5 may include a stepped portion ST5 between the first portion P51 and the second portion P52 in a portion adjacent to an interface between the substrate 502 and the device isolation film 512. As described above, even when the width of the second portion P52 of the back side source/drain contact DBC5 in the second lateral direction (Y direction) is relatively great, when an etching process of forming the contact space DBH5 in which a plurality of back side source/drain contacts DBC5 are located is performed during the process of manufacturing the IC device 500, the local region to be removed, of the fin-type active region F1, may be selectively etched in a self-aligned manner by using the device isolation film 512 from a point in time at which the device isolation film 512 is exposed after the substrate 502 is etched. Accordingly, when the etching process of forming the contact space DBH5 is performed, alignment accuracy between the source/drain region 130 to which the back side source/drain contact DBC5 is connected and the contact space DBH5 may be improved.

Figure 8:
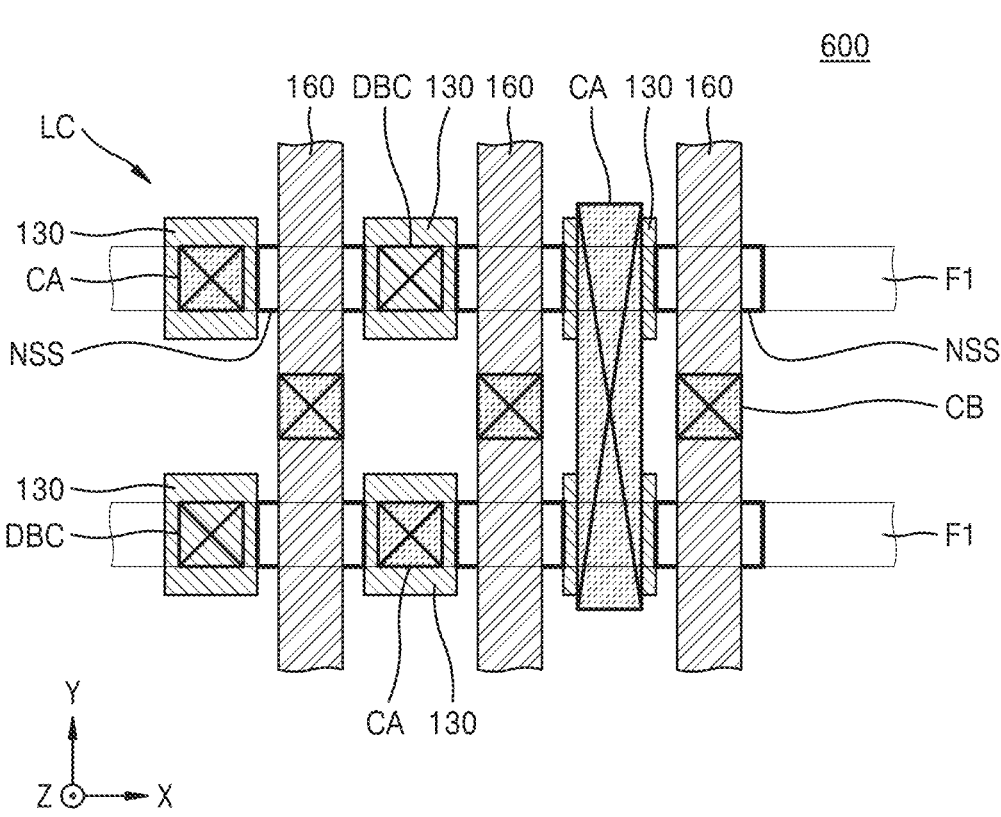
FIGS. 8, 9, and 10 are respectively plan layout diagrams of IC devices according to embodiments.
Figure 9:
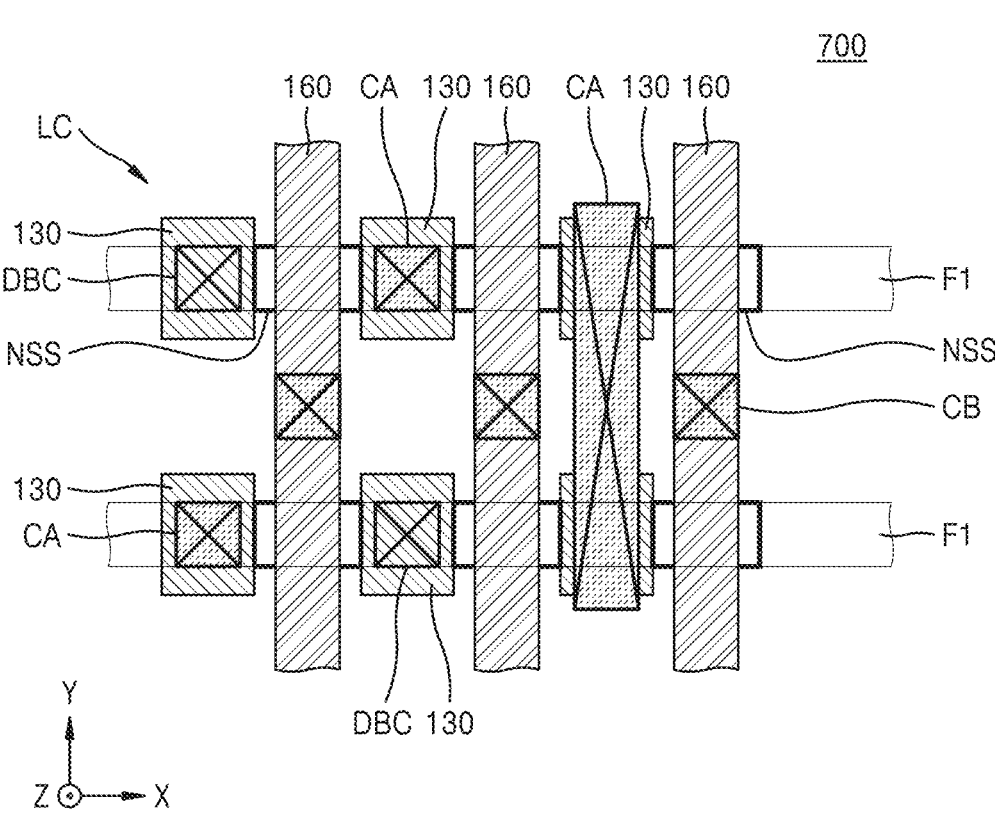
Figure 10:
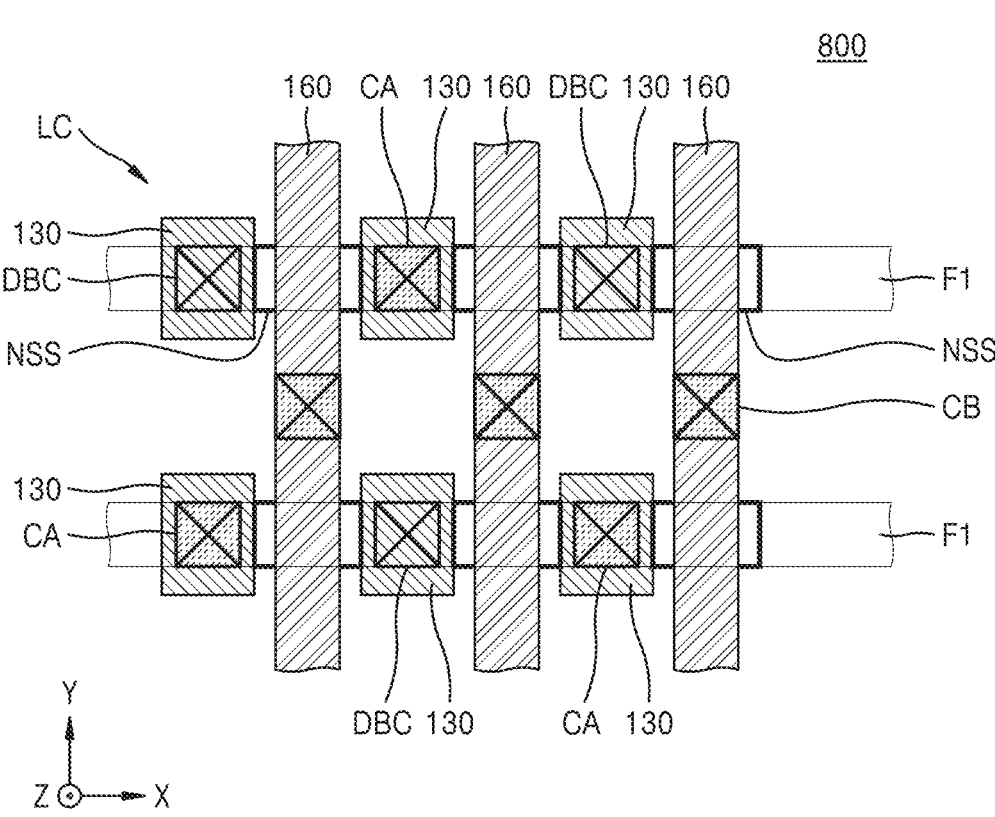

FIGS. 8, 9, and 10 are respectively plan layout diagrams of IC devices 600, 700, and 800 according to embodiments. In FIGS. 8, 9, and 10, the same reference numerals are used to denote the same elements as in FIG. 2, and repeated descriptions thereof are omitted.

Referring to FIGS. 8, 9, and 10, each of the IC devices 600, 700, and 800 may substantially have the same configuration as the IC device 100 described with reference to FIGS. 2 and 3A to 3D. However, in the IC devices 600, 700, and 800, planar shapes and positions of a plurality of front side source/drain contacts CA and positions of a plurality of back side source/drain contacts DBC may be variously selected as illustrated in FIGS. 8, 9, and 10.

Although example configurations of IC devices according to the inventive concepts have been described above with reference to FIGS. 2 to 10, the inventive concepts are not limited thereto, and various modifications and changes may be made within the scope of the inventive concepts.

Next, a method of manufacturing an IC device, according to embodiments, will be described in detail.

FIGS. 11A to 21B are cross-sectional views of a process sequence of a method of manufacturing an IC device, according to embodiments. More specifically, FIGS. 11A, 12A, . . . , and 21A are cross-sectional views of an example cross-sectional structure of a portion corresponding to the cross-section taken along line X1-X1' of FIG. 2, according to a process sequence. FIGS. 11B, 12B, . . . , and 21B are cross-sectional views of an example cross-sectional structure of a portion corresponding to the cross-section taken along line Y1-Y1' of FIG. 2, according to a process sequence. FIGS. 11C, 12C, . . . , and 16C are cross-sectional views of an example cross-sectional structure of a portion corresponding to the cross-section taken along line Y2-Y2' of FIG. 2, according to a process sequence. An example method of manufacturing the IC device 100 shown in FIGS. 2 and 3A to 3D will now be described with reference to FIGS. 11A to 21B. In FIGS. 11A to 21B, the same reference numerals are used to denote the same elements as in FIGS. 2 and 3A to 3D, and repeated descriptions thereof are omitted.

Figure 11A:
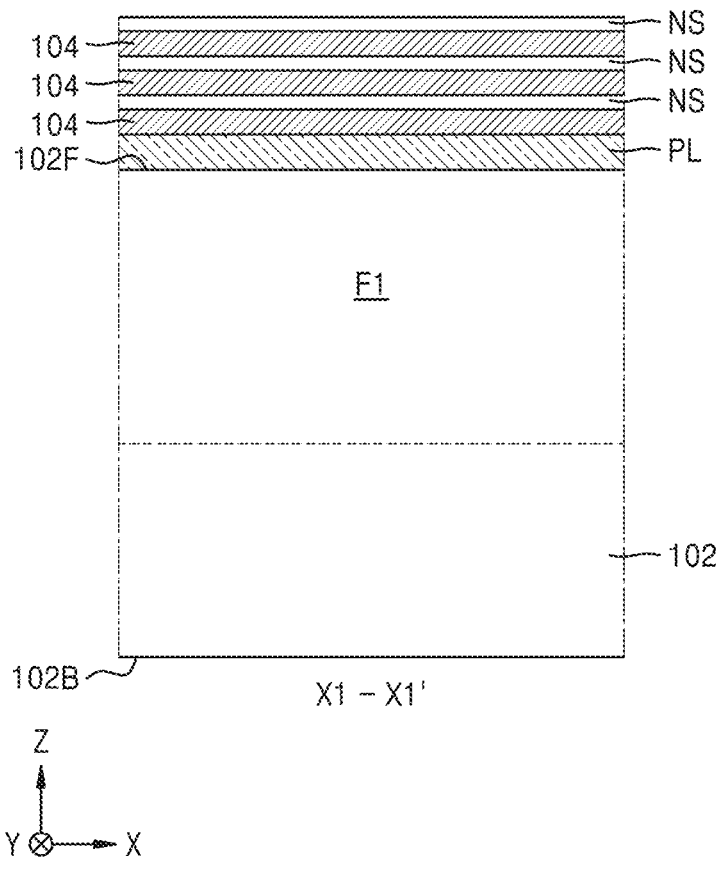
FIGS. 11A to 21B are cross-sectional views of a process sequence of a method of manufacturing an IC device, according to embodiments, wherein FIGS. 11A, 12A, . . . , and 21A are cross-sectional views of an example cross-sectional structure of a portion corresponding to the cross-section taken along line X1-X1' of FIG. 2, according to a process sequence, FIGS. 11B, 12B, . . . , and 21B are cross-sectional views of an example cross-sectional structure of a portion corresponding to the cross-section taken along line Y1-Y1' of FIG. 2, according to a process sequence, and FIGS. 11C, 12C, . . . , and 16C are cross-sectional views of an example cross-sectional structure of a portion corresponding to the cross-section taken along line Y2-Y2' of FIG. 2, according to a process sequence.
Figure 11B:
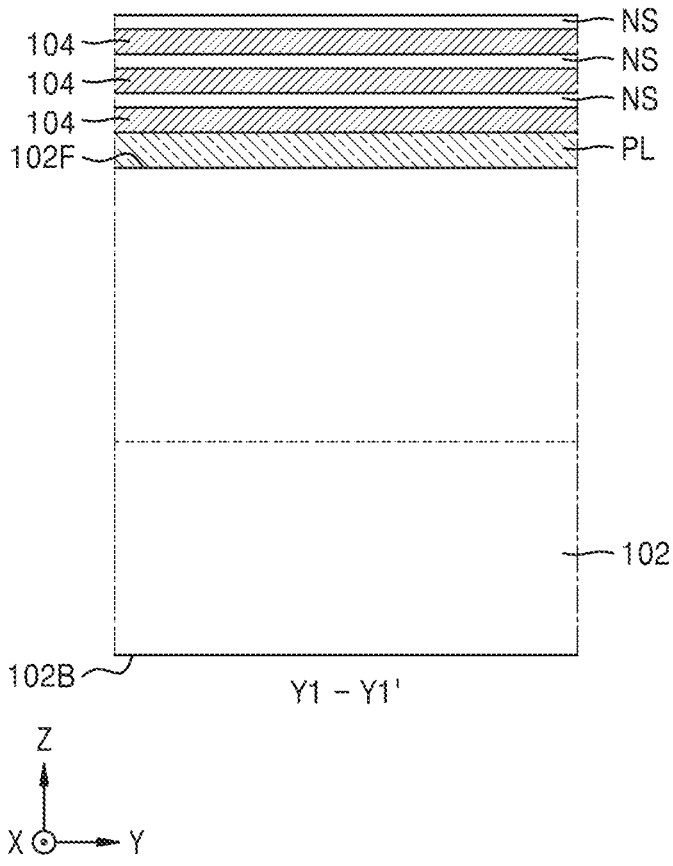
Figure 11C:
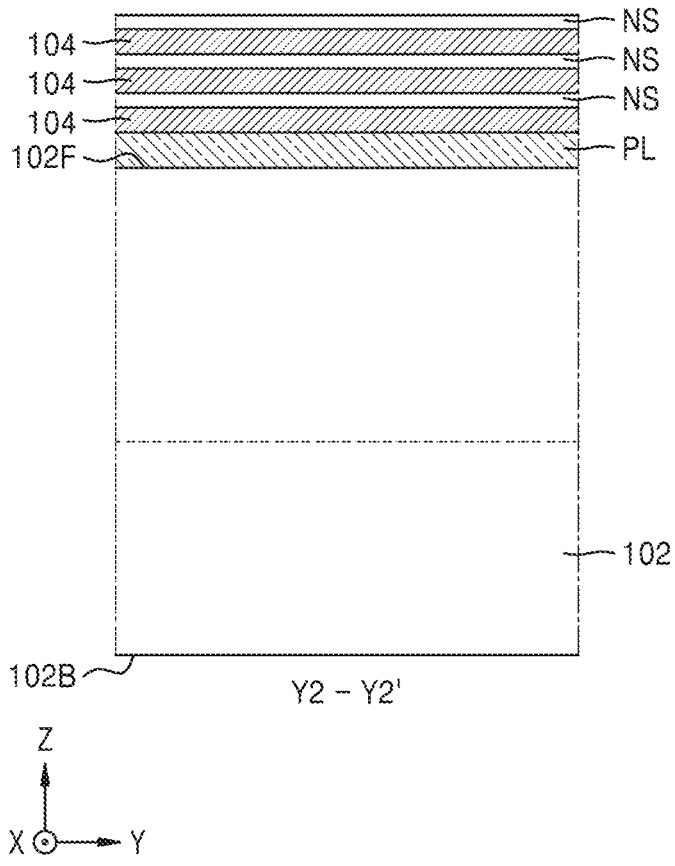

Referring to FIGS. 11A, 11B, and 11C, a substrate 102 having a back side surface 102B and a front side surface 102F may be prepared, and a sacrificial layer PL may be formed on the front side surface 102F of the substrate 102. A plurality of sacrificial semiconductor layers 104 and a plurality of nanosheet semiconductor layers NS may be alternately stacked one-by-one on the sacrificial layer PL.

The plurality of sacrificial semiconductor layers 104 and the plurality of nanosheet semiconductor layers NS may include semiconductor materials having different etch selectivities. In some embodiments, the plurality of nanosheet semiconductor layers NS may include a silicon (Si) layer, and the plurality of sacrificial semiconductor layers 104 may include a silicon germanium (SiGe) layer. In some embodiments, the plurality of sacrificial semiconductor layers 104 may have a constant Ge content. The SiGe layer included in the plurality of sacrificial semiconductor layers 104 may have a constant Ge content, which is selected in a range of about or exactly 5 atomic percent (at %) to about or exactly 50 at %, for example, about or exactly 10 at % to about or exactly 40 at %. The Ge content of the SiGe layer included in the plurality of sacrificial semiconductor layers 104 may be variously selected as needed.

The sacrificial layer PL may include a SiGe layer, similar to the plurality of sacrificial semiconductor layers 104. However, a Ge content of the SiGe layer included in the sacrificial layer PL may be higher than a Ge content of the SiGe layer included in the plurality of sacrificial semiconductor layers 104. In some embodiments, a Ge content of the sacrificial layer PL may be selected in a range of about or exactly 60 at % to about or exactly 70 at %. For example, the sacrificial layer PL may have a Ge content of about or exactly 65 at %.

Figure 12A:
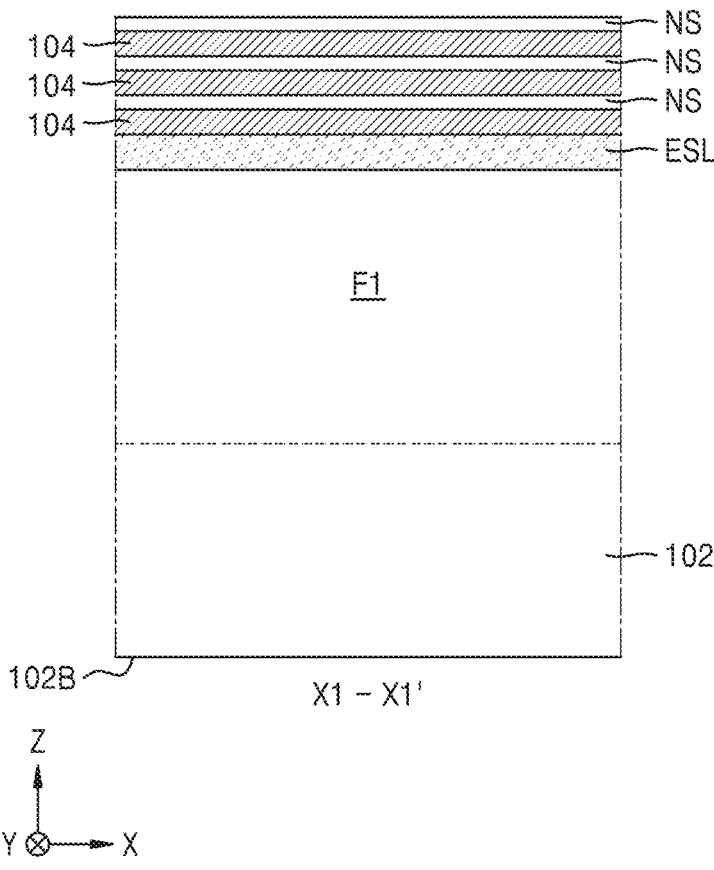
Figure 12B:
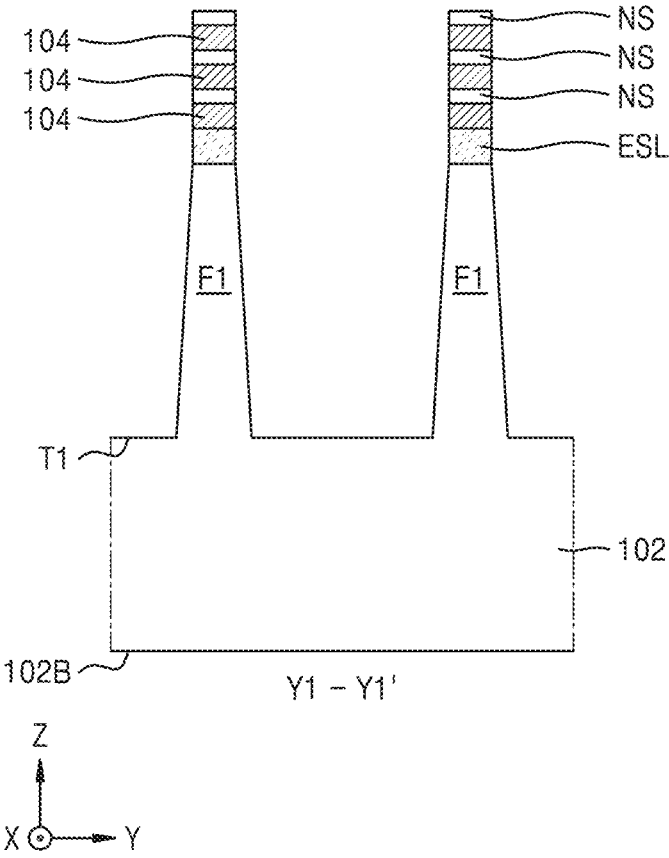
Figure 12C:
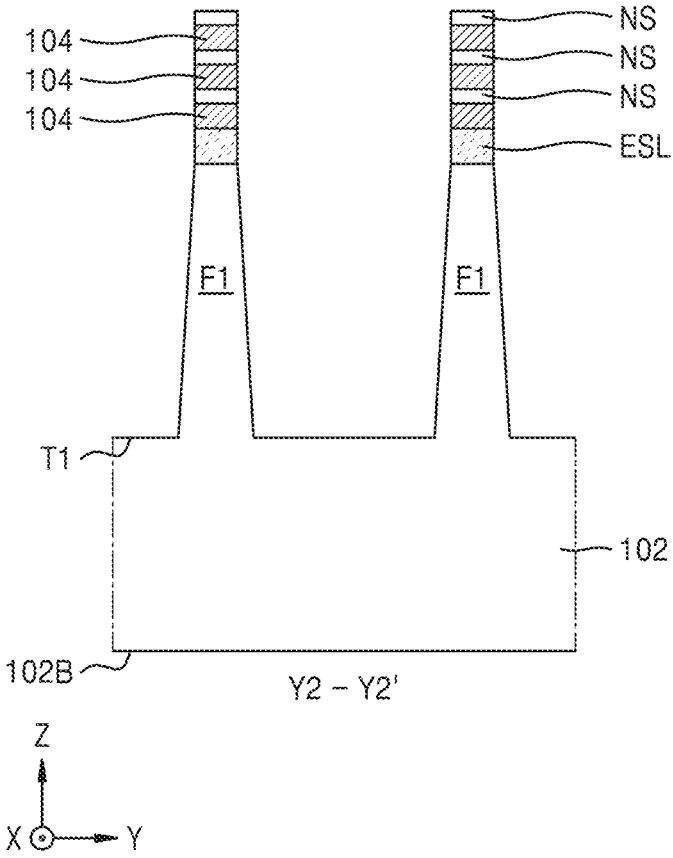

Referring to FIGS. 12A, 12B, and 12C, in the resultant structure of FIGS. 11A, 11B, and 11C, respective portions of the plurality of sacrificial semiconductor layers 104, the plurality of nanosheet semiconductor layers NS, the sacrificial layer PL, and the substrate 102 may be etched, and thus, a plurality of fin-type active regions F1 defining a trench region T1 may be formed in the substrate 102. A stack structure of the sacrificial layer PL, the plurality of sacrificial semiconductor layers 104, and the plurality of nanosheet semiconductor layers NS may remain on a top surface of each of the plurality of fin-type active regions F1.

Thereafter, the sacrificial layer PL exposed at a sidewall of the stack structure may be replaced by an etch stop layer ESL. In some embodiments, to replace the sacrificial layer PL by the etch stop layer ESL, after the sacrificial layer PL may be selectively removed from the sidewall of the stack structure, a space where the sacrificial layer PL was located may be filled by the etch stop layer ESL. To selectively remove the sacrificial layer PL, a selective wet etching process using a difference in Ge content may be performed.

Figure 13A:
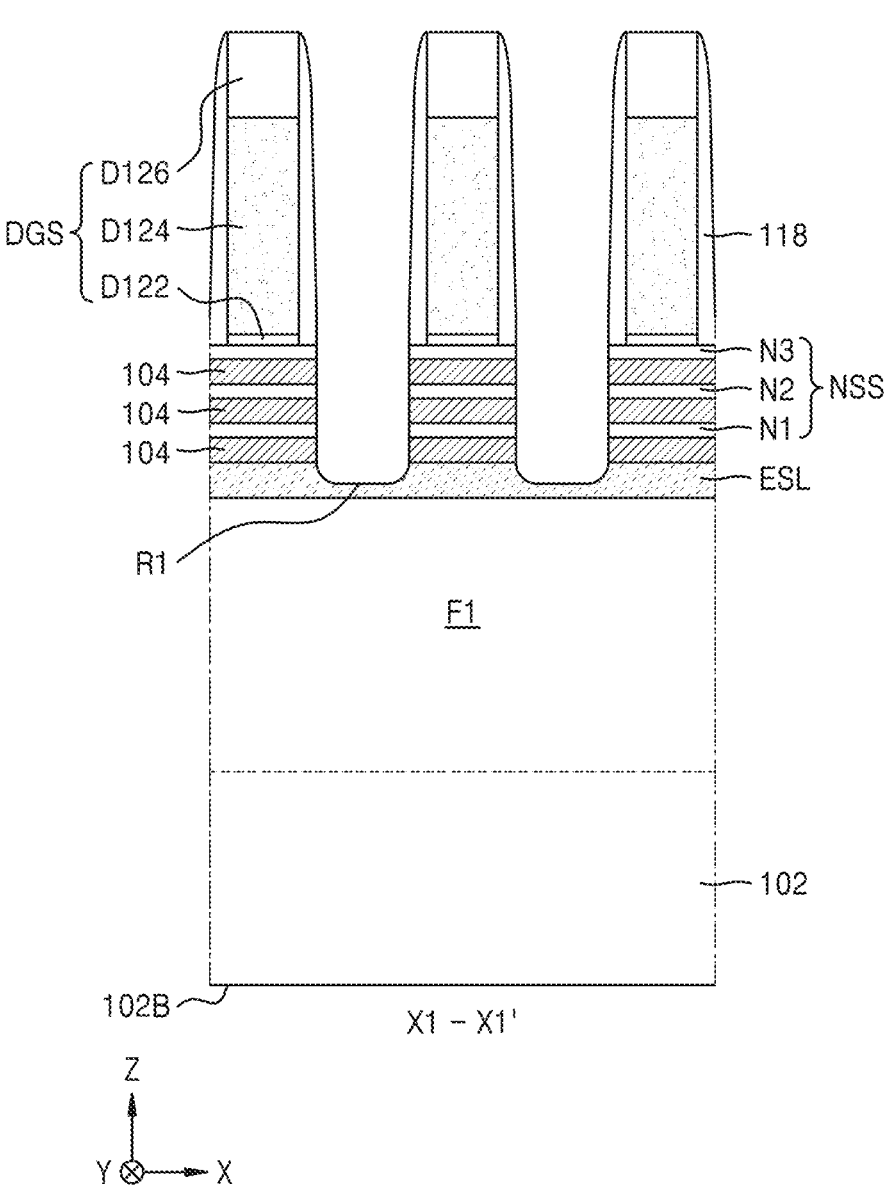
Figure 13B:
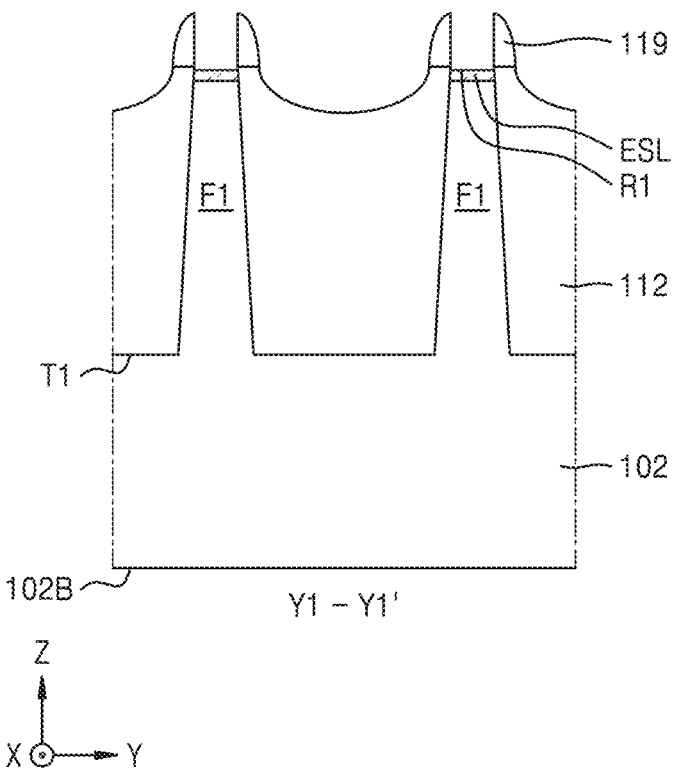
Figure 13C:
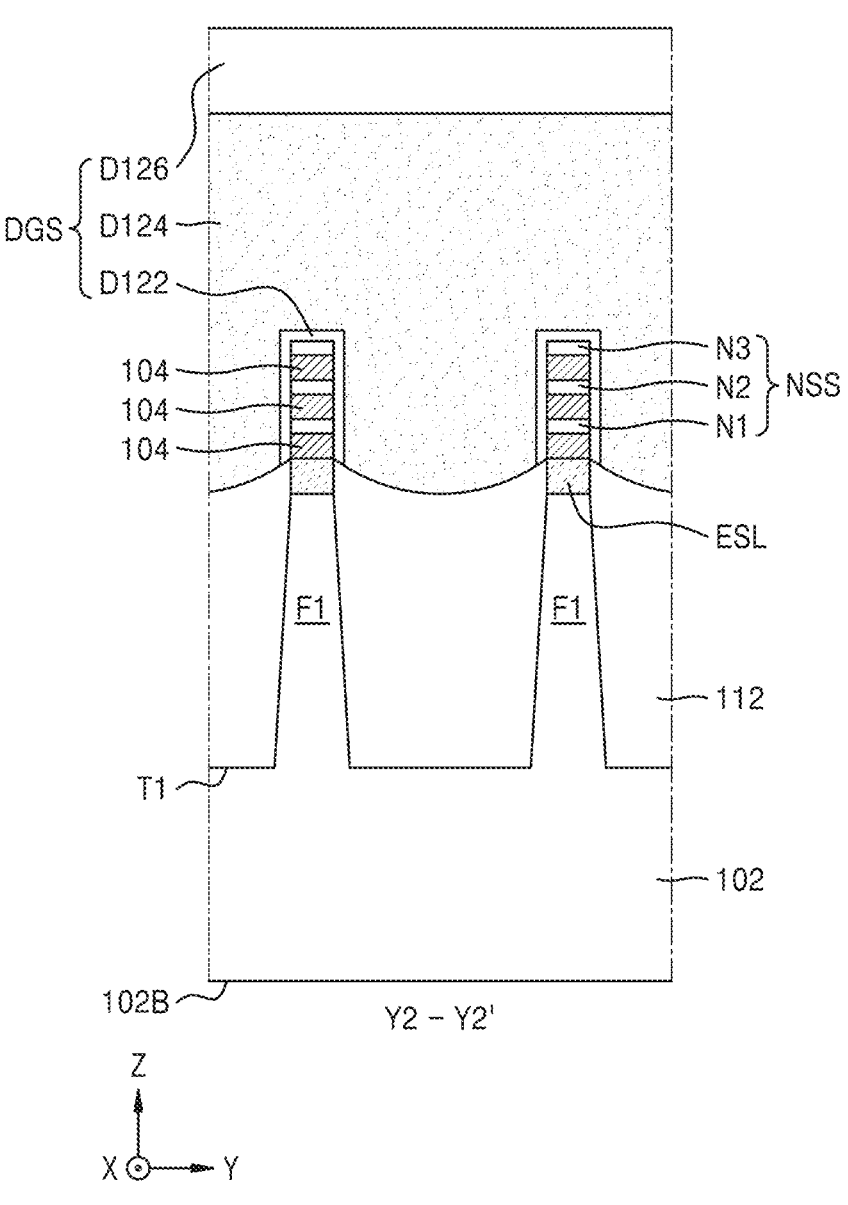

Referring to FIGS. 13A, 13B, and 13C, in the resultant structure of FIGS. 12A, 12B, and 12C, a device isolation film 112 may be formed to fill the trench region T1. After the device isolation film 112 is formed, sidewalls of each of the plurality of fin-type active regions F1 and sidewalls of the etch stop layer ESL may be covered by the device isolation film 112.

Thereafter, a plurality of dummy gate structures DGS may be formed on the stack structure of the etch stop layer ESL, the plurality of sacrificial semiconductor layers 104, and the plurality of nanosheet semiconductor layers NS. Each of the plurality of dummy gate structures DGS may be formed to extend long in a second lateral direction (Y direction). Each of the plurality of dummy gate structures DGS may have a structure in which an oxide film D122, a dummy gate layer D124, and a capping layer D126 are sequentially stacked. In some embodiments, the dummy gate layer D124 may include polysilicon, and the capping layer D126 may include a silicon nitride film.

A plurality of outer insulating spacers 118 may be formed to cover both sidewalls of each of the plurality of dummy gate structures DGS. Thereafter, respective portions of the plurality of sacrificial semiconductor layers 104 and the plurality of nanosheet semiconductor layers NS may be etched using the plurality of dummy gate structures DGS and the plurality of outer insulating spacers 118 as etch masks. Thus, the nanosheet semiconductor layers NS may be divided into a plurality of nanosheet stacks NSS, and a plurality of recesses R1, defined by the nanosheet stacks NSS and the dummy gate structures DGS, may be formed on the etch stop layer ESL. Each of the plurality of nanosheet stacks NSS may include a first nanosheet N1, a second nanosheet N2, and a third nanosheet N3. The plurality of recesses R1 may be etched by using a dry etching process, a wet etching process, or a combination thereof. After the plurality of recesses R1 are formed, a plurality of recess-side insulating spacers 119 may be formed on both sides of each of the fin-type active regions F1 on the device isolation film 112. A plurality of recess-side insulating spacers 119 may be adjacent to the plurality of recesses R1.

Figure 14A:
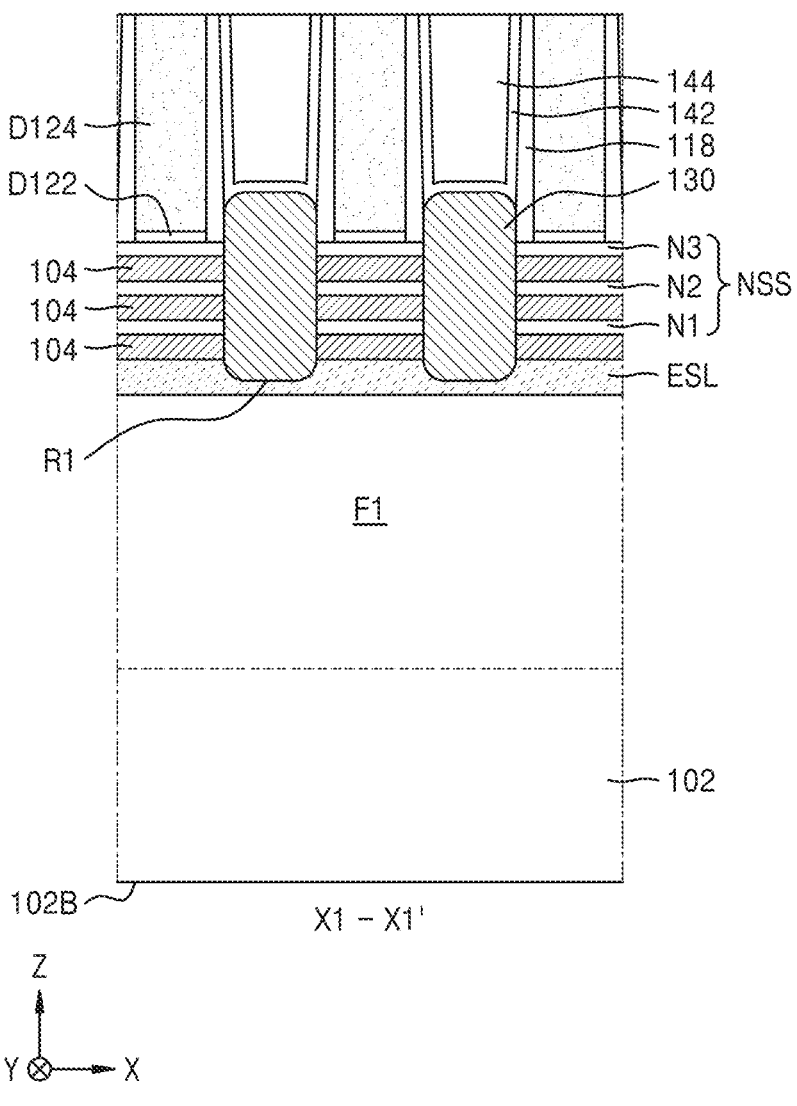
Figure 14B:
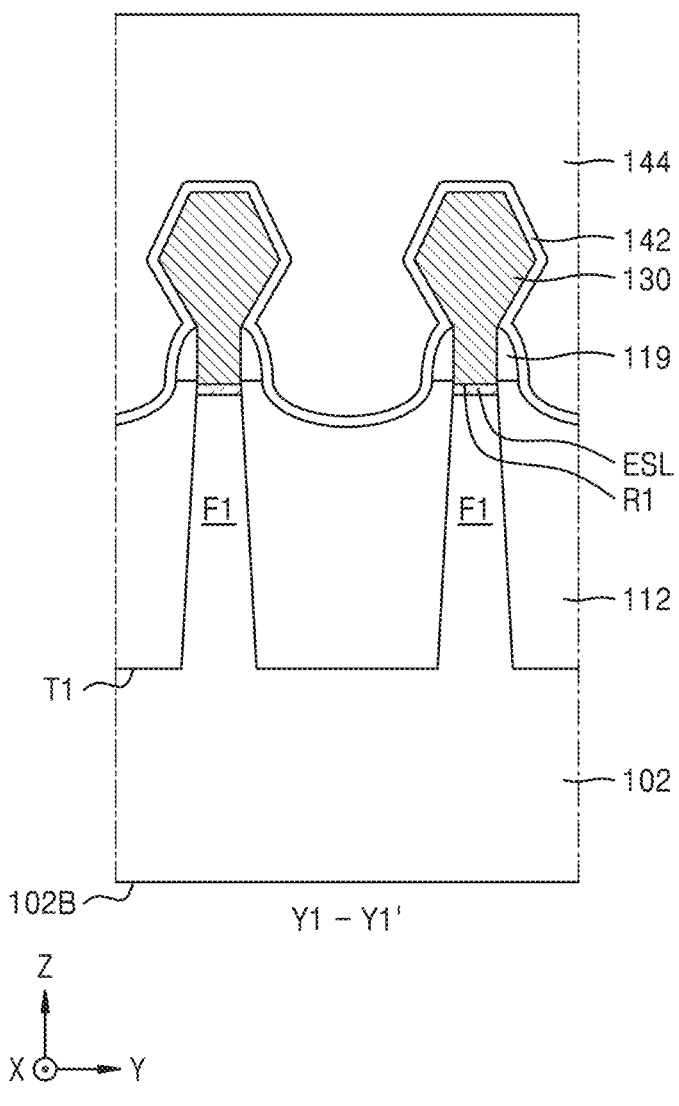
Figure 14C:
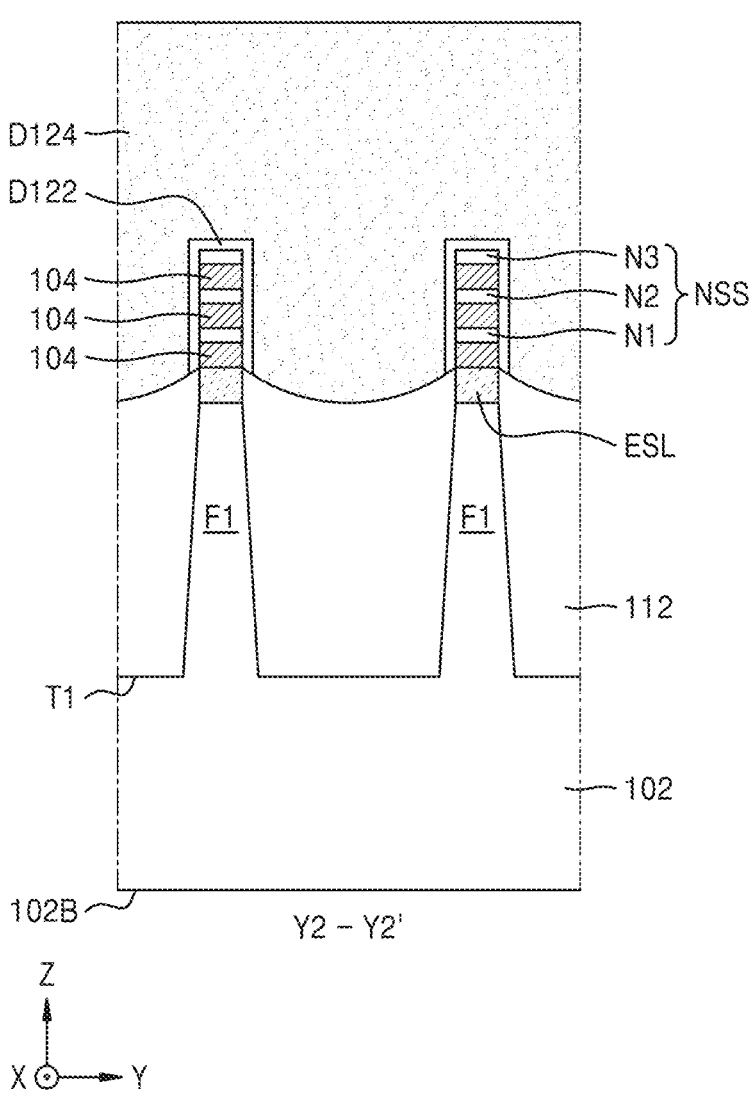

Referring to FIGS. 14A, 14B, and 14C, a plurality of source/drain regions 130 may be formed to fill the plurality of recesses R1 in the resultant structure of FIGS. 13A, 13B, and 13C. To form the plurality of source/drain regions 130, a semiconductor material may be epitaxially grown from a sidewall of each of the first to third nanosheets N1, N2, and N3 included in the nanosheet stack NSS exposed in the plurality of recesses R1. The plurality of source/drain regions 130 may extend above the nanosheet stack NSS to overlap the dummy gate structure DGS in the first lateral direction (X direction).

Thereafter, an insulating liner 142 may be formed to cover the resultant structure in which the plurality of source/drain regions 130 are formed, and an inter-gate dielectric film 144 may be formed on the insulating liner 142. Each of the insulating liner 142 and the inter-gate dielectric film 144 may be partially etched to expose top surfaces of a plurality of capping layers D126. Afterwards, the plurality of capping layers D126 may be removed to expose the dummy gate layer D124. The insulating liner 142 and the inter-gate dielectric film 144 may be partially removed such that a top surface of the inter-gate dielectric film 144 becomes at the same or substantially the same level as the top surface of the dummy gate layer D124.

Figure 15A:
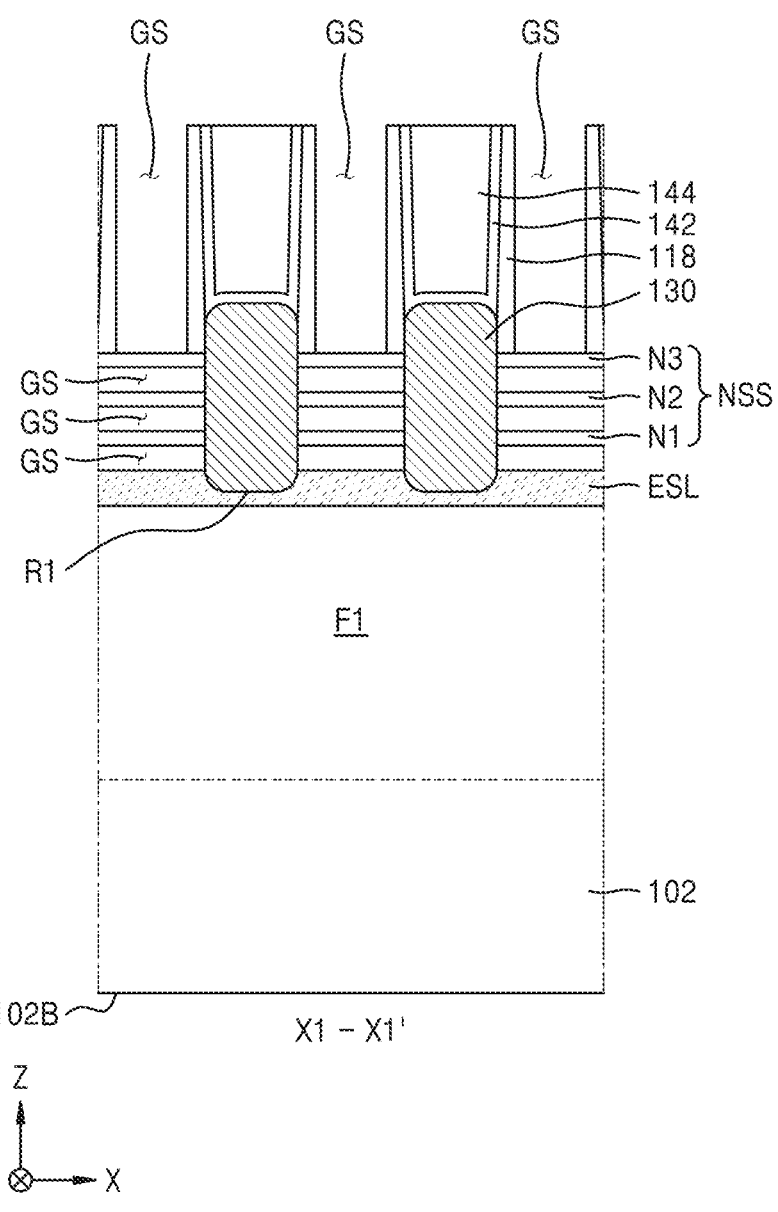
Figure 15B:
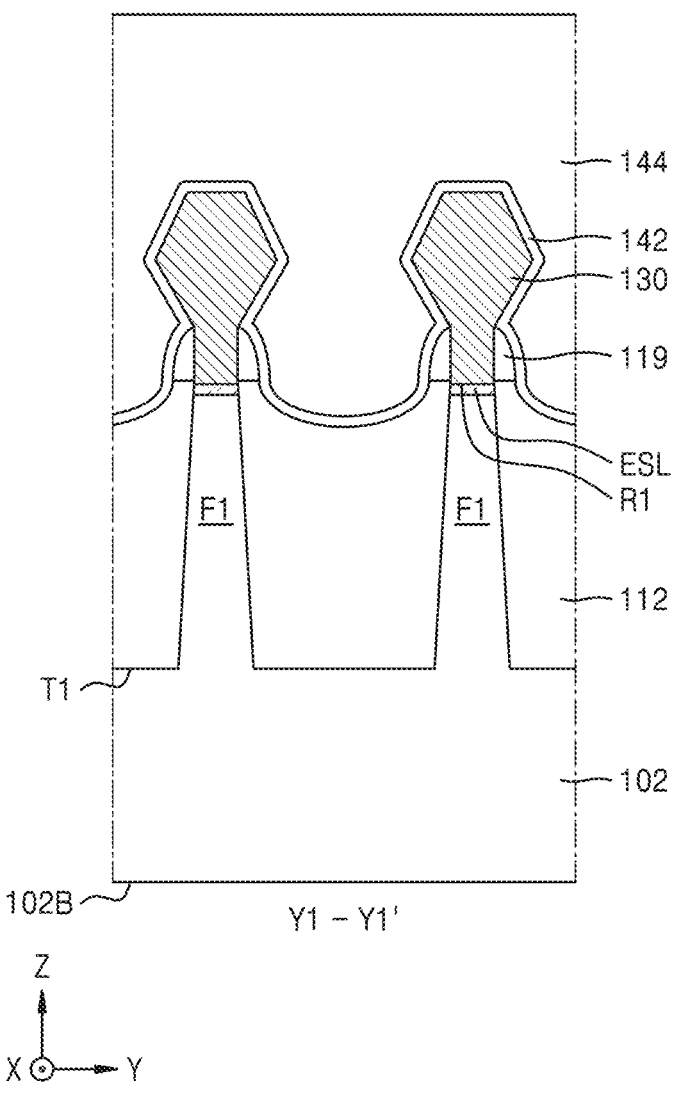
Figure 15C:
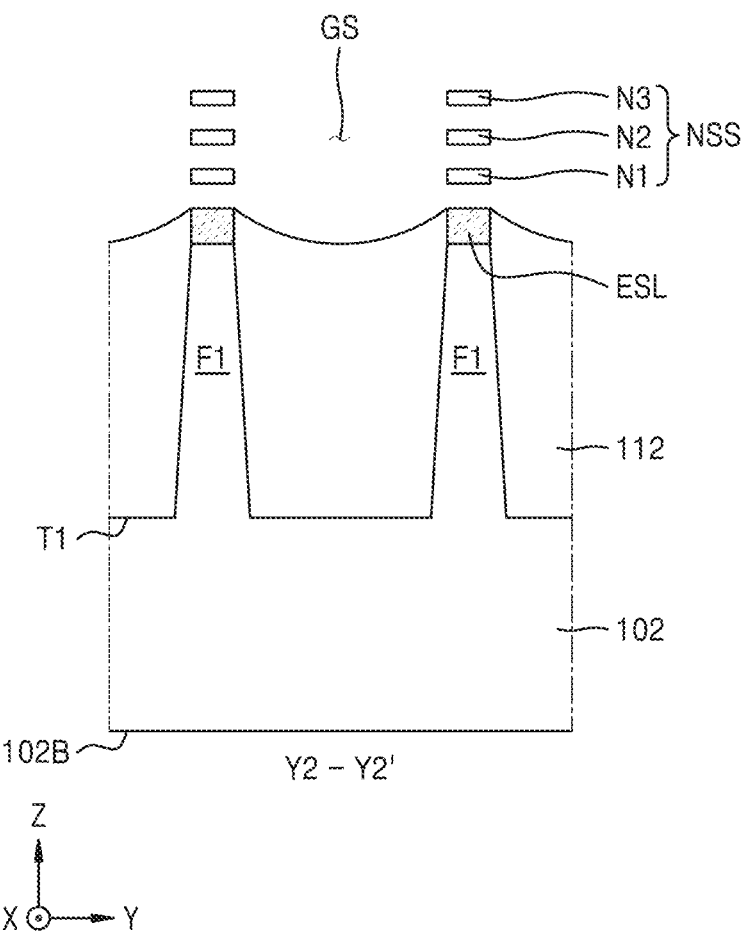

Referring to FIGS. 15A, 15B, and 15C, the dummy gate layer D124 and the oxide film D122 located thereunder may be removed from the resultant structure of FIGS. 14A, 14B, and 14C to prepare a gate space GS, and the plurality of nanosheet stacks NSS may be exposed through the gate space GS. Thereafter, the plurality of sacrificial semiconductor layers 104 remaining on the fin-type active region F1 may be removed through the gate space GS. Thus, the gate space GS may extend to respective spaces between the first nanosheet N1, the second nanosheet N2, and the third nanosheet N3 and a space between the first nanosheet N1 and the etch stop layer ESL. In some embodiments, to selectively remove the plurality of sacrificial semiconductor layers 104, differences in etch selectivity between the first to third nanosheets N1, N2, and N3 and the plurality of sacrificial semiconductor layers 104 may be used.

A liquid or gaseous etchant may be used to selectively remove the plurality of sacrificial semiconductor layers 104. In some embodiments, to selectively remove the plurality of sacrificial semiconductor layers 104, a $CH_3COOH$-based etchant, for example, an etchant including a mixture of $CH_3COOH$, $HNO_3$, and HF or an etchant including a mixture of $CH_3COOH$, $H_2O_2$, and HF may be used, without being limited thereto.

Figure 16A:
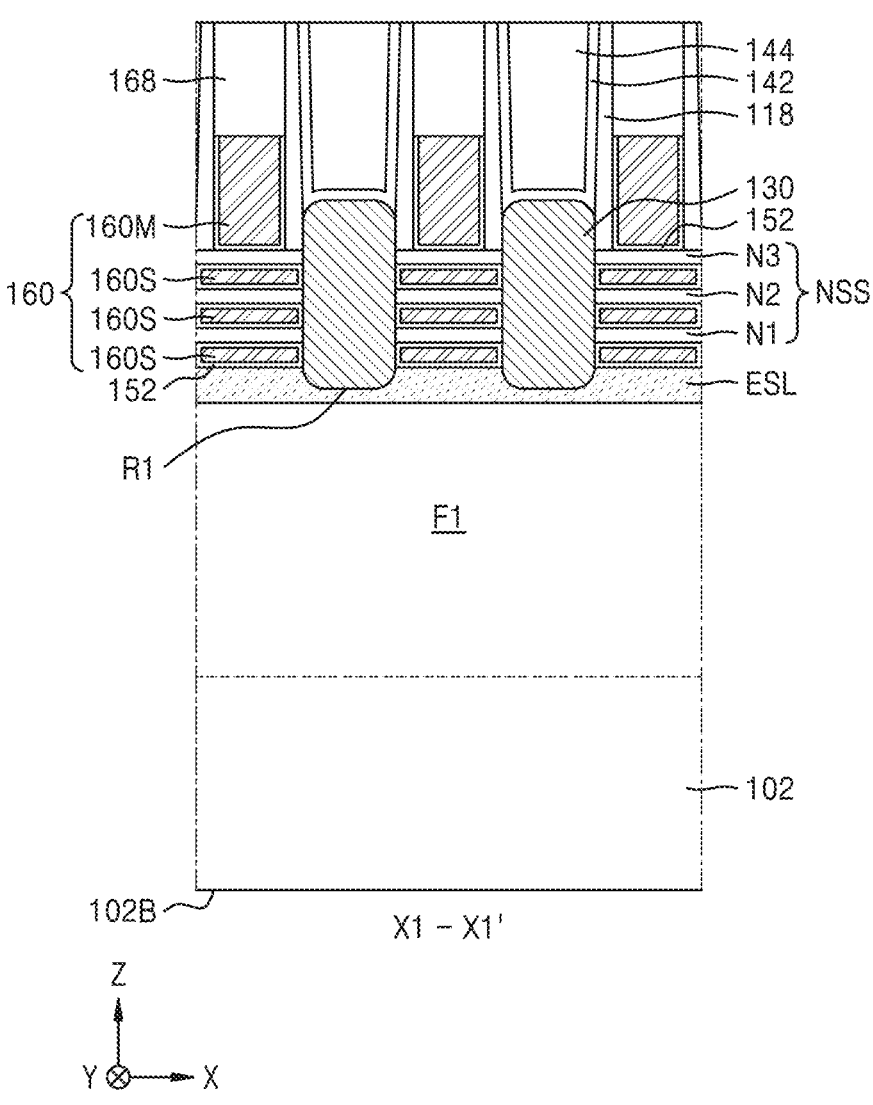
Figure 16B:
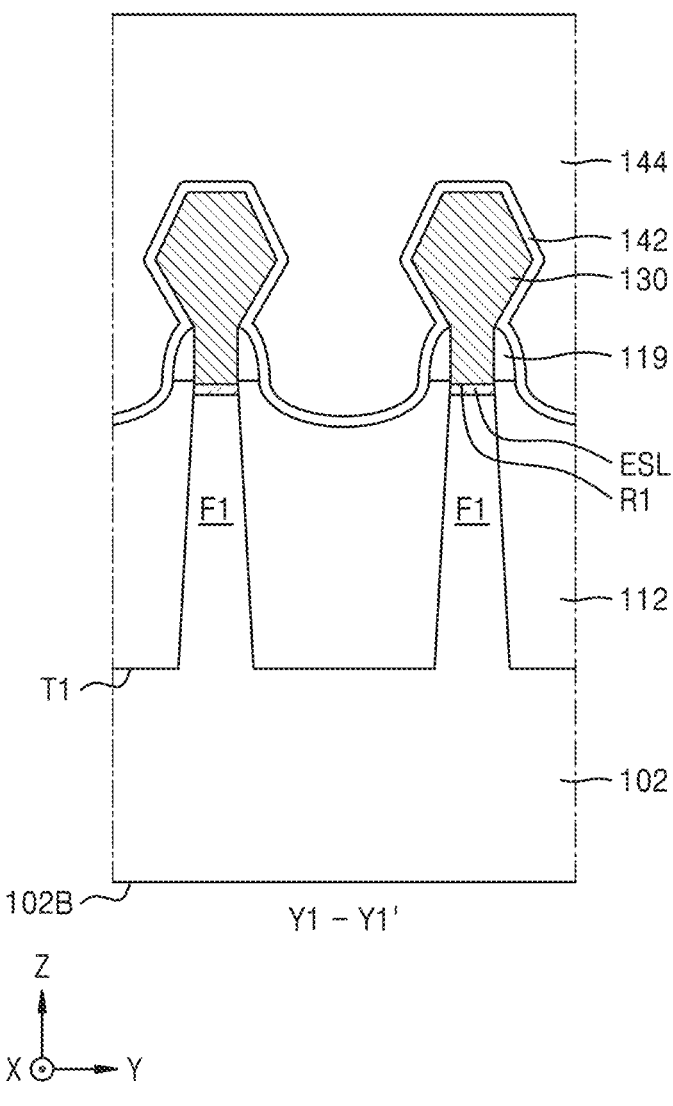
Figure 16C:
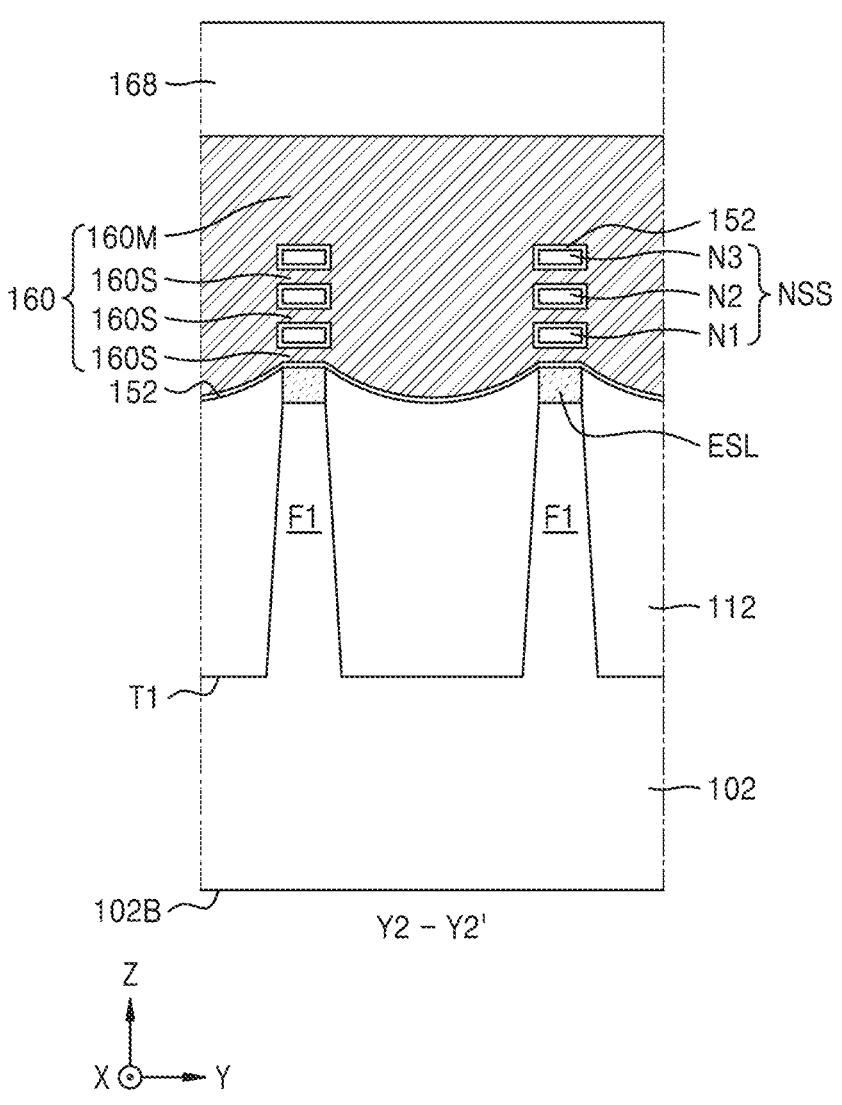

Referring to FIGS. 16A, 16B, and 16C, in the resultant structure of FIGS. 15A, 15B, and 15C, a gate dielectric film 152 may be formed to cover respective exposed surfaces of the first to third nanosheets N1, N2, and N3 and the device isolation film 112. The gate dielectric film 152 may be formed using an ALD process.

Afterwards, a gate line 160 may be formed to fill a portion of the gate space (refer to GS in FIGS. 15A and 15C) on the gate dielectric film 152. A capping insulating pattern 168 may be formed to cover a top surface of each of the gate line 160 and the gate dielectric film 152 in the gate space GS.

Figure 17A:
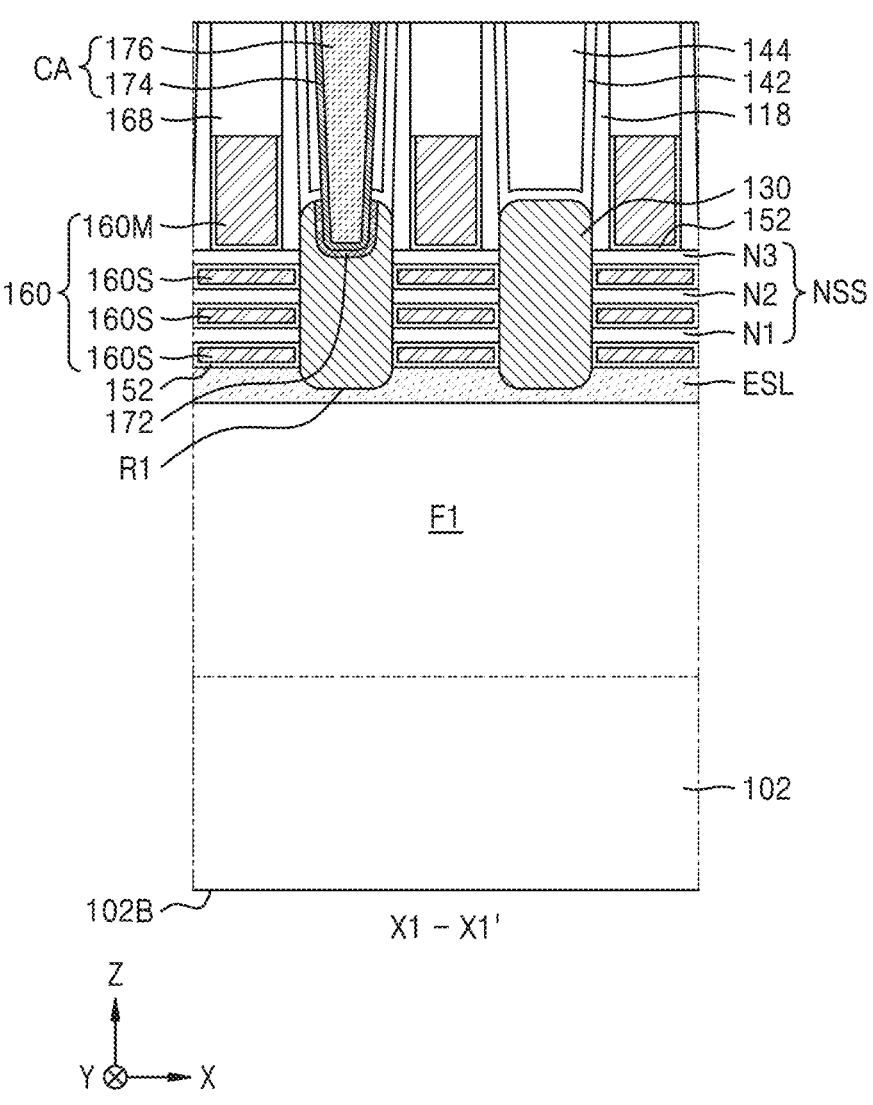
Figure 17B:
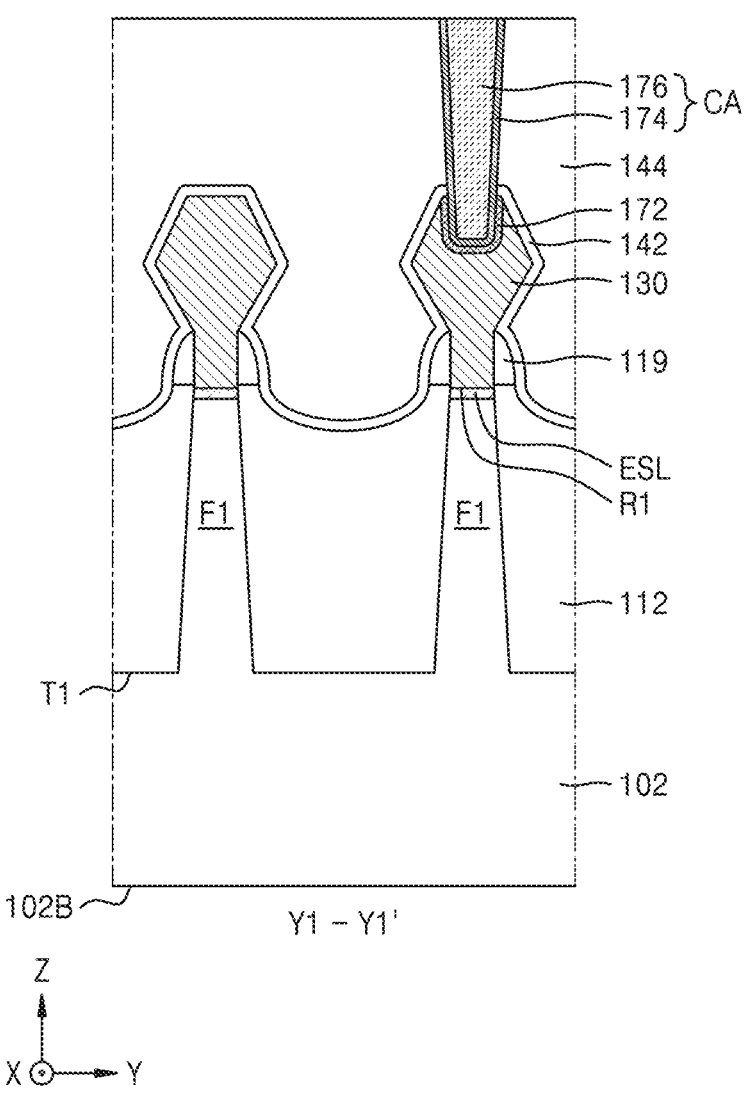

Referring to FIGS. 17A and 17B, in the resultant structure of FIGS. 16A, 16B, and 16C, a plurality of source/drain contact holes exposing the source/drain regions 130 may be formed to pass through the inter-gate dielectric film 144 and the insulating liner 142. Thereafter, a portion of the source/drain region 130 may be removed by using an anisotropic etching process through the plurality of source/drain contact holes, and thus, the plurality of source/drain contact holes may extend longer toward the substrate 102. Thereafter, a metal silicide film 172 may be formed on the source/drain region 130, which is exposed in each of the plurality of source/drain contact holes. In some embodiments, the formation of the metal silicide film 172 may include forming a metal liner (not shown) to conformally cover an exposed surface of the source/drain region 130 and annealing the metal liner to induce a reaction of the source/drain region 130 with a metal included in the metal liner. After the metal silicide film 172 is formed, the remaining portion of the metal liner may be removed. A portion of the source/drain region 130 may be consumed during the formation of the metal silicide film 172. In some embodiments, when the metal silicide film 172 includes a titanium silicide film, the metal liner may include a titanium (Ti) film.

Subsequently, a front side source/drain contact CA including a conductive barrier pattern 174 and a contact plug 176 may be formed inside each of the plurality of source/drain contact holes.

Figure 18A:
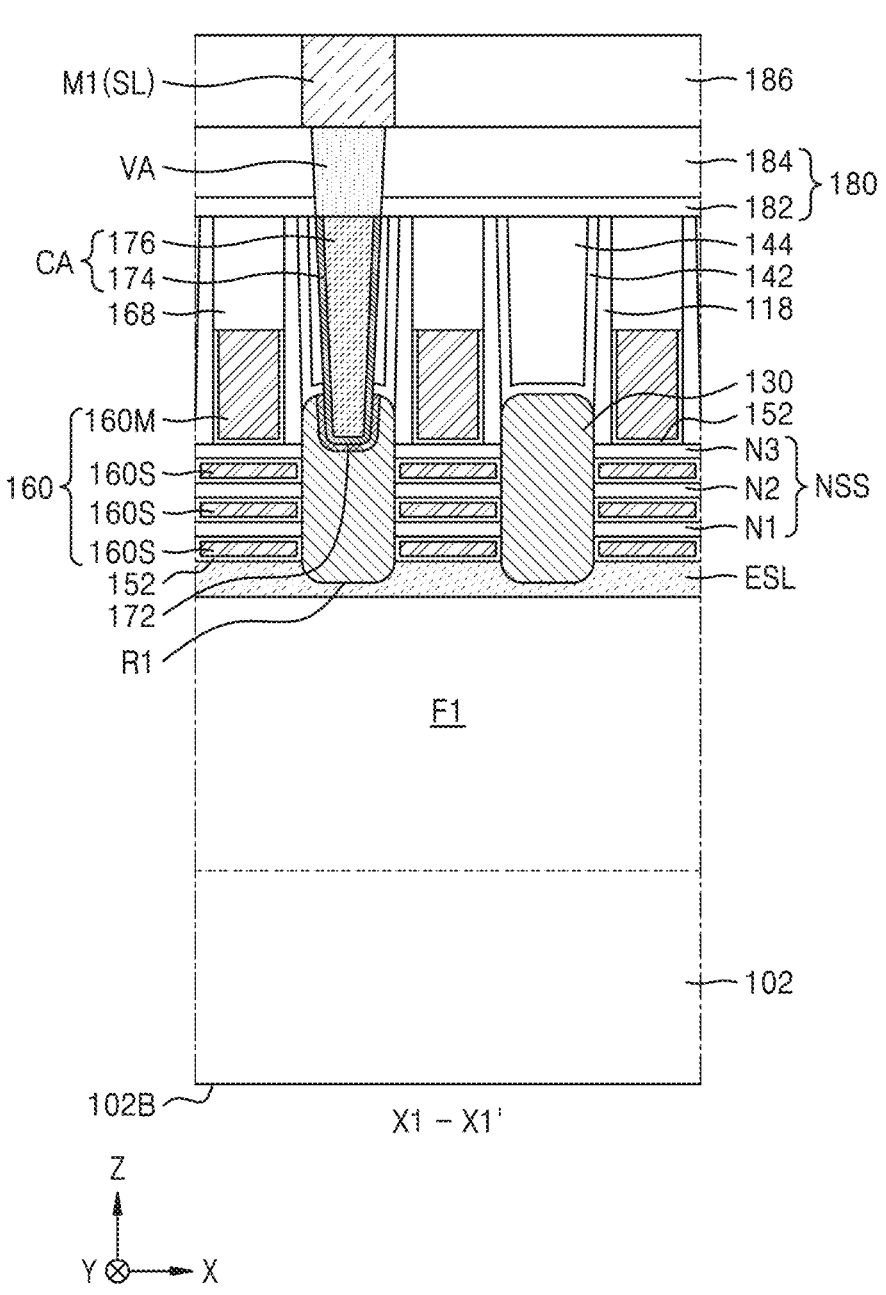
Figure 18B:
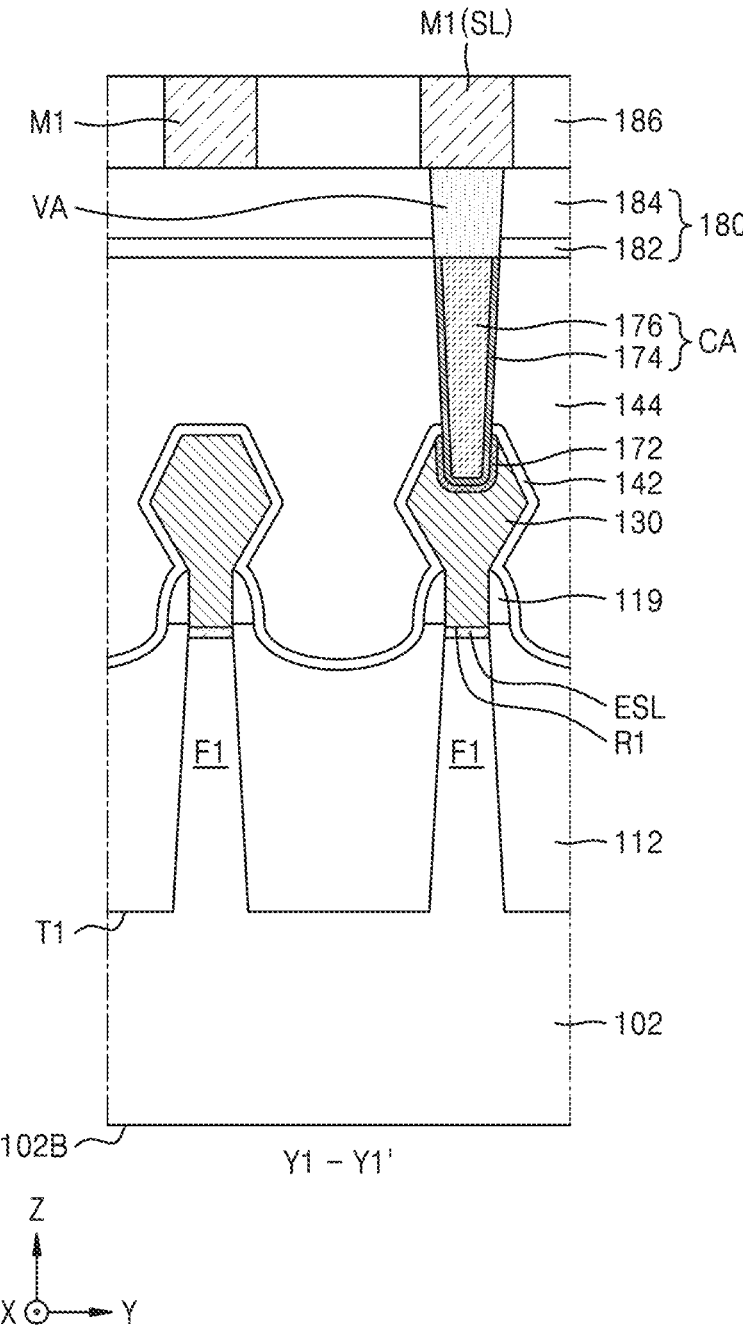

Referring to FIGS. 18A and 18B, in the resultant structure of FIGS. 17A and 17B, an etch stop film 182 and an upper insulating film 184 may be sequentially formed to cover a top surface of each of the inter-gate dielectric film 144, a plurality of front side source/drain contacts CA, and a plurality of capping insulating patterns 168. Thus, an upper insulating structure 180 may be formed.

Thereafter, a plurality of source/drain via contacts VA may be formed to pass through the upper insulating structure 180 in a vertical direction (Z direction) and connected to the plurality of front side source/drain contacts CA. Also, a gate contact (refer to CB in FIG. 3C) may be formed to pass through the upper insulating structure 180 and the capping insulating pattern 168 in the vertical direction (Z direction) and connected to the gate line 160. The source/drain via contact VA and the gate contact CB may be formed simultaneously or by using separate processes. The order of formation of the source/drain via contact VA and the gate contact CB is not specifically limited.

Afterwards, an interlayer insulating film 186 may be formed to cover the upper insulating structure 180, and a plurality of upper wiring layers M1 may be formed to pass through the interlayer insulating film 186. The plurality of upper wiring layers M1 may include an upper wiring layer M1 connected to the source/drain via contact VA and an upper wiring layer M1 connected to the gate contact CB.

Figure 19A:
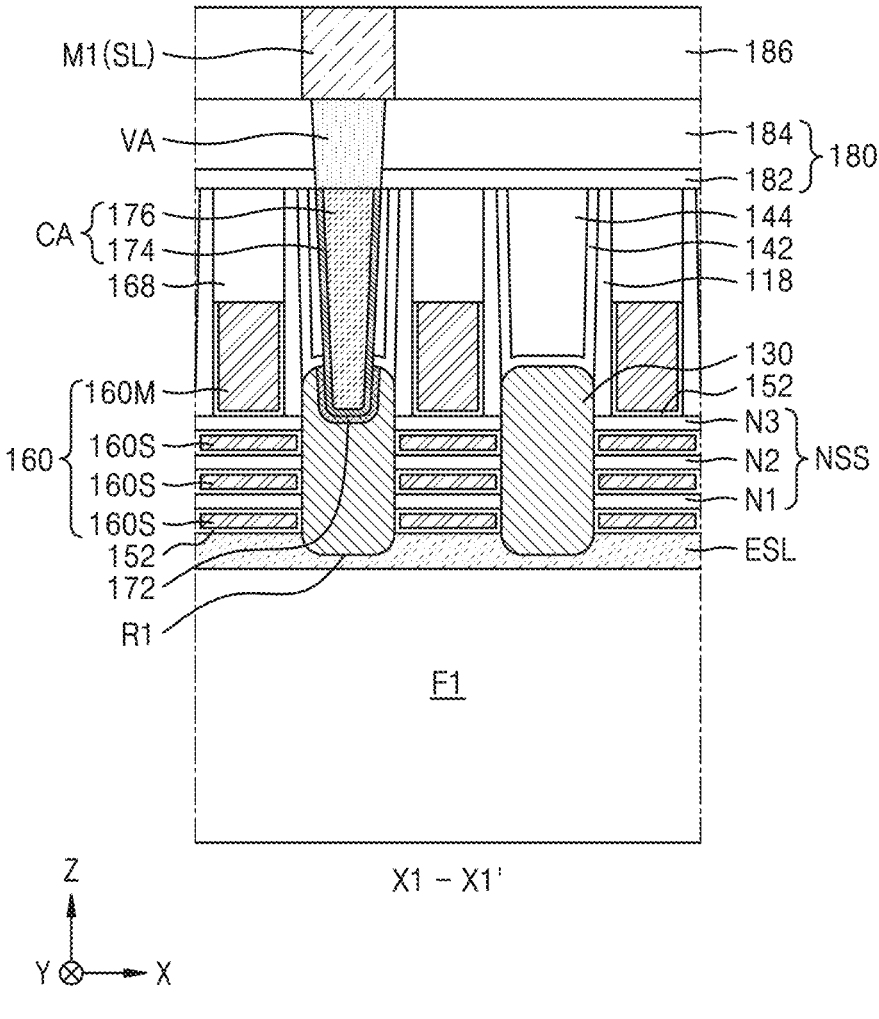
Figure 19B:
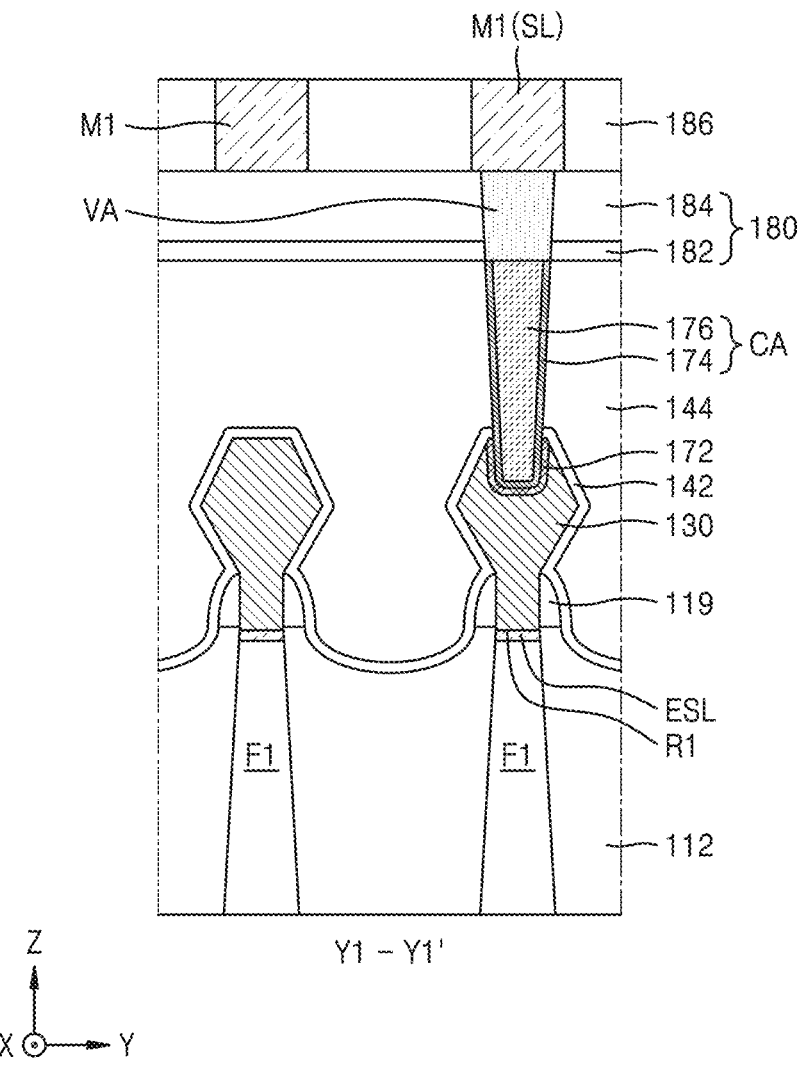

Referring to FIGS. 19A and 19B, in the resultant structure of FIGS. 18A and 18B, the substrate 102 may be removed from the back side surface 102B of the substrate 102, and thus, a bottom surface of each of the plurality of fin-type active regions F1 and a bottom surface of the device isolation film 112 may be exposed. The substrate 102 may be removed by using at least one selected from a mechanical grinding process, a chemical mechanical polishing (CMP) process, a wet etching process, and a combination thereof.

Figure 20A:
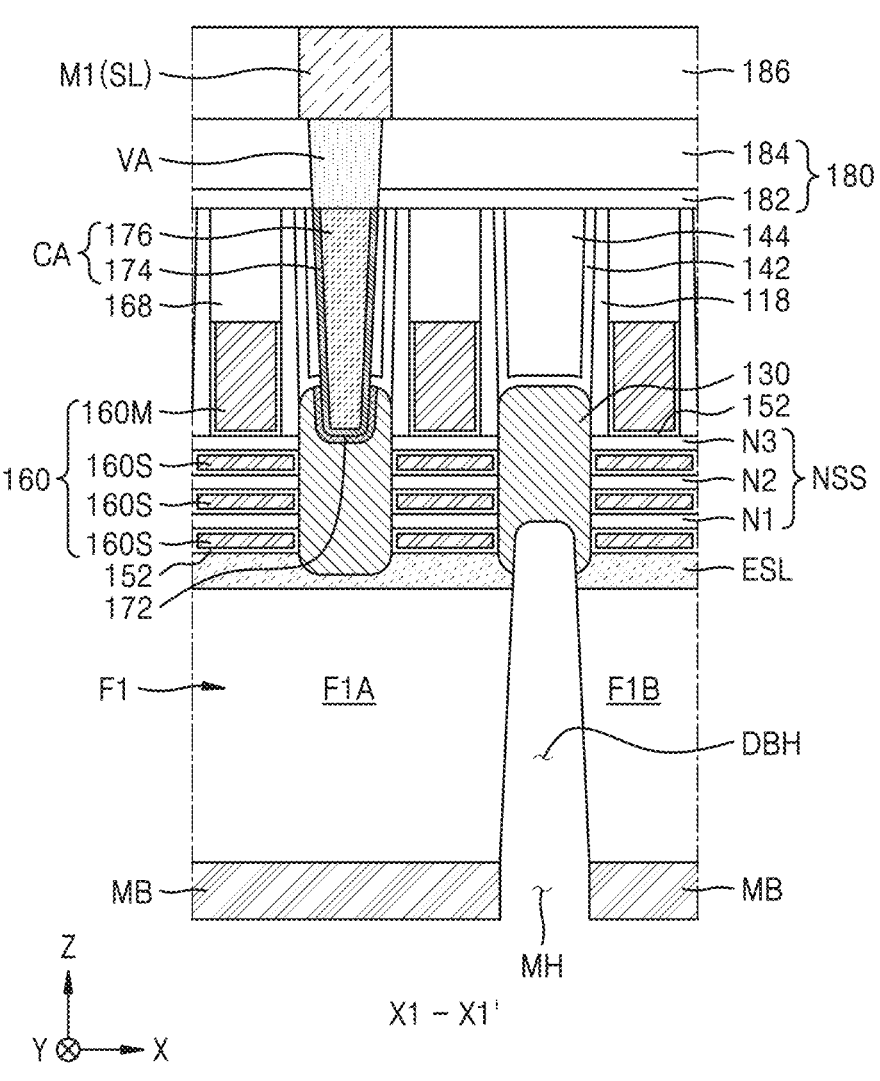
Figure 20B:
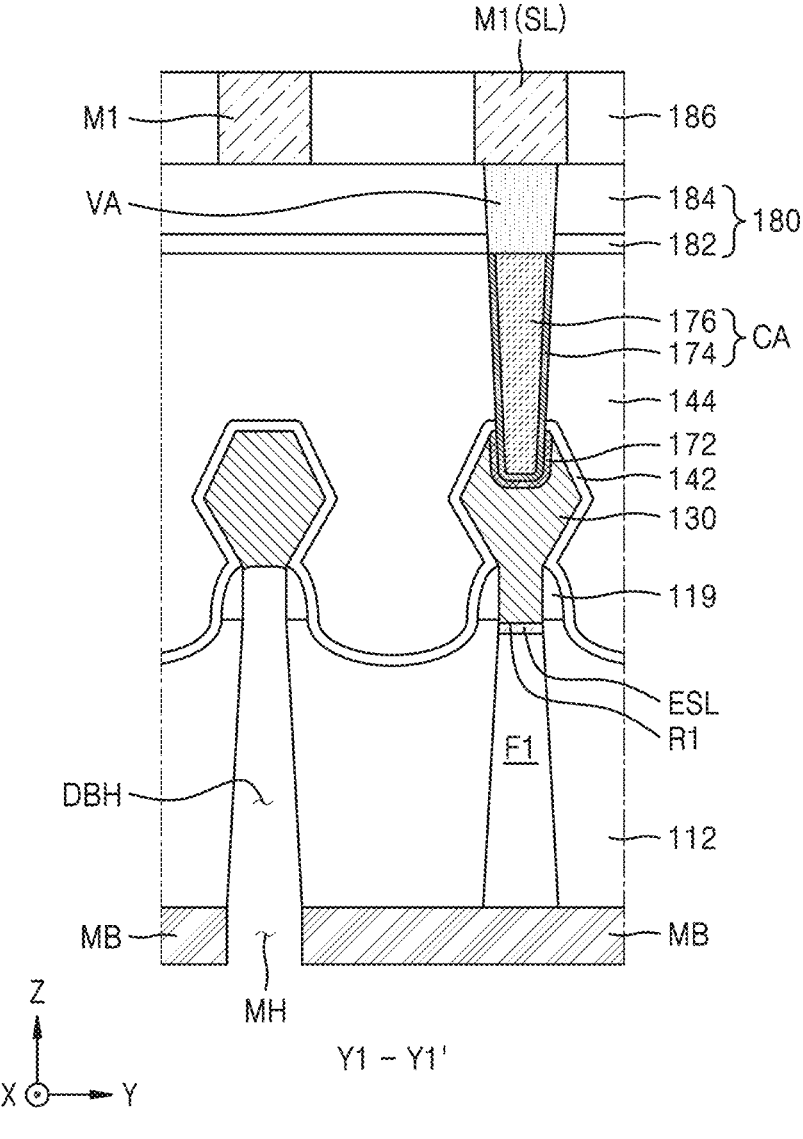

Referring to FIGS. 20A and 20B, in the resultant structure of FIGS. 19A and 19B, a hard mask pattern MB may be formed on the exposed bottom surface of each of the plurality of fin-type active regions F1 and the device isolation film 112. The hard mask pattern MB may have an opening MH exposing a local region to be removed, of each of the plurality of fin-type active regions F1. Thereafter, the local region of the fin-type active region F1, which is exposed through the opening MH, may be anisotropically etched by using the hard mask pattern MB as an etch mask and using an etch stop layer ESL as an etch stop point, and thus, a contact space DBH exposing the etch stop layer ESL may be formed. The hard mask pattern MB may include a material having an etch selectivity with respect to a constituent material of each of the fin-type active region F1 and the device isolation film 112. For example, the hard mask pattern MB may include a silicon nitride film, a carbon (C)-containing film, or a combination thereof, without being limited thereto.

Afterwards, the etch stop layer ESL, which is exposed through the contact space DBH, may be etched to expose the source/drain region 130, and a partial region of the source/drain region 130, which is exposed through the contact space DBH, may be removed by using an anisotropic etching process. Thus, the contact space DBH may extend further into the source/drain region 130. In some embodiments, the anisotropic etching process of forming the contact space DBH may be performed by using plasma.

While the local region of the fin-type active region F1 is being anisotropically etched to form the contact space DBH, the anisotropic etching process may be performed in a self-aligned manner by using the device isolation film 112. Accordingly, the contact space DBH may be easily (e.g., successfully) aligned at a desired position without applying strict design rules to the formation of the contact space DBH.

Figure 21A:
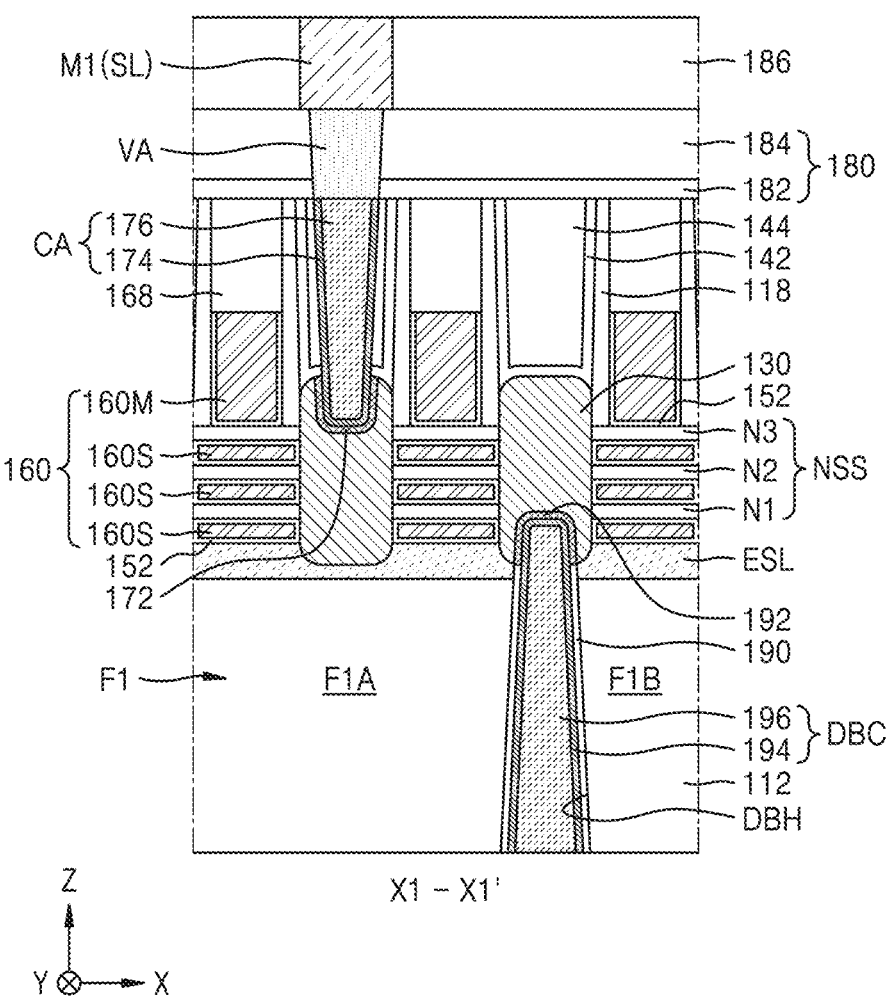
Figure 21B:
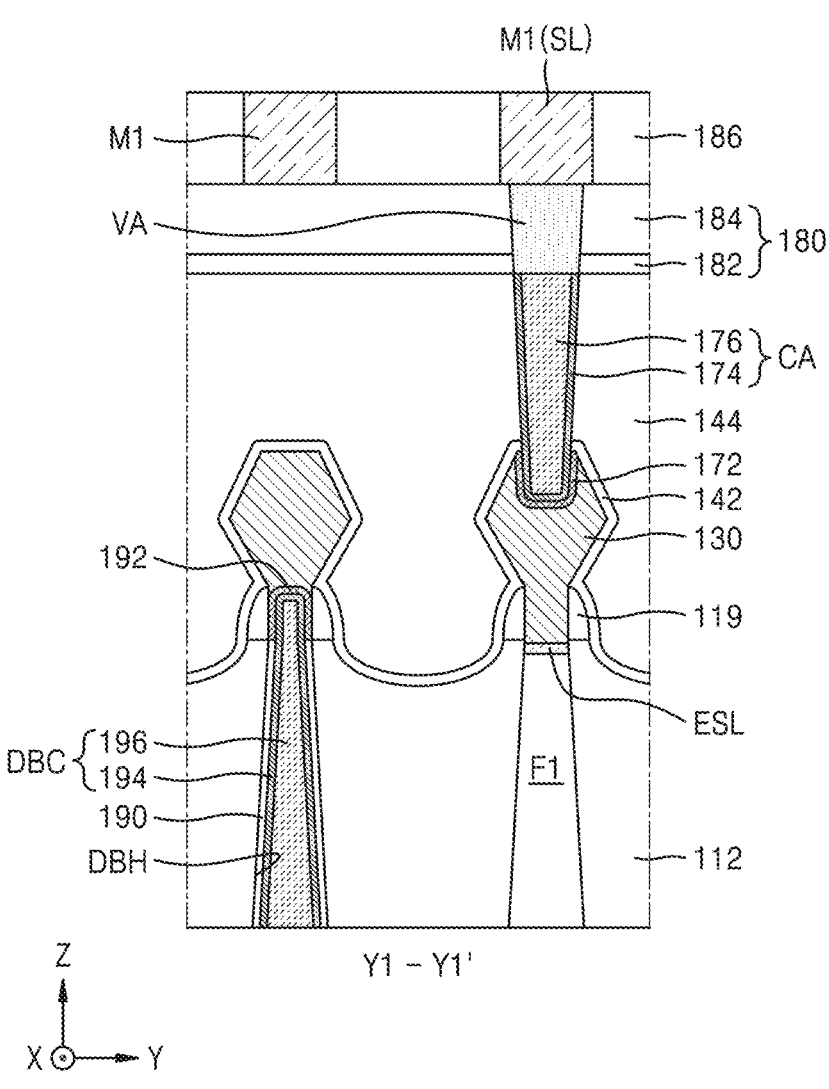

Referring to FIGS. 21A and 21B, in the resultant structure of FIGS. 20A and 20B, a metal silicide film 192 may be formed on a surface of the source/drain region 130, which is exposed through the contact space DBH. Insulating spacers 190 may be formed to cover surfaces exposed at inner sidewalls of the contact space DBH, particularly, sidewalls facing the contact space DBH, of the first and second fin portions F1A and F1B that are portions of the fin-type active region F1. A back side source/drain contact DBC may be formed to fill the contact space DBH on the metal silicide film 192 and the insulating spacer 190. The back side source/drain contact DBC may include a conductive barrier pattern 194 and a contact plug 196. To form the metal silicide film 192 and the back side source/drain contact DBC, processes similar to the processes of forming the metal silicide film 172 and the front side source/drain contact CA, which have been described with reference to FIGS. 17A and 17B, may be performed.

Thereafter, in the resultant structure of FIGS. 21A and 21B, a back side insulating film 109 may be formed to cover an exposed bottom surface of each of the plurality of fin-type active regions F1 and the device isolation film 112, a back side power rail BPW may be formed to pass through the back side insulating film 109 in the vertical direction (Z direction) and contact one end of the back side source/drain contact DBC. Thus, the IC device 100 described with reference to FIGS. 2 and 3A to 3D may be manufactured.

Figure 22:
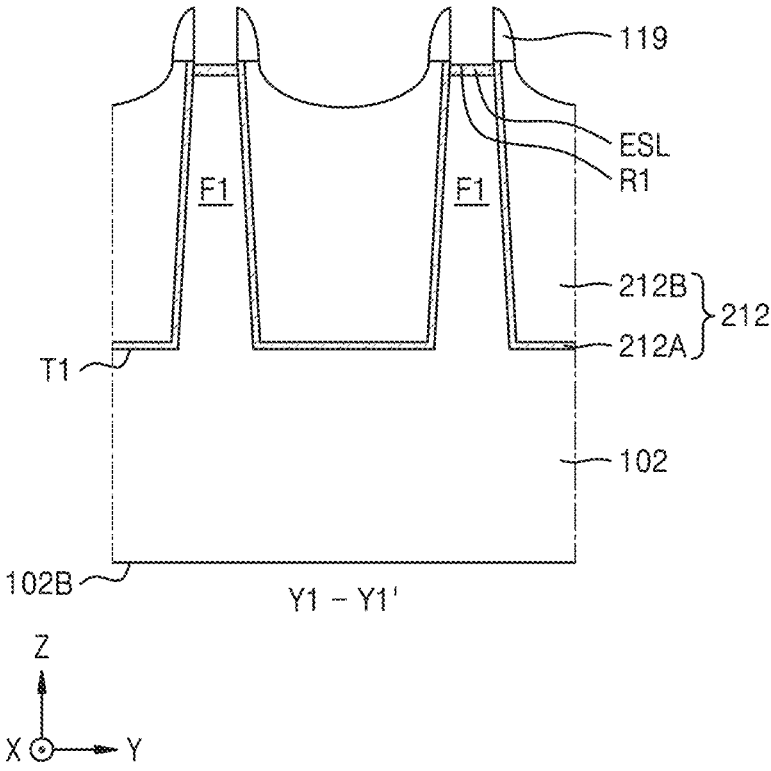
FIG. 22 is a cross-sectional view of a method of manufacturing an IC device, according to embodiments.

FIG. 22 is a cross-sectional view of a method of manufacturing an IC device, according to embodiments. FIG. 22 illustrates a cross-sectional configuration of a portion corresponding to the cross-section taken along line Y1-Y1' of FIG. 2, in an intermediate process. A method of manufacturing the IC device 200 described with reference to FIGS. 4A to 4C will now be described with reference to FIG. 22. In FIG. 22, the same reference numerals are used to denote the same elements as in FIGS. 2 to 4C, and repeated descriptions thereof are omitted.

Referring to FIG. 22, the processes described with reference to FIGS. 11A to 13C may be performed. However, in some embodiments, a device isolation film 212 may be formed instead of the device isolation film 112. The formation of the device isolation film 212 may include forming an insulating liner 212A to conformally cover a substrate 102 and an exposed surface of each of a plurality of fin-type active regions F1 inside a trench region T1 and filling the trench region T1 remaining on the insulating liner 212A by a buried insulating film 212B. Subsequently, the processes described with reference to FIGS. 14A to 21B may be performed, and thus, the IC device 200 described with reference to FIGS. 4A to 4C may be manufactured.

FIGS. 23A to 25B are cross-sectional views of a process sequence of a method of manufacturing an IC device, according to embodiments. More specifically, FIGS. 23A, 24A, . . . , and 25B are cross-sectional views of an example cross-sectional structure of a portion corresponding to the cross-section taken along line X1-X1' of FIG. 2, according to a process sequence. FIGS. 23B, 24B, . . . , and 25B are cross-sectional views of an example cross-sectional structure of a portion corresponding to the cross-section taken along line Y1-Y1' of FIG. 2, according to a process sequence. A method of manufacturing the IC device 300 described with reference to FIGS. 5A and 5B will now be described with reference to FIGS. 23A to 25B. In FIGS. 23A to 25B, the same reference numerals are used to denote the same elements as in FIGS. 2 to 5B, and repeated descriptions thereof are omitted.

Figure 23A:
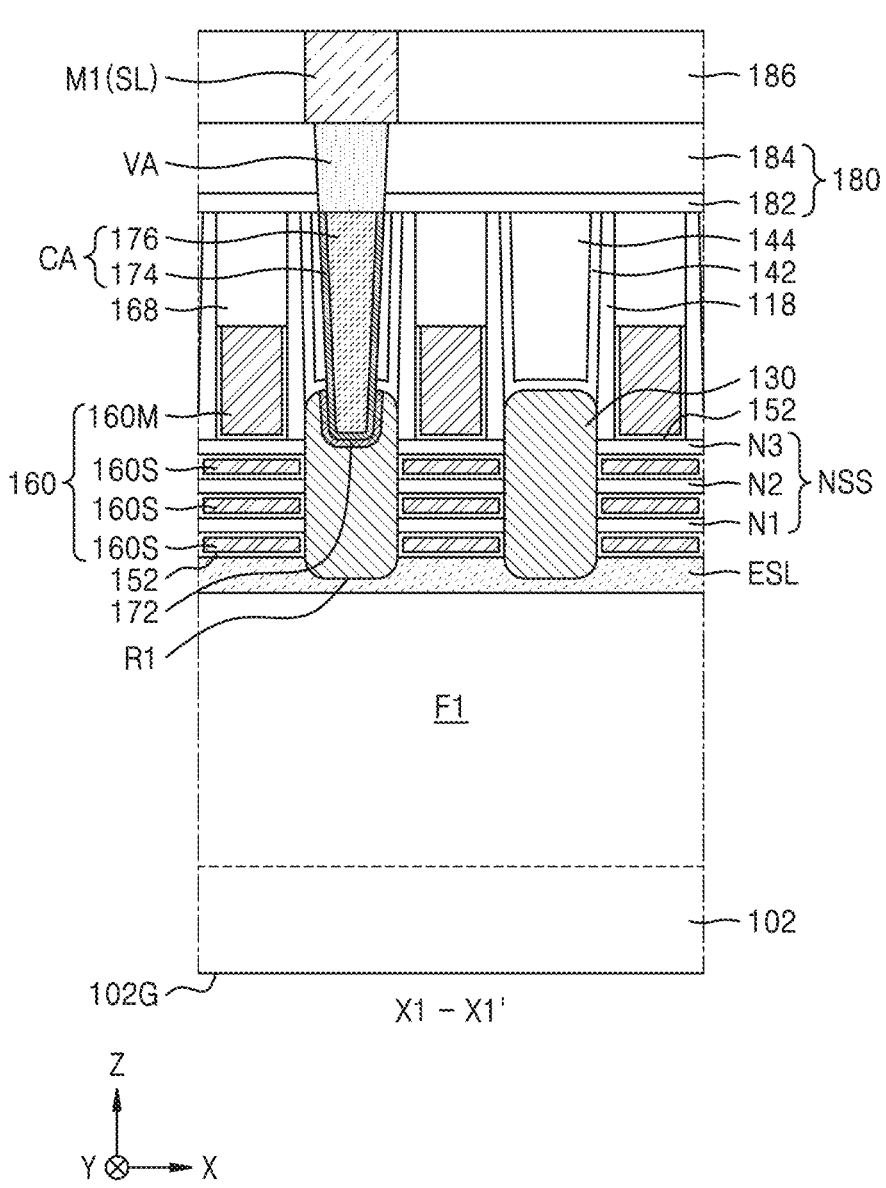
FIGS. 23A to 25B are cross-sectional views of a process sequence of a method of manufacturing an IC device, according to embodiments, wherein FIGS. 23A, 24A, . . . , and 25B are cross-sectional views of an example cross-sectional structure of a portion corresponding to the cross-section taken along line X1-X1' of FIG. 2, according to a process sequence, and FIGS. 23B, 24B, . . . , and 25B are cross-sectional views of an example cross-sectional structure of a portion corresponding to the cross-section taken along line Y1-Y1' of FIG. 2, according to a process sequence.
Figure 23B:
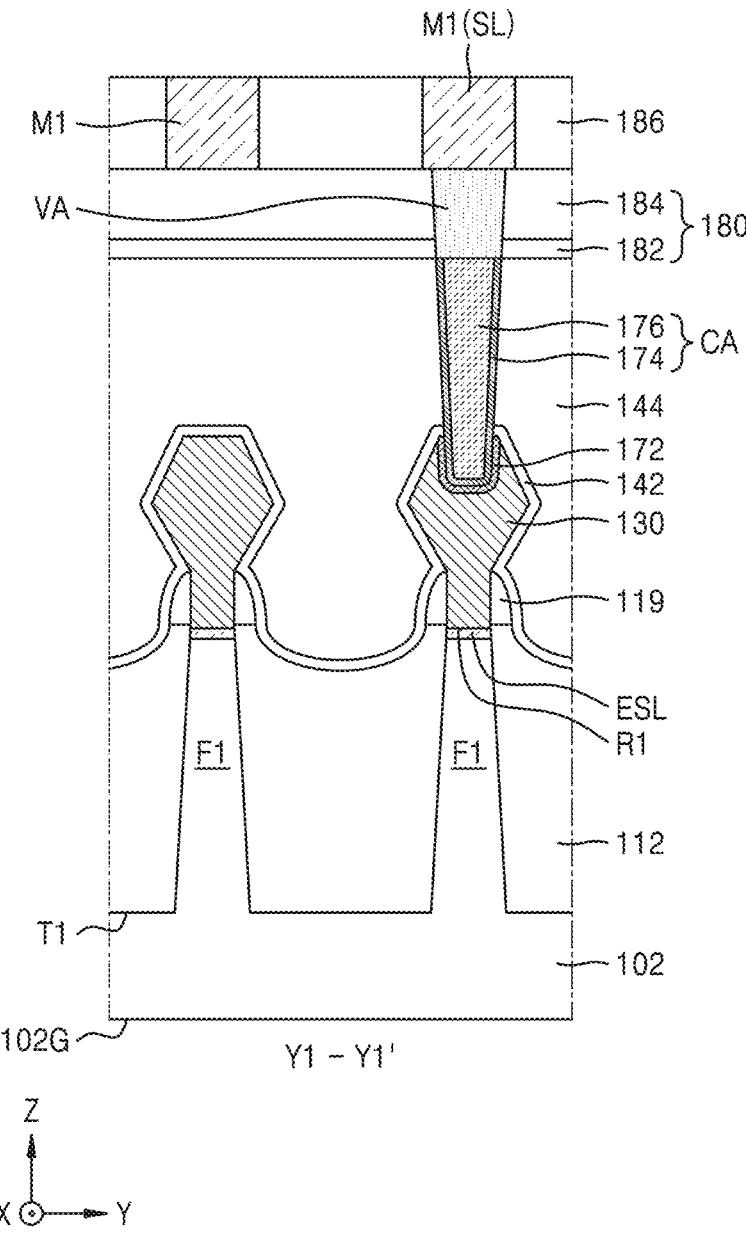

Referring to FIGS. 23A and 23B, the processes described with reference to FIGS. 11A to 18B may be performed. Thereafter, in the resultant structure of FIGS. 18A and 18B, a portion of the substrate 102 may be removed from a back side surface 102B of a substrate 102, and thus, a thickness of the substrate 102 may be reduced. To this end, at least one selected from a mechanical grinding process, a CMP process, a wet etching process, and a combination thereof may be used. After a portion of the substrate 102 is removed, a bottom surface 102G of the substrate 102 having the reduced thickness may be exposed.

Figure 24A:
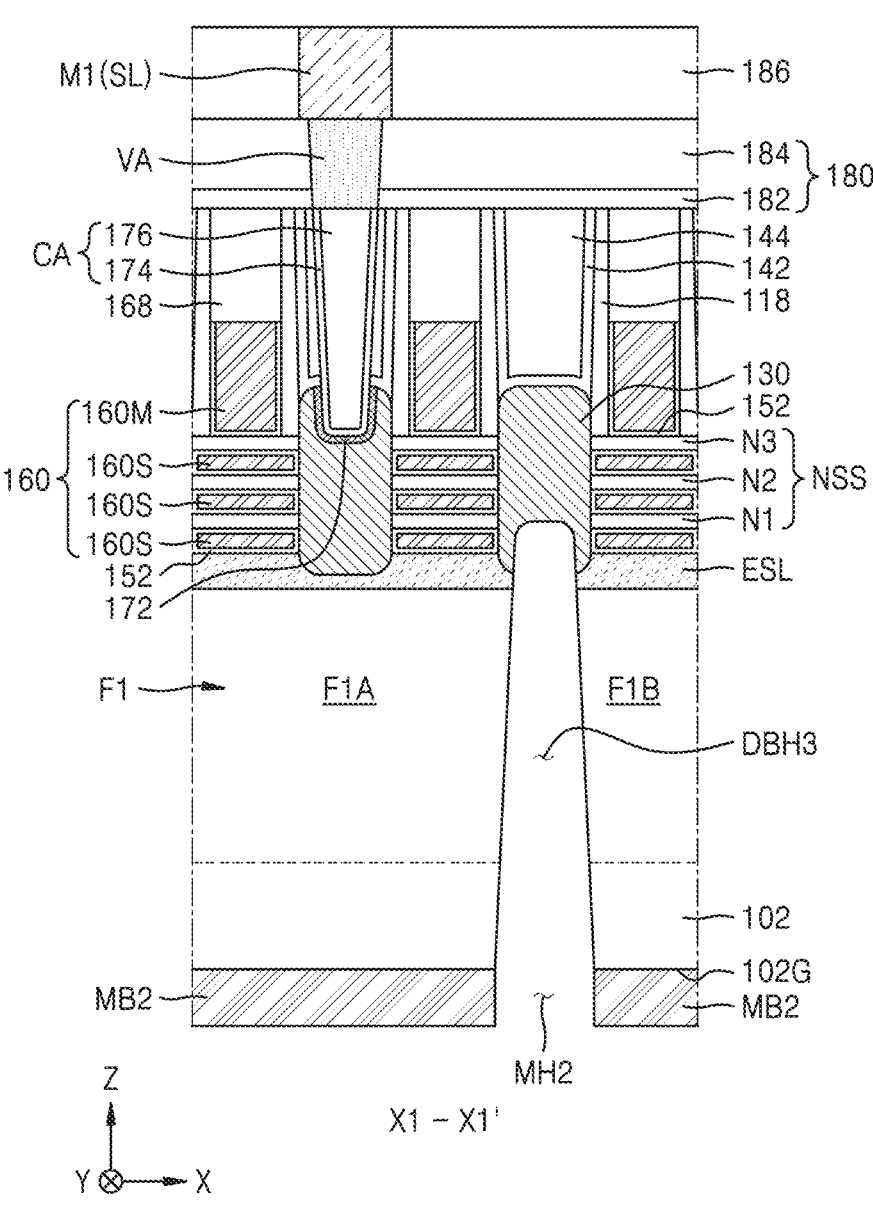
Figure 24B:
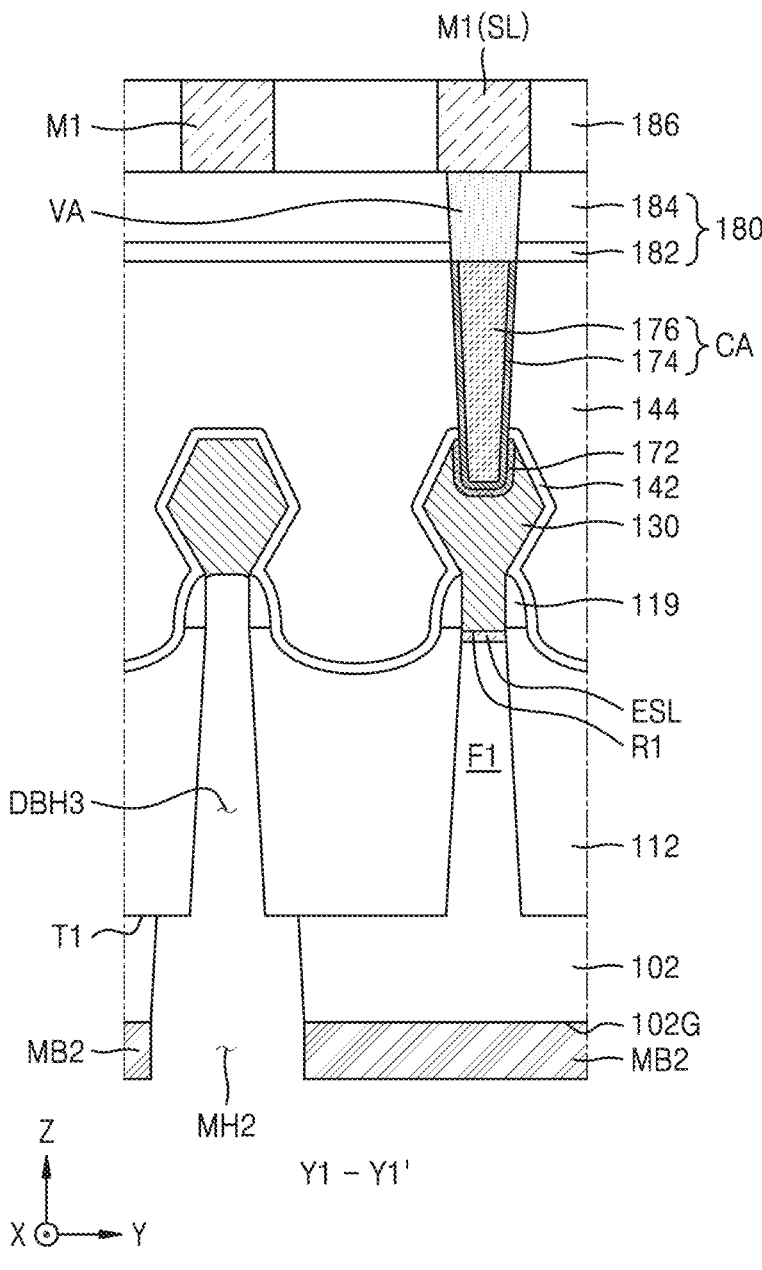

Referring to FIGS. 24A and 24B, in the resultant structure of FIGS. 23A and 23B, a hard mask pattern MB2 having an opening MH2 may be formed on the bottom surface 102G of the substrate 102, which is exposed. The opening MH2 may be at a position aligned with a local region to be removed, of the fin-type active region F1, in a vertical direction (Z direction). A detailed configuration of the hard mask pattern MB2 may be substantially the same as that of the hard mask pattern MB described with reference to FIGS. 20A and 20B. However, in a second lateral direction (Y direction), a width of the opening MH2 of the hard mask pattern MB2 may be greater than a width of the local region to be removed, of the fin-type active region F1.

Thereafter, the substrate 102, which is exposed through the opening MH2, may be anisotropically etched by using the hard mask pattern MB2 as an etch mask and using the etch stop layer ESL as an etch stop point. The local region of the fin-type active region F1, which is subsequently exposed, may be anisotropically etched to form a contact space DBH3 exposing the etch stop layer ESL. Afterwards, the etch stop layer ESL, which is exposed through the contact space DBH3, may be etched to expose a source/drain region 130, and a partial region of the source/drain region 130, which is exposed through the contact space DBH3, may be removed by using an anisotropic etching process, and thus, the contact space DBH3 may extend further into the source/drain region 130. In some embodiments, the atmosphere etching process of forming the contact space DBH3 may be performed by using plasma.

While the local region of the fin-type active region F1 is being anisotropically etched to form the contact space DBH3, the anisotropic etching process may be performed in a self-aligned manner by using a device isolation film 112. Accordingly, the contact space DBH3 may be easily (e.g., successfully) aligned at a desired position without applying strict design rules to the formation of the contact space DBH3.

Figure 25A:
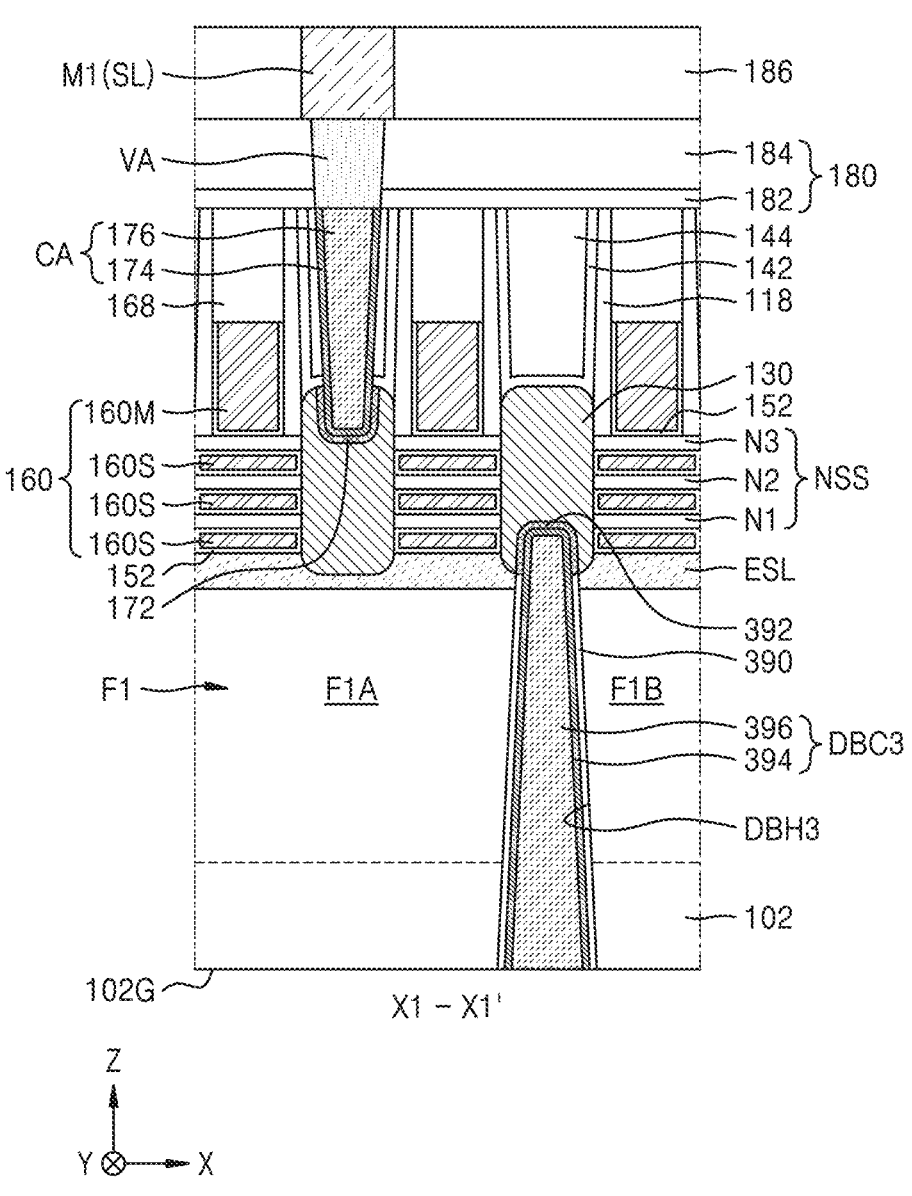
Figure 25B:
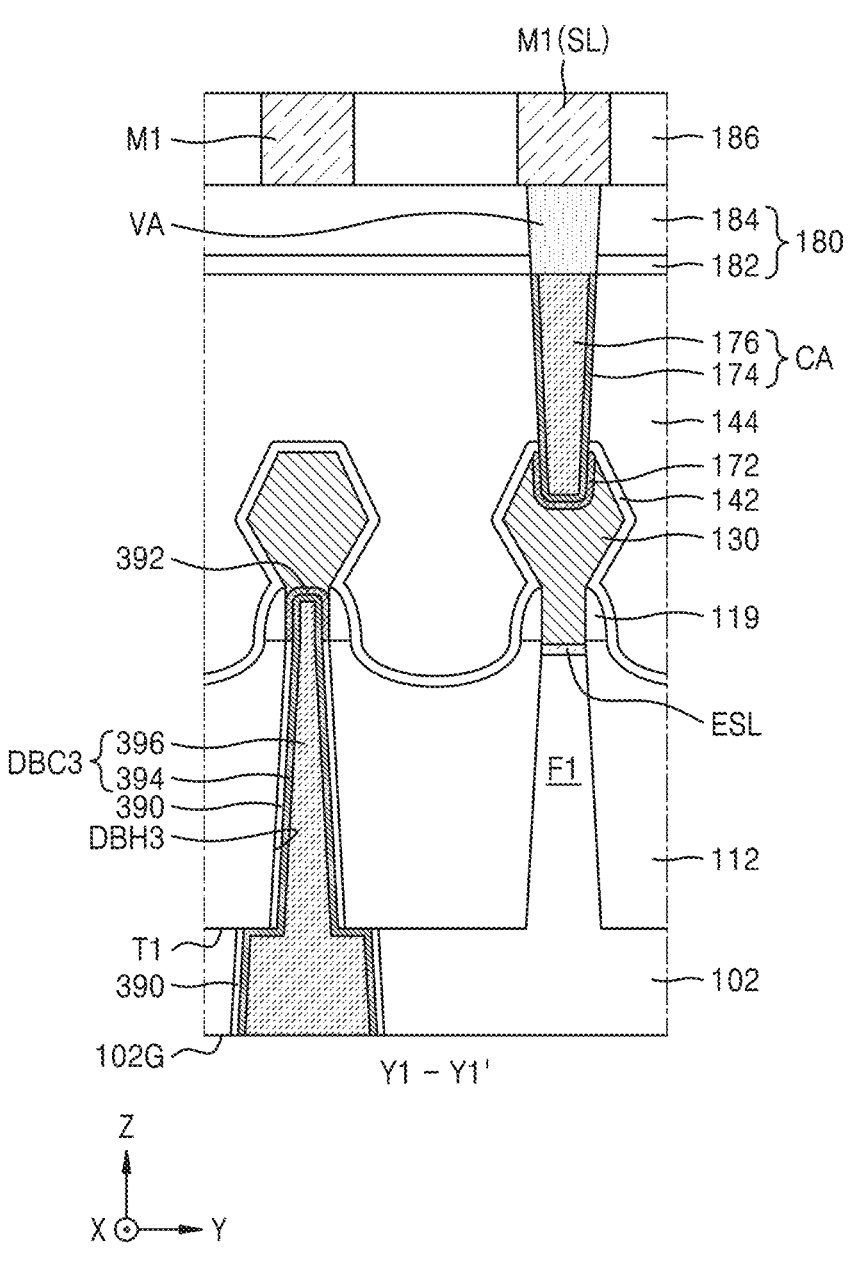

Referring to FIGS. 25A and 25B, processes similar to those described with reference to FIGS. 21A and 21B may be performed in the resultant structure of FIGS. 24A and 24B.

Specifically, a metal silicide film 392 may be formed on a surface of the source/drain region 130, which is exposed through the contact space DBH3. Insulating spacers 390 may be formed on surfaces exposed at inner sidewalls of the contact space DBH3, particularly, sidewalls facing the contact space DBH3, of the first and second fin portions F1A and F1B that are portions of the fin-type active region F1, and sidewalls of the substrate 102, which face the contact space DBH3. A back side source/drain contact DBC3 may be formed to fill the contact space DBH3 on the metal suicide film 392 and the insulating spacer 390. The back side source/drain contact DBC3 may include a conductive barrier pattern 394 and a contact plug 396.

Thereafter, in the resultant structure of FIGS. 25A and 25B, a back side insulating film 109 may be formed to cover the bottom surface 102G of the substrate 102, which is exposed. A back side power rail BPW may be formed to pass through the back side insulating film 109 in the vertical direction (Z direction) and contact one end of the back side source/drain contact DBC3. Thus, the IC device 300 described with reference to FIGS. 5A and 5B may be manufactured.

Although the methods of manufacturing the IC devices 100, 200, and 300 shown in FIGS. 2 to 5B have been described with reference to FIGS. 11A to 25B, it will be understood that the IC devices 400, 500, 600, 700, and 800 shown in FIGS. 6 to 10 and IC devices having variously changed structures may be manufactured by applying various modifications and changes to the processes described with reference to FIGS. 11A to 25B within the scope of the inventive concepts.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

While the inventive concepts have been particularly shown and described with reference to embodiments, thereof, it will be understood that various changes in form and details may be made therein without departing from the spirit and scope of the following claims.

What is claimed is:

1. An integrated circuit device comprising:
a fin-type active region comprising a first fin portion and a second fin portion apart from each other in a first lateral direction with a contact space therebetween, the first fin portion and the second fin portion each extending long in a straight line in the first lateral direction;
a first source/drain region on the fin-type active region at a position overlapping the contact space in a vertical direction;
a gate line on the first fin portion, the gate line extending long in a second lateral direction, the second lateral direction being perpendicular to the first lateral direction;
a device isolation film covering both sidewalls of each of the first fin portion and the second fin portion in the second lateral direction, the device isolation film defining a width of the contact space in the second lateral direction;
a back side source/drain contact configured to be electrically connected to the first source/drain region and filling the contact space, the back side source/drain contact having a sidewall facing each of the first fin portion, the second fin portion, and the device isolation film; and
an etch stop layer in contact with a top surface of each of the first fin portion and the second fin portion, the etch stop layer being between the first fin portion and the gate line,
wherein widths of the back side source/drain contact in the first lateral direction and the second lateral direction increase in a direction away from the first source/drain region in the vertical direction.

2. The integrated circuit device of claim 1, further comprising:
a back side insulating film apart from the etch stop layer in the vertical direction with the first fin portion and the second fin portion therebetween; and a back side power rail passing through the back side insulating film in the vertical direction and being connected to the back side source/drain contact.

3. The integrated circuit device of claim 1, wherein the etch stop layer comprises an insulating film.

4. The integrated circuit device of claim 1, wherein the gate line is apart from the first fin portion in the vertical direction with the etch stop layer therebetween.

5. The integrated circuit device of claim 1, further comprising at least one nanosheet on the first fin portion, the at least one nanosheet being in contact with the first source/drain region, wherein the gate line surrounds the at least one nanosheet.

6. The integrated circuit device of claim 1, wherein the first source/drain region has a surface in contact with the etch stop layer.

7. The integrated circuit device of claim 1, further comprising:

a second source/drain region on the first fin portion of the fin-type active region, the second source/drain region being apart from the first source/drain region in the first lateral direction with the gate line therebetween; and a front side source/drain contact configured to be electrically connected to the second source/drain region, the front side source/drain contact being apart from the first fin portion in the vertical direction with the second source/drain region therebetween, wherein the second source/drain region has a bottom surface in contact with the etch stop layer, and the front side source/drain contact is apart from the first fin portion in the vertical direction with the second source/drain region therebetween.

8. The integrated circuit device of claim 1, further comprising:

at least one nanosheet on the first fin portion, the at least one nanosheet being surrounded by the gate line and being in contact with the first source/drain region;

a second source/drain region on the first fin portion to be apart from the first source/drain region in the first lateral direction with the gate line therebetween, the second source/drain region having a bottom surface in contact with the etch stop layer and a surface in contact with the at least one nanosheet; and a front side source/drain contact configured to be electrically connected to the second source/drain region, the front side source/drain contact being apart from the first fin portion in the vertical direction with the second source/drain region therebetween.

9. The integrated circuit device of claim 1, wherein the device isolation film comprises an insulating liner and a buried insulating film having a bottom surface and a side surface surrounded by the insulating liner, the insulating liner and the buried insulating film comprise different materials from each other, and a sidewall of the back side source/drain contact faces the insulating liner, and a sidewall of the fin-type active region is in contact with the insulating liner.

10. The integrated circuit device of claim 1, further comprising:

a back side insulating film apart from the etch stop layer in the vertical direction with the first fin portion and the second fin portion therebetween; and a back side power rail passing through the back side insulating film in the vertical direction, the back side power rail being connected to the back side source/drain contact, wherein the back side insulating film is in contact with the device isolation film.

11. The integrated circuit device of claim 1, further comprising:

a substrate integrally connected to each of the first fin portion and the second fin portion, the substrate being in contact with a bottom surface of the device isolation film;

a back side insulating film apart from the device isolation film in the vertical direction with the substrate therebetween; and a back side power rail passing through the back side insulating film in the vertical direction, the back side power rail being connected to the back side source/drain contact, wherein the back side source/drain contact comprises a first portion and a second portion, the first portion fills the contact space and faces each of the device isolation film, the first fin portion, and the second fin portion, the second portion passes through the substrate in the vertical direction and is integrally connected to the first portion, and a width of the second portion is greater than a width of the first portion in the second lateral direction, and the back side source/drain contact comprises a stepped portion between the first portion and the second portion in a portion adjacent to an interface between the substrate and the device isolation film.

12. An integrated circuit device comprising:

a plurality of fin-type active regions extending long in a first lateral direction and being parallel to each other;

a plurality of source/drain regions on the plurality of fin-type active regions;

a plurality of gate lines extending long in a second lateral direction on the plurality of fin-type active regions, the second lateral direction intersecting with the first lateral direction;

a device isolation film covering a sidewall of each of the plurality of fin-type active regions;

a back side source/drain contact passing through a first fin-type active region selected from the plurality of fin-type active regions in a vertical direction, the back side source/drain contact being configured to be electrically connected to a first source/drain region selected from the plurality of source/drain regions, and the back side source/drain contact having a sidewall facing each of the first fin-type active region and the device isolation film;

a front side source/drain contact configured to be electrically connected to a second source/drain region, which is selected from the plurality of source/drain regions and apart from the first source/drain region, the front side source/drain contact being apart from at least one fin-type active region selected from the plurality of fin-type active regions in the vertical direction with the second source/drain region therebetween; and an etch stop layer between the first fin-type active region and the plurality of gate lines, the etch stop layer being in contact with a top surface of the first fin-type active region, the etch stop layer comprising a portion facing a sidewall of the back side source/drain contact, wherein widths of the back side source/drain contact in the first lateral direction and the second lateral direction increase in a direction away from the first source/drain region in the vertical direction.

13. The integrated circuit device of claim 12, wherein the first fin-type active region comprises a first fin portion and a second fin portion, which are apart from each other in the first lateral direction with the back side source/drain contact therebetween, and each of the first fin portion and the second fin portion has a sidewall facing the back side source/drain contact.

14. The integrated circuit device of claim 12, further comprising:

a back side insulating film in contact with each of a bottom surface of the device isolation film and a bottom surface of each of the plurality of fin-type active regions, the back side insulating film being apart from the etch stop layer in the vertical direction with the plurality of fin-type active regions therebetween; and a back side power rail passing through the back side insulating film in the vertical direction, the back side power rail being connected to the back side source/drain contact.

15. The integrated circuit device of claim 12, further comprising:

a substrate integrally connected to each of the plurality of fin-type active regions, the substrate being in contact with a bottom surface of the device isolation film;

a back side insulating film apart from the device isolation film in the vertical direction with the substrate therebetween; and a back side power rail passing through the back side insulating film in the vertical direction, the back side power rail being connected to the back side source/drain contact, wherein the back side source/drain contact has a first portion having a sidewall facing the first fin-type active region and a second portion having a sidewall facing the substrate, the second portion being integrally connected to the first portion, a width of the second portion is greater than a width of the first portion in the second lateral direction, and the back side source/drain contact comprises a stepped portion between the first portion and the second portion in a portion adjacent to an interface between the substrate and the device isolation film.

16. The integrated circuit device of claim 12, wherein the etch stop layer comprises an insulating film.

17. The integrated circuit device of claim 12, wherein widths of the front side source/drain contact in the first lateral direction and the second lateral direction increase in a direction away from the back side source/drain contact.

18. The integrated circuit device of claim 12, wherein an end surface of the back side source/drain contact, which is farthest from the first source/drain region, an end surface of the device isolation film, which is farthest from the plurality of source/drain regions, and an end surface of each of the plurality of fin-type active regions, which is farthest from the plurality of source/drain regions, extend on a same plane.

19. An integrated circuit device comprising:

a fin-type active region comprising a first fin portion and a second fin portion, which are apart from each other in a first lateral direction with a contact space therebetween, the first fin portion and the second fin portion each extending long in a straight line in the first lateral direction;

at least one nanosheet on the first fin portion;

a first source/drain region on the fin-type active region at a position overlapping the contact space in a vertical direction, the first source/drain region being in contact with the at least one nanosheet;

a gate line surrounding the at least one nanosheet on the first fin portion, the gate line extending long in a second lateral direction, the second lateral direction being perpendicular to the first lateral direction;

a second source/drain region on the first fin portion to be apart from the first source/drain region in the first lateral direction with the gate line therebetween, the second source/drain region being in contact with the at least one nanosheet;

a device isolation film covering both sidewalls of each of the first fin portion and the second fin portion in the second lateral direction, the device isolation film defining a width of the contact space in the second lateral direction;

a back side source/drain contact configured to be electrically connected to the first source/drain region and filling the contact space, the back side source/drain contact having a sidewall facing each of the first fin portion, the second fin portion, and the device isolation film;

a front side source/drain contact configured to be electrically connected to the second source/drain region, the front side source/drain contact being apart from the fin-type active region in the vertical direction with the second source/drain region therebetween; and an etch stop layer in contact with a top surface of each of the first fin portion and the second fin portion, the etch stop layer comprising a portion between the first fin portion and the gate line and a portion facing a sidewall of the back side source/drain contact, wherein widths of the back side source/drain contact in the first lateral direction and the second lateral direction increase in a direction away from the first source/drain region in the vertical direction.

* * * * *